US008434031B2

(12) United States Patent
Granik

(10) Patent No.: US 8,434,031 B2
(45) Date of Patent: Apr. 30, 2013

(54) INVERSE MASK DESIGN AND CORRECTION FOR ELECTRONIC DESIGN

(75) Inventor: Yuri Granik, Palo Alto, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/283,523

(22) Filed: Oct. 27, 2011

(65) Prior Publication Data

US 2012/0042291 A1    Feb. 16, 2012

Related U.S. Application Data

(63) Continuation of application No. 12/710,352, filed on Feb. 22, 2010, now abandoned, and a continuation-in-part of application No. 12/416,016, filed on Mar. 31, 2009, and a continuation-in-part of application No. 12/359,174, filed on Jan. 23, 2009, now Pat. No. 7,987,434, and a continuation-in-part of application No. 11/364,802, filed on Feb. 28, 2006, now Pat. No. 7,487, 489.

(60) Provisional application No. 61/154,271, filed on Feb. 20, 2009, provisional application No. 61/041,197, filed on Mar. 31, 2008, provisional application No. 60/657,260, filed on Feb. 28, 2005, provisional application No. 60/658,278, filed on Mar. 2, 2005, provisional application No. 60/722,840, filed on Sep. 30, 2005, provisional application No. 60/792,476, filed on Apr. 14, 2006.

(51) Int. Cl.
*G06F 17/50* (2006.01)

(52) U.S. Cl.
USPC ............................ 716/54; 716/55; 716/132

(58) Field of Classification Search ................... None
See application file for complete search history.

(56) References Cited

U.S. PATENT DOCUMENTS 7,266,803 B2 * 9/2007 Chou et al. ..................... 716/51
2007/0006113 A1 * 1/2007 Hu et al. ......................... 716/19

OTHER PUBLICATIONS

Barouch et al., "Illuminator Optimization for Projection Printing," 1999 SPIE, pp. 697-703.*
Cobb et al., "Fast, Low-Complexity Mask Design," SPIE, pp. 313-327, no date.*
Cobb, "Fast Optical and Process Proximity Correction Algorithms for Integrated Circuit Manufacturing," Dissertation, Univ. of California at Berkeley, 1998, no page numbers.*
Erdmann et al., "Towards Automatic Mask and Source Optimization for Optical Lithography," SPIE, pp. 646-657, no date.*
Fienup, "Phase Retrieval Algorithms: A Comparison," 1982 Applied Optics, pp. 2758-2769.*
Gamo, "Matrix Treatment of Partial Coherence," 1963 Progress in Optics, pp. 189-332.*
Gerchberg et al., "A Practical Algorithm for the Determination of Phase From Image and Diffraction Plane Pictures," 1972 Optik, pp. 237-246.*
Gould, "Quadratic Programming: Theory and Methods," 2000 3rd FNRC Cycle in Math. Programming, no page numbers.*
Granik, Solving Inverse Problems of Optical Microlithography, 2005 SPIE, no page numbers.*

(Continued)

*Primary Examiner* — Leigh Garbowski

(57) ABSTRACT

Various implementations of the invention provide for the generation of "smooth" mask contours by inverse mask transmission derivation and by subsequently "smoothing" the derived mask contours by proximity correction.

19 Claims, 43 Drawing Sheets

OTHER PUBLICATIONS

Granik, "Source Optimization for Image Fidelity and Throughput," 2004 JM3, pp. 509-522.*
Han et al., "On the Solution of Indefinite Quadratic Problems Using an Interior-Point Algorithm," 1992 Informatica, pp. 474-496.*
Hwang et al., "Layer-Specific Illumination for Low k1 Periodic and Semi-Periodic DRAM Cell Patterns: Design Procedure and Application," SPIE, pp. 947-952, no date.*
Inoue et al., "Optimization of Partially Coherent Optical System for Optical Lithography," 1992 J. Vac. Sci. Tech., pp. 3004-3007.*
Jang et al., "Manufacturability Evaluation of Model-Based OPC Masks," 2002 SPIE, pp. 520-529.*
Liu et al., "Binary and Phase-Shifting Image Design for Optical Lithography," 1991 SPIE, pp. 382-399.*
Liu et al., "Optimal Binary Image Design for Optical Lithography," 1990 SPIE, pp. 401-412.*
Nashold, "Image Synthesis—A Means of Producing Superresolved Binary Images Through Bandlimited Systems," Dissertation, Univ. of Wisconsin at Madison, 1987, no page numbers.*
Oh et al., "Optical Proximity Correction of Critical Layers in DRAM Process of 12 um Minimum Feature Size," 2001 SPIE, pp. 1567-1574.*
Oh et al., "Resolution Enhancement Through Optical Proximity Correction and Stepper Parameter Optimization for 0.12 um Mask Pattern," 1999 SPIE, pp. 607-613.*
Pati et al., "Phase-Shifting Masks for Microlithography: Automated Design and Mask Requirements," 1994 J. Opt. Soc. Am., pp. 2438-2452.*
Poonawala et al., "Prewarping Techniques in Imaging: Applications in Nanotechnology and Biotechnology," 2005 SPIE, pp. 114-127.*
Qi et al., "Global Minimization of Normal Quadratic Polynomials Based on Global Descent Directions," SIAM J. Optim., pp. 275-302, no date.*
Rosenbluth et al., "Optimum Mask and Source Patterns to Print a Given Shape," 2002 JM3, pp. 13-30.*
Saleh, Optical Bilinear Transformation: General Properties, 1979 Optica Acta, pp. 777-799.*
Saleh et al., "Image Construction: Optimum Amplitude and Phase Masks in Photolithography," 1985 Applied Optics, pp. 1432-1437.*
Sandstrom et al., "OML: Optical Maskless Lithography for Economic Design Prototyping and Small-Volume Production," 2004 SPIE, pp. 777-797.*
Sayegh, "Image Restoration and Image Design in Non-Linear Optical Systems," Dissertation, University of Wisconsin at Madison, 1982, no page numbers.*
Shang et al., "Simulation-Based SRAF Insertion for 65nm Contact Hole Layers," 2005 BACUS, no page numbers.*
Socha et al., "Contact Hole Reticle Optimization by Using Interference Mapping Lithography (IML)," SPIE, pp. 516-534, no date.*
Sorensen, "Newton's Method with a Model Trust Region Modification," 1982 SIAM J. Num. Anal., pp. 409-426.*
Takajo et al., "Further Study on the Convergence Property of the Hybrid Input-Output Algorithm Used for Phase Retrieval," 1999 J. Opt. Soc. Am., pp. 2163-2168.*
Vallishayee et al., "Optimization of Stepper Parameters and Their Influence on OPC," 1996 SPIE, pp. 660-665.*
Huang et al., "Model based insertion of assist features using pixel inversion method: implementation in 65nm mode," 2006 SPIE, no page numbers.*

* cited by examiner

INITIAL RANDOM MASK

SAGNATION AT = 0, Y = 0

MASK CONTOURS

PHASE ENTANGLEMENT

IMAGE CONTOURS

IMAGE CUTLINE

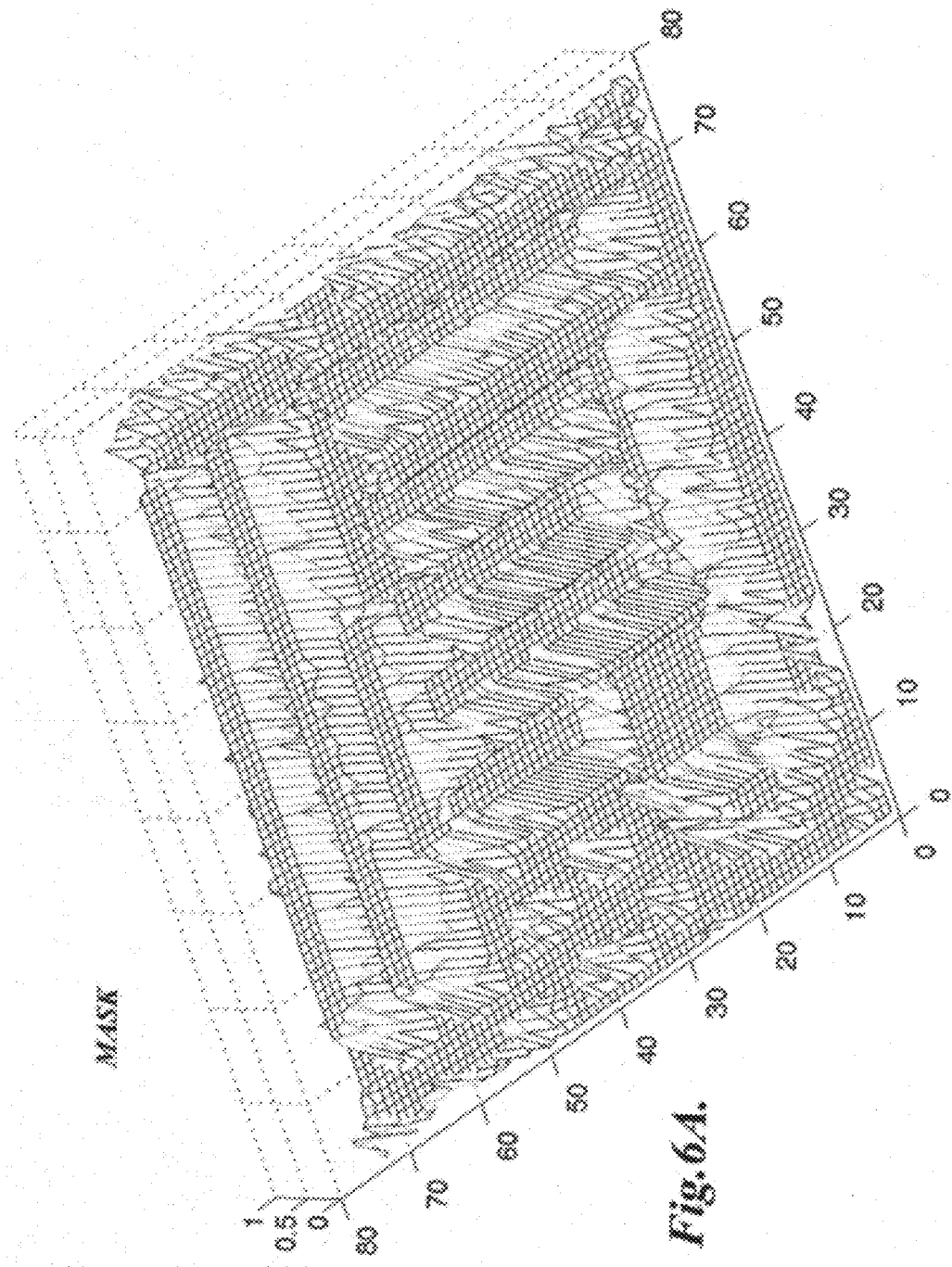

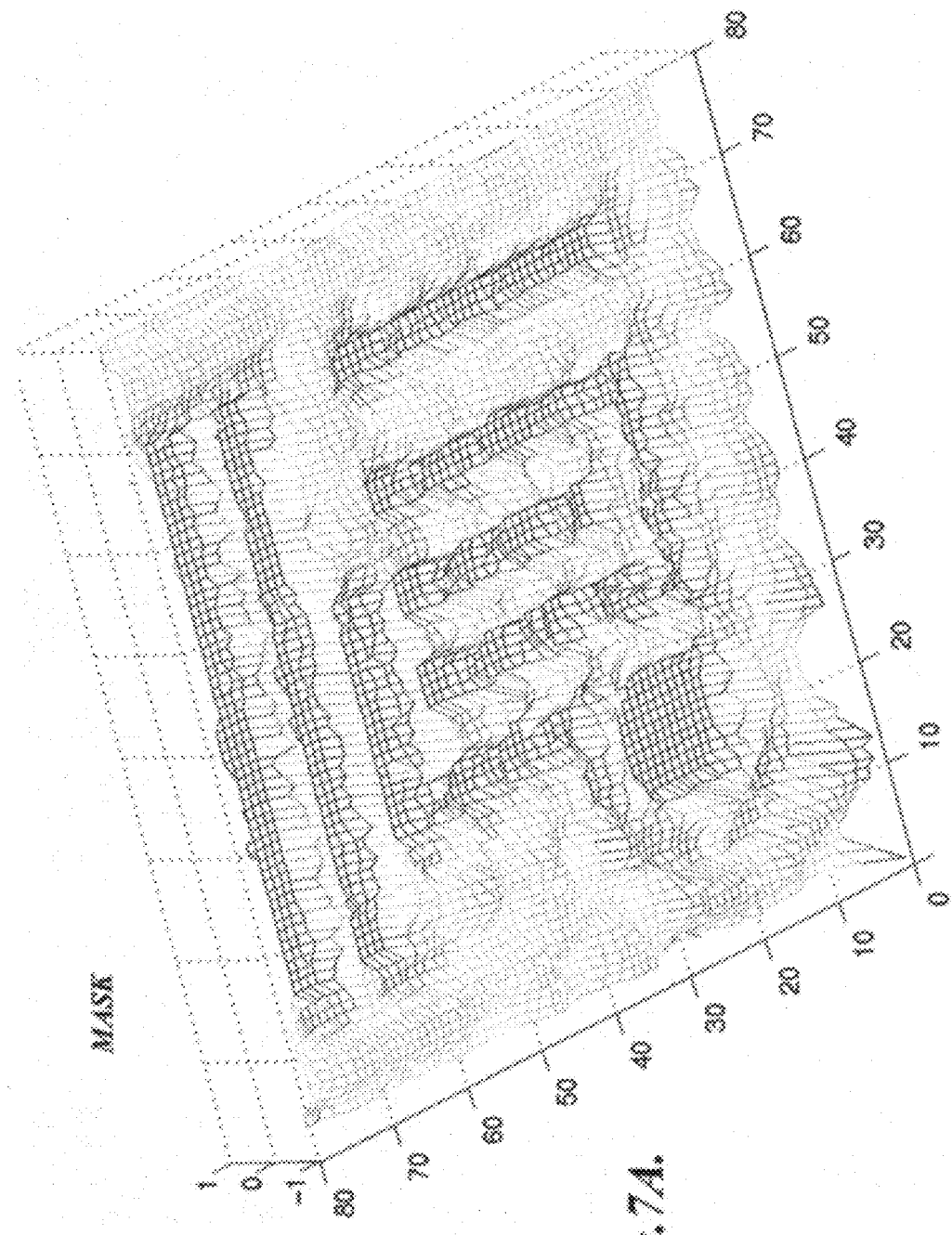

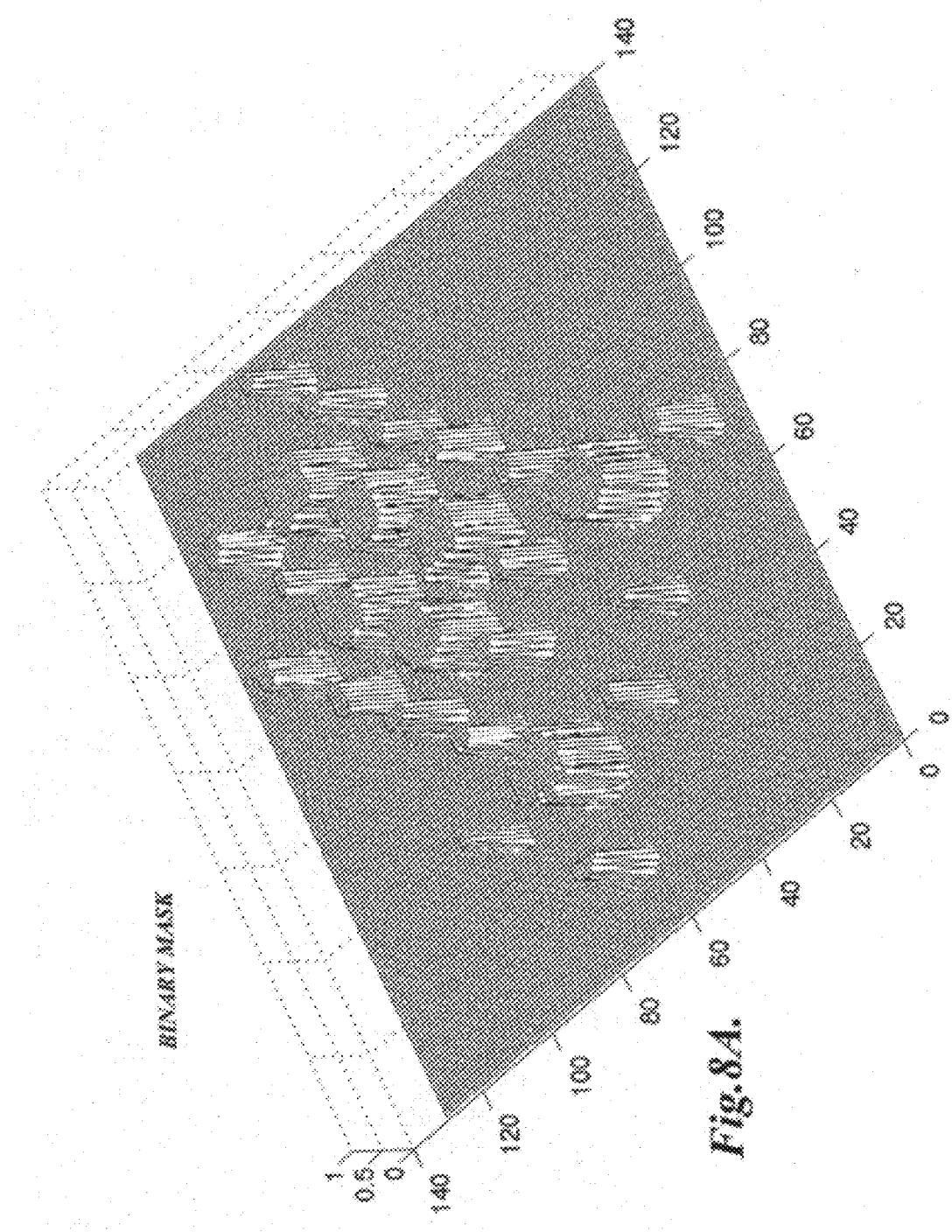

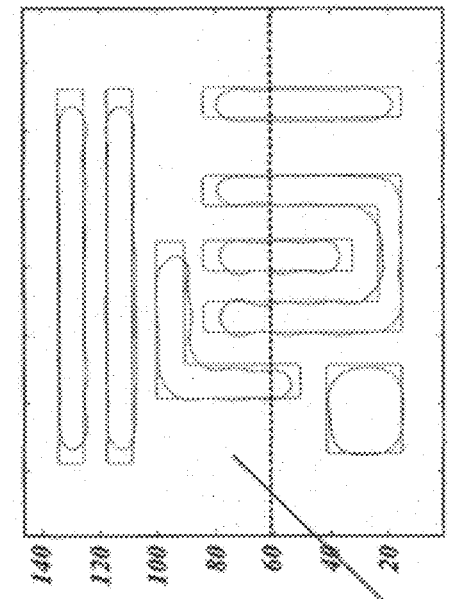
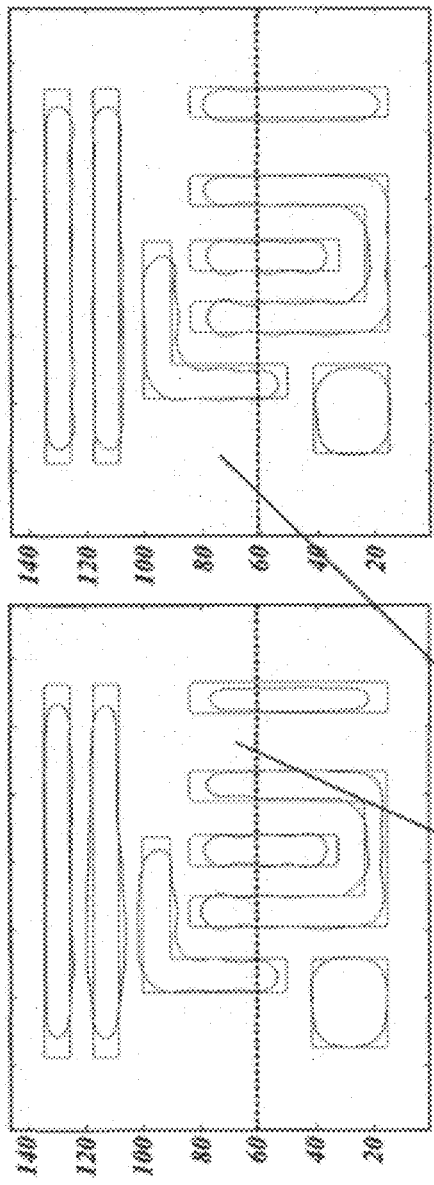
Fig.11A. Fig.11B.
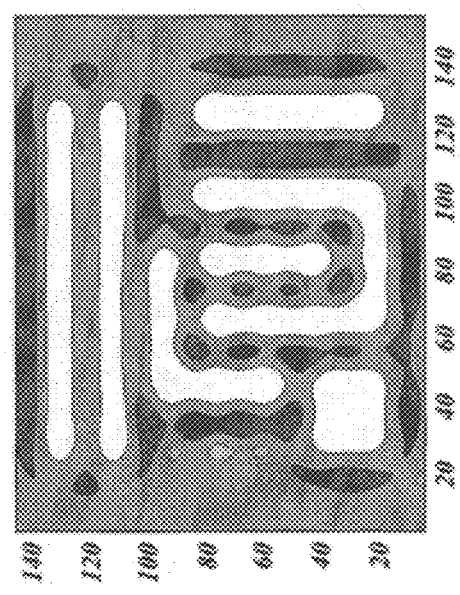
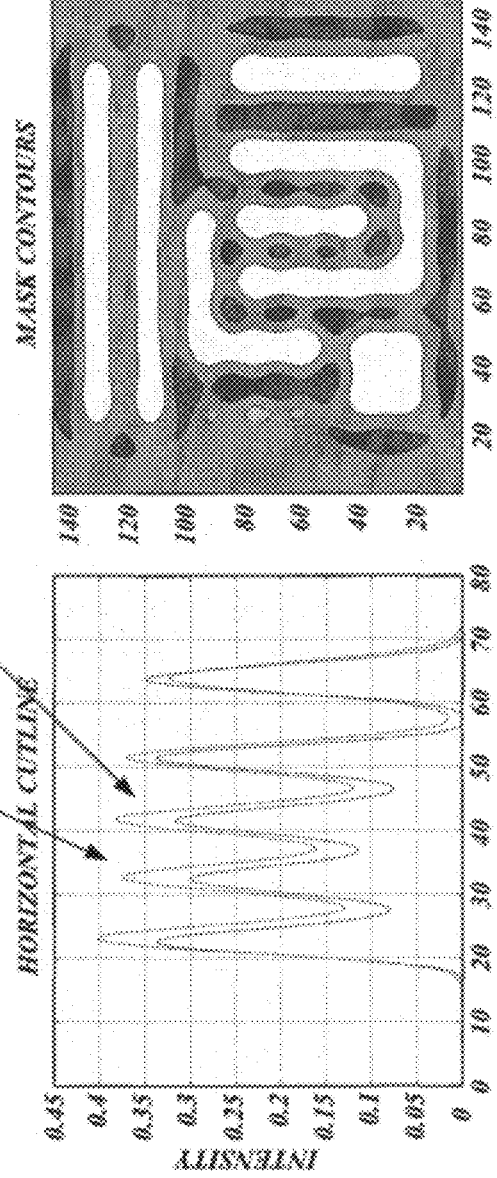
Fig.11C. Fig.11D.

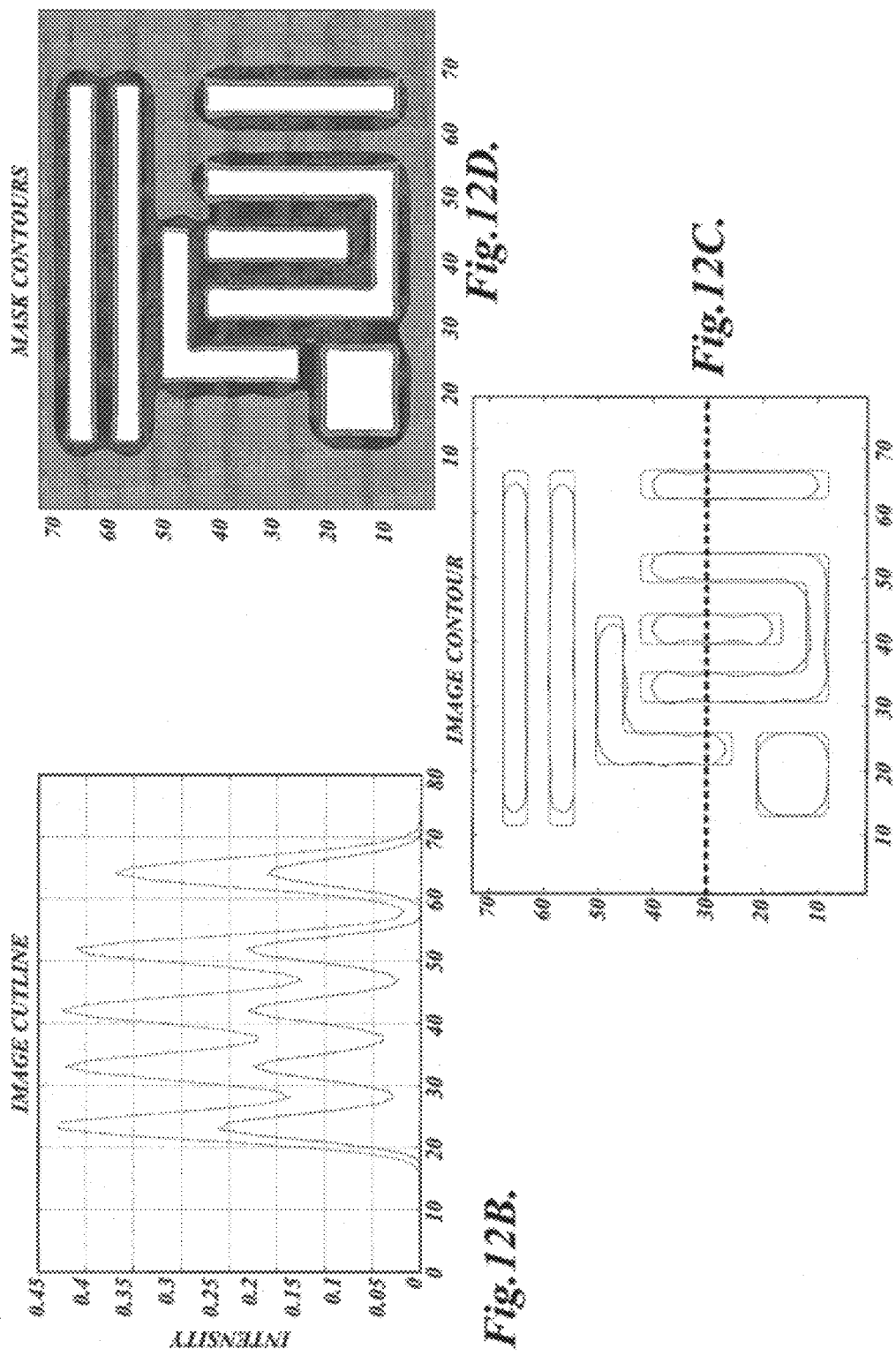

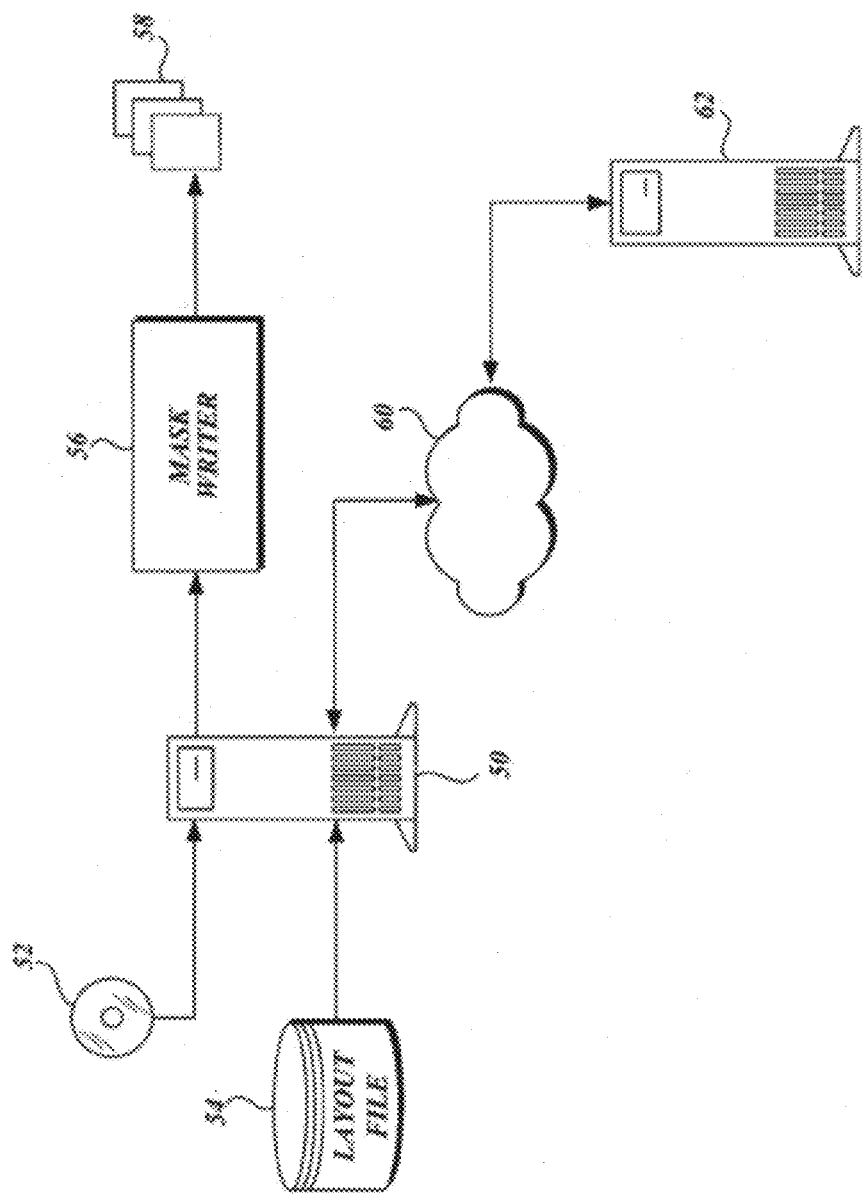

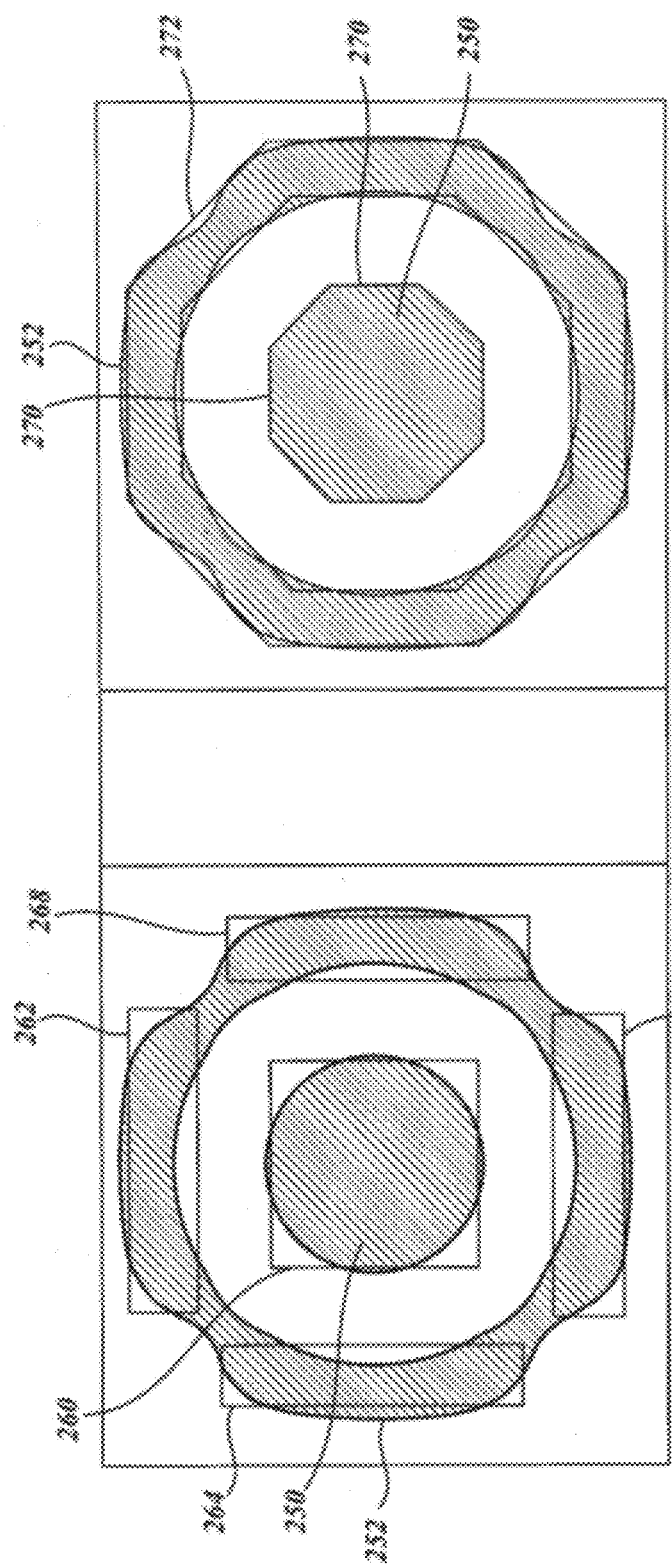

INVERSE MASK DESIGN AND CORRECTION FOR ELECTRONIC DESIGN

RELATED APPLICATIONS

This application is a continuation of U.S. application Ser. No. 12/710,352 entitled "Inverse Mask Design and Correction for Electronic Design," filed Feb. 22, 2010, now abandonded and naming Yuri Granik et al. as inventors, which application claims priority under 35 U.S.C. §119(e) to U.S. Provisional Patent Application No. 61/154,271 entitled "Extreme Optical Process Correction," filed on Feb. 20, 2009, and naming Yuri Granik et al. as inventors, and is a continuation in part of U.S. application Ser. No. 12/416,016 entitled "Calculation System for Inverse Masks," filed Mar. 31, 2009, and naming Yuri Granik as inventor, which in turn claims the benefit of U.S. Provisional Patent Application No. 61/041,197, filed Mar. 31, 2008 and is itself a continuation in part of U.S. application Ser. No. 12/359,174, filed Jan. 23, 2009, now U.S. Pat. No. 7,987,434 which in turn claims the benefit of U.S. Provisional Patent Application No. 60/792,476 filed Apr. 14, 2006, and is a continuation in part of U.S. patent application Ser. No. 11/364,802 filed Feb. 28, 2006, now U.S. Pat. No. 7,487,489 which in turn claims the benefit of U.S. Provisional Patent Application No. 60/657,260 filed Feb. 28, 2005; U.S. Provisional Patent Application No. 60/658,278, filed Mar. 2, 2005; and U.S. Provisional Patent Application No. 60/722,840 filed Sep. 30, 2005, which applications are all incorporated entirely herein by reference.

FIELD OF THE INVENTION

The invention relates to the field of integrated circuit design and manufacturing. More particularly, various implementations of the invention are applicable to jointly calibrating models useful to simulate optical lithographic masks.

BACKGROUND OF THE INVENTION

Electronic circuits, such as integrated microcircuits, are used in a variety of products, from automobiles to microwaves to personal computers. Designing and fabricating microcircuit devices typically involves many steps, sometimes referred to as the "design flow." The particular steps of a design flow often are dependent upon the type of microcircuit, its complexity, the design team, and the microcircuit fabricator or foundry that will manufacture the microcircuit. Typically, software and hardware "tools" verify the design at various stages of the design flow by running software simulators and/or hardware emulators. These steps aid in the discovery of errors in the design, and allow the designers and engineers to correct or otherwise improve the design. These various microcircuits are often referred to as integrated circuits ("IC's").

Several steps are common to most design flows. Initially, a design may typically start at a high level of abstraction, by a designer creating a specification that describes particular desired functionality. This specification, often implemented by a programming language, such as, for example, the C or C++ programming language, describes at a high level the desired behavior of the device. Designers will then typically take this specification for the design and create a logical design, often implemented in a netlist, through a synthesis process. The logical design describes the individual components of the design, and also may have different level of abstraction, such as, for example the gate level or the register level.

A register transfer level ("RTL") design, often implemented by a hardware description language ("HDL") such as Verilog, SystemVerilog, or Very High speed hardware description language ("VHDL"), describes the operation of the device by defining the flow of signals or the transfer of data between various hardware components within the design. More particularly, a register transfer level design describes the interconnection and exchange of signals between hardware registers and the logical operations that are performed on those signals.

Typically, a register transfer level design is first synthesized from the specification, followed by a gate level design being synthesized from the register transfer level design. Gate level designs describe the actual physical components such as transistors, capacitors, and resistors as well as the interconnections between these physical components. Often, gate level designs are also implemented by a netlist, such as, for example, a mapped netlist. Lastly, the gate-level design is taken and another transformation is carried out. First by place and route tools that arrange the components described by the gate-level netlist and route connections between the arranged components; and second, by layout tools that generate a layout description having layout "shapes" that may then used to fabricate the electronic device, through for example, an optical lithographic process.

Integrated circuit layout descriptions can be provided in many different formats. The Graphic Data System II ("GDSII") format is popular for transferring and archiving two-dimensional graphical IC layout data. Among other features, it contains a hierarchy of structures, each structure containing layout elements (e.g., polygons, paths or poly-lines, circles and textboxes). Other formats include an open source format named OpenAccess, Milkyway by Synopsys, Inc., EDDM by Mentor Graphics, Inc., and the more recent Open Artwork System Interchange Standard (OASIS) proposed by Semiconductor Equipment and Materials International ("SEMI"). These various industry formats are used to define the geometrical information in integrated circuit layout designs that are employed to manufacture integrated circuits. Once the microcircuit device design is finalized, the layout portion of the design can be used by fabrication tools to manufacturer the device using a photolithographic process.

There are many different fabrication processes for manufacturing a circuit, but most processes include a series of steps that deposit layers of different materials on a substrate, expose specific portions of each layer to radiation, and then etch the exposed (or non-exposed) portions of the layer away. For example, a simple semiconductor device component could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, and the exposed areas are etched away, leaving behind exposed areas on the epitaxial layer, (i.e., areas no longer covered by the nitride layer). The exposed areas then are subjected to a diffusion or ion implantation process, causing dopants, for example phosphorus, to enter the exposed epitaxial layer and form charged wells. This process of depositing layers of material on the substrate or subsequent material layers, and then exposing specific patterns to radiation, etching, and dopants or other diffusion materials, is repeated a number of times, allowing the different physical layers of the circuit to be manufactured.

Each time that a layer of material is exposed to radiation, a mask must be created to expose only the desired areas to the radiation, and to protect the other areas from exposure. The mask is created from circuit layout data. That is, the geometric elements described in layout design data define the relative locations or areas of the circuit device that will be exposed to radiation through the mask. A mask or reticle writing tool is used to create the mask based upon the layout design data, after which the mask can be used in a photolithographic process. The image embodied in the layout data is often referred to as the intended or target image or target contours, while the image created in the mask is generally referred to as the mask contours. Furthermore, the image created on the substrate by employing the mask in a photolithographic process is often referred to as the printed image or printed contours.

As designers and manufacturers continue to increase the number of circuit components in a given area and/or shrink the size of circuit components, the shapes reproduced on the substrate become smaller and are placed closer together. The feature sizes are often referred to by the distance between features, conventionally called the "process step," or the "node." For example, one nod is the 32 nanometer ("nm") node. This implies that adjacent features in the design, such as, for example, identical cells in a memory array, are 32 nanometers apart. As process steps are continually scaled down, the corresponding reduction in feature size increases the difficulty of faithfully reproducing the image intended by the layout design onto the substrate. Various common techniques exist for mitigating these pattern dependant effects. These techniques are commonly referred to as "resolution enhancement techniques" or "RETs." For example, optical process correction ("OPC,") douple patterning, and "assist features" (i.e. features inserted into a mask that are not intended to be replicated during the manufacturing process, but which increase the fidelity of the image) are a few common resolution enhancement techniques (RET) that are often employed to prepare a physical layout designs for manufacturing.

Even though conventional resolution enhancement techniques, such as, for example optical process correction, provide for an increase in image fidelity, this increase in image fidelity may not be sufficient at future nodes. For example, conventional optical process correction limits a particular mask shape to having a one to one comparison to the corrected mask shape. Additionally, the topology of a mask shape corrected by conventional resolution enhancement techniques will have a similar topology to the original mask shape. Furthermore, the inclusion or insertion of assist features into a corrected mask is time consuming and requires significant effort on the part of the designer to facilitate.

SUMMARY OF THE INVENTION

Various implementations of the invention provide for the generation of "smooth" mask contours by inverse mask transmission derivation and by subsequently "smoothing" the derived mask contours by proximity correction.

BRIEF DESCRIPTION OF THE DRAWINGS

The present invention will be described by way of illustrative embodiments shown in the accompanying drawings in which like references denote similar elements, and in which:

FIGS. 6A-6C illustrate the results of solving an inverse mask problem with contour fidelity metric for a positive mask in accordance with an embodiment of the present invention;

FIGS. 7A-7C illustrate a method of local variations with contour fidelity and PSM masks in accordance with another embodiment of the present invention;

FIGS. 8A-8C illustrate contact holes inserted around main contacts;

FIGS. 11A-11D illustrate a deconvolution by a Wiener filter in accordance with one embodiment of the present invention;

FIGS. 12A-12D illustrate a result of a least square unconstrained optimization in accordance with an embodiment of the present invention;

FIG. 19 illustrates a representative computer system that can be used to implement the present invention;

FIGS. 24A and 24B illustrate two techniques for creating mask features to correspond to the optimized mask data;

DETAILED DESCRIPTION OF ILLUSTRATIVE IMPLEMENTATIONS

Figure 1A:
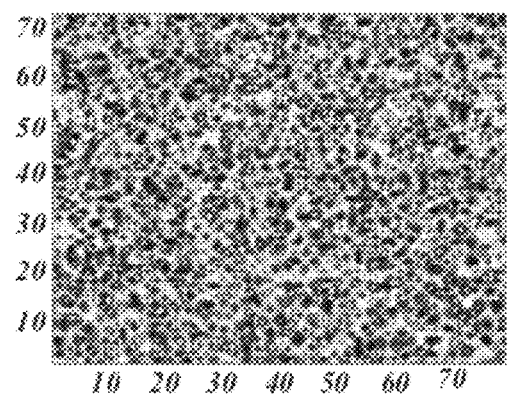
FIGS. 1A-1H illustrate conventional Nashold projections.

The operations of the disclosed implementations may be described herein in a particular sequential order. However, it should be understood that this manner of description encompasses rearrangements, unless a particular ordering is required by specific language set forth below. For example, operations described sequentially may in some cases be rearranged or performed concurrently. Moreover, for the sake of simplicity, the illustrated flow charts and block diagrams typically do not show the various ways in which particular methods can be used in conjunction with other methods.

It should also be noted that the detailed description sometimes uses terms like "determine" to describe the disclosed methods. Such terms are often high-level abstractions of the actual operations that are performed. The actual operations that correspond to these terms will often vary depending on the particular implementation, and will be readily discernible by one of ordinary skill in the art.

Furthermore, in various implementations of the invention, a mathematical model may be employed to represent an electronic device. With some implementations, a model describing the connectivity of the device, such as for example a netlist, is employed. Those of skill in the art will appreciate that the models, even mathematical models represent real world device designs and real world physical devices. Accordingly, manipulation of the model, even manipulation of the model when stored on a computer readable medium, results in a different device design. More particularly, manipulation of the model results in a transformation of the corresponding physical design and any physical device rendered or manufactured by the device design. Additionally, those of skill in the art can appreciate that during many electronic design and verification processes, the response of a devices design to various signals or inputs is simulated. This simulated response corresponds to the actual physical response the device being modeled would have to these various signals or inputs.

Some of the methods described herein can be implemented by software stored on a computer readable storage medium, or executed on a computer. Accordingly, some of the disclosed methods may be implemented as part of a computer implemented electronic design automation (EDA) tool. The selected methods could be executed on a single computer or a computer networked with another computer or computers. For clarity, only those aspects of the software germane to these disclosed methods are described; product details well known in the art are omitted.

Introduction

As will be explained in further detail below, the present invention is a method and apparatus for calculating a mask pattern that will print a desired layout or portion thereof on a wafer. FIG. 19 illustrates a representative computer system that can be used to calculate a mask layout pattern in accordance with one embodiment of the present invention. A computer system 50, including one or more programmable processors, receives a set of executable instructions on a computer-readable media 52 such as a CD, DVD, or from a communication network such as a wired or wireless communication network such as the Internet. The computer system 50 executes the instructions to read all or a portion of a desired layout file from a database 54 or other storage media. The computer system 50 then calculates data for a mask layout by dividing a mask layout into a number of discrete pixels. The computer system determines the transmission characteristic of each of the pixels so that the result on a wafer will substantially match the pattern defined in the desired layout file. After calculating the mask pixel transmission characteristics, the mask pixel data is used by a mask writer 56 in order to produce one or more corresponding masks or reticles 58. In another embodiment of the invention, the computer system 50 transmits the desired layout file or a portion thereof over a communication link 60 such as the Internet, etc., to one or more remotely located computers 62 that perform the mask data calculations.

Figure 20A:
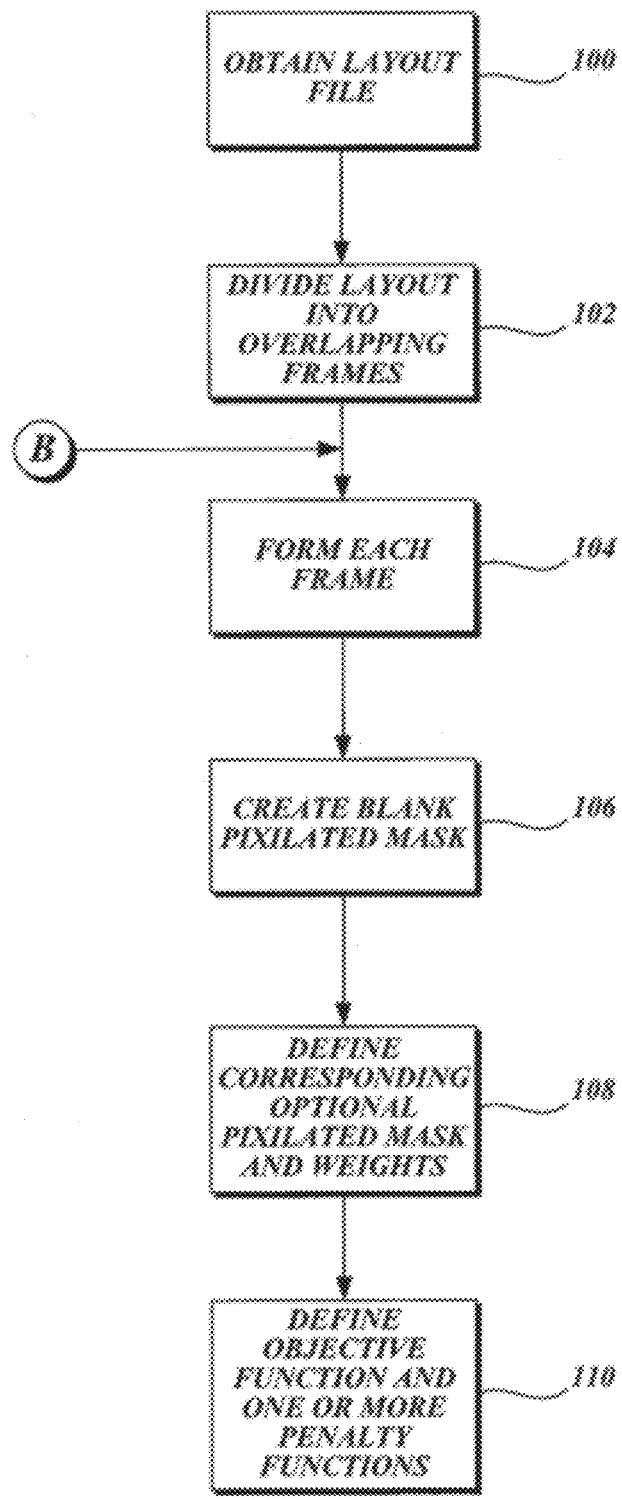
FIGS. 20A and 20B illustrate a series of steps used to calculate a mask layout pattern in accordance with one embodiment of the present invention.
Figure 20B:
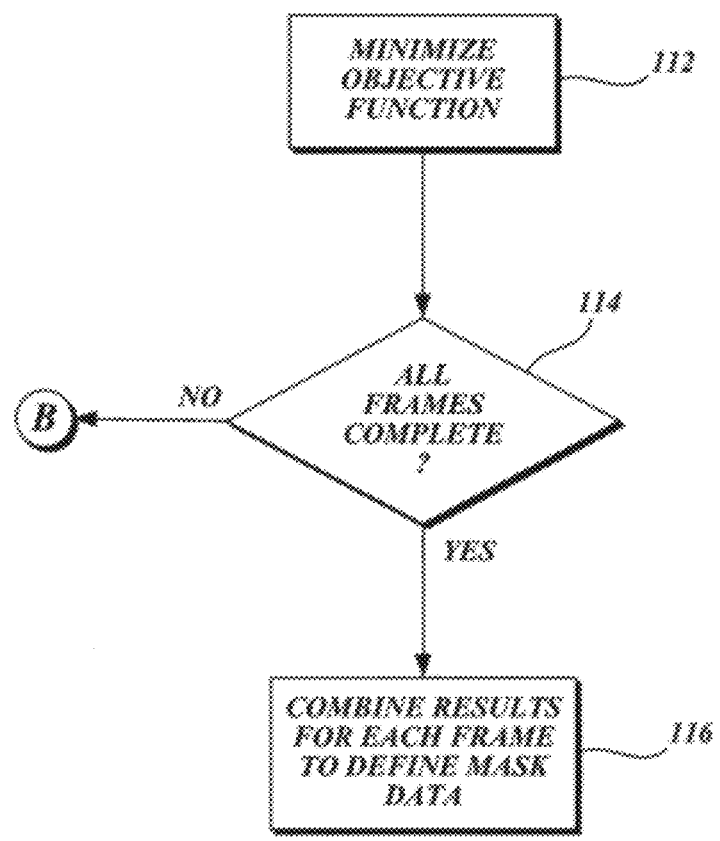

FIGS. 20A-20B illustrate one sequence of steps used to calculate the mask pixel data in accordance with an embodiment of the present invention. Although the steps are discussed in a particular order, it will be appreciated by those skilled in the art that the steps may be performed in a different order while still obtaining the functionality described.

Beginning at 100, a computer system obtains all or a portion of a layout file that defines a desired pattern of features to be created on a semiconductor wafer. At 102, the computer system divides the desired layout into a number of frames. In one embodiment, the frames form adjacent, partially overlapping areas in the layout. Each frame, for example, may occupy an area of 5×5 microns. The size of each frame may depend of the amount of memory available and the processing speed of the computer system being used.

At 104, the computer system begins processing each of the frames. At 106, the computer defines a blank area of mask data that is pixilated. At 108, the computer defines a corresponding set of optimal mask data. In one embodiment, the optimal mask data defines a corresponding set of pixels whose transmission characteristics are defined by the desired layout data. For example, each optimal mask data pixel in an area that corresponds to a wafer feature may have a transmission characteristic of 0 (e.g. opaque) and each optimal mask data pixel that corresponds to an area of no wafer feature may have a transmission characteristic of 1 (e.g. clear). In some embodiments, it may be desirable to change the data for the optimal mask data from that defined strictly by the desired layout pattern. For example, the corners of features may be rounded or otherwise modified to reflect what is practical to print on a wafer. In addition or alternatively, pixel transmission characteristics may be changed from a binary 0/1 value to a grayscale value, to positive and negative values (representing phase shifters) or to complex values (representing partial phase shifters).

In some embodiments the optimal mask data may also include or be modified by a weighting function. The weighting function allows a user to determine how close the solution for a given pixel should be to the transmission characteristic defined by the corresponding pixel in the optimal mask data. The weighting function may be a number selected between 0 and 1 that is defined for each pixel in the optimal mask data.

At 110, an objective function is defined that relates a simulation of the image intensity on wafer to the pixel transmission characteristics of the mask data and the optics of the photolithographic printing system. The objective function may be defined for each frame of mask data or the same objective function may be used for more than one frame of mask data. Typically, the objective function is defined so that the value of the objective is minimized with the best possible mask, however other possibilities could be used.

In one embodiment of the present invention, one or more penalty functions are also defined for the objective function. The penalty functions operate to steer the optimization routine described below to a solution that can be or is desired to be manufactured on a mask. For example, it may be that the objective function has a number of possible solutions of which only one can actually be made as a physical mask. Therefore, the penalty functions operate to steer the solution in a direction selected by the programmer to achieve a mask that is manufacturable. Penalty functions can be defined that promote various styles of resolution enhancement techniques such as: assist features, phase shifters, partial phase shifters, masks having features with grayscale transmission values or multiple transmission values, attenuated phase shifters, combinations of these techniques or the like.

For example, a particular mask to be made may allow each pixel to have one of three possible values with a transmission characteristic of 0 (opaque) +1 (clear) or −1 (clear with phase shift). By including a penalty function in the objective function prior to optimization, the solution is steered to a solution that can be manufactured as this type of mask.

An example of a penalty function is $\alpha_4 \|(m+e)m(m-e)\|_2^2$, where e is a one vector, as set forth in Equation 57 described in the "Fast Pixel-Based Mask Optimization for Inverse Lithography" paper below. In one embodiment, the penalty functions are defined as polynomials having zeroes at desired pixel transmission characteristics. In another embodiment, the penalty functions can represent logical operations. For example, if the area of a wafer is too dark, the corresponding pixels in the mask data can be made all bright or clear. This in combination with other mask constraints has the effect of adding subresolution assist features to the mask data.

At 112, the objective function, including penalty functions, for the frame is optimized. In one embodiment the optimized solution is found using a gradient descent. If the objective function is selected to have the form described by Equation 57, its gradient can be mathematically computed using convolution or cross-correlation, which is efficient to implement on a computer. The result of the optimization is a calculated transmission characteristic for each pixel in the mask data for the frame.

At 114, it is determined if each frame has been analyzed. If not, processing returns to 104 and the next frame is processed. If all frames are processed, the mask pixel data for each of the frames is combined at 116 to define the pixel data for one or more masks. The mask data is then ready to be delivered to a mask writer in order to manufacture the corresponding masks.

More mathematical detail of the method for computing the mask pixel transmission characteristics is described U.S. Patent Application No. 60/722,840 filed Sep. 30, 2005 and incorporated by reference herein, as well as in the paper "Fast Pixel-Based Mask Optimization for Inverse Lithography" by Yuri Granik of Mentor Graphics Corporation, 1001 Ridder Park Drive, San Jose, Calif. 95131, reproduced below (with slight edits).

The direct problem of optical microlithography is to print features on a wafer under given mask, imaging system, and process characteristics. The goal of inverse problems is to find the best mask and/or imaging system and/or process to print the given wafer features. In this study we proposed strict formalization and fast solution methods of inverse mask problems. We stated inverse mask problems (or "layout inversion" problems) as non-linear, constrained minimization problems over domain of mask pixels. We considered linear, quadratic, and non-linear formulations of the objective function. The linear problem is solved by an enhanced version of the Nashold projections. The quadratic problem is addressed by eigenvalue decompositions and quadratic programming methods. The general non-linear formulation is solved by the local variations and gradient descent methods. We showed that the gradient of the objective function can be calculated analytically through convolutions. This is the main practical result because it enables layout inversion on large scale in order of M log M operations for M pixels.

The layout inversion goal appears to be similar or even the same as found in Optical Proximity Correction (OPC) or Resolution Enhancement Techniques (RET). However, we would like to establish the inverse mask problem as a mathematical problem being narrowly formulated, thoroughly formalized, and strictly solvable, thus differentiating it from the engineering techniques to correct ("C" in OPC) or to enhance ("E" in RET) the mask. Narrow formulation helps to focus on the fundamental properties of the problem. Thorough formalization gives opportunity to compare and advance solution techniques. Discussion of solvability establishes existence and uniqueness of solutions, and guides formulation of stopping criteria and accuracy of the numerical algorithms.

The results of pixel-based inversions can be realized by the optical maskless lithography (OML) [31]. It controls pixels of 30×30 nm (in wafer scale) with 64 gray levels. The mask pixels can be negative to achieve phase-shifting.

Strict formulations of the inverse problems, relevant to the microlithography applications, first appear in pioneering studies of B. E. A. Saleh and his students S. Sayegh and K. Nashold. In [32], Sayegh differentiates image restoration from the image design (a.k.a. image synthesis). In both, the image is given and the object (mask) has to be found. However, in image restoration, it is guaranteed that the image is achieved by some object. In image design the image may not be achievable by any object, so that we have to target the image as close as possible to the desired ideal image. The difference is analogical to solving for a function zero (image restoration) and minimizing a function (image design). Sayegh states the image design problem as an optimization problem of minimizing the threshold fidelity error $F_C$ in trying to achieve given threshold $\theta$ at the boundary C of the target image ([32], p. 86):

$$F_C[m(x, y)] = \oint_C (I(x, y) - \theta)^n dl \to \min, \tag{1}$$

where n=2 and n=4 options are explored; I(x,y) is image from the mask m(x,y); x,y are image and mask planar coordinates. Optical distortions are modeled by the linear system of convolution with the point-spread function h(x,y), so that $$I(x,y)=h(x,y)*m(x,y), \tag{2}$$

and for the binary mask (m(x,y)=0 or m(x,y)=1). Sayegh proposes algorithm of one at a time "pixel flipping". Mask is discretized, and then pixel values 0 and 1 are tried. If the error (1) decreases, then the pixel value is accepted, otherwise it is rejected, and we try the next pixel.

Nashold [22] considers a bandlimiting operator in the place of the point-spread function (2). Such formulation facilitates application of the alternate projection techniques, widely used in image processing for the reconstruction and is usually referenced as Gerchberg-Saxton phase retrieval algorithm [7]. In Nashold formulation, one searches for a complex valued mask that is bandlimited to the support of the point-spread function, and also delivers images that are above the threshold in bright areas B and below the threshold in dark areas D of the target:

$$x,y \in B : I(x,y) > \theta,$$

$$x,y \in D : I(x,y) < \theta \tag{4}$$

Both studies [32] and [22] advanced solution of inverse problems for the linear optics. However, the partially coherent optics of microlithography is not a linear but a bilinear system [29], so that instead of (2) the following holds:

$$I(x,y) = \iiiint q(x-x_1, x-x_2, y-y_1, y-y_2) m(x_1,y_1) m^*(x_2,y_2) dx_1 dx_2 dy_1 dy_2, \quad (5)$$

where q is a 4D kernel of the system. While the pixel flipping [32] is also applicable to the bilinear systems, Nashold technique relies on the linearity. To get around this limitation, Pati and Kailath [25] propose to approximate bilinear operator by one coherent kernel h, the possibility that follows from Gamo results [6]:

$$I(x,y) \approx \lambda |h(x,y) * m(x,y)|^2, \quad (6)$$

where constant $\lambda$ is the largest eigenvalue of q, and h is the correspondent eigenfunction. With this the system becomes linear in the complex amplitude A of the electrical field $$A(x,y) = \sqrt{\lambda} h(x,y) * m(x,y). \quad (7)$$

Because of this and because h is bandlimited, the Nashold technique is applicable.

Liu and Zakhor [19, 18] advanced along the lines started by the direct algorithm [32]. In [19] they introduced optimization objective as a Euclidean distance $\|\cdot\|_2$ between the target $I_{ideal}$ and the actual wafer images $$F_I[m(x,y)] = \|I(x,y) - I_{ideal}(x,y)\|_2 \to \min. \quad (8)$$

This was later used in (1) as image fidelity error in source optimization. In addition to the image fidelity, the study [18] optimized image slopes in the vicinity of the target contour C:

$$F_S[m(x,y)] = \oint_{C-\varepsilon} I(x,y) dl - \oint_{C+\varepsilon} I(x,y) dl \to \min, \quad (9)$$

where $C+\varepsilon$ is a sized-up and $C-\varepsilon$ is a sized down contour C; $\varepsilon$ is a small bias. This objective has to be combined with the requirement for the mask to be a passive optical element $m(x,y)m^*(x,y) \leq 1$ or, using infinity norm $\|\cdot\|_\infty = \max|\cdot|$, we can express this as $$\|m(x,y)\|_\infty \leq 1. \quad (10)$$

In case of the incoherent illumination $$I(x,y) = h(x,y)^2 * (m(x,y)m^*(x,y)) \quad (12)$$

the discrete version of (9,10) is a linear programming (LP) problem for the square amplitude $p_i = m_i m^*_i$ of the mask pixels, and was addressed by the "branch and bound" algorithm. When partially coherent optics (4) is considered, the problem is complicated by the interactions $m_i m^*_j$ between pixels and becomes a quadratic programming (QP) problem. Liu [18] applied simulated annealing to solve it. Consequently, Liu and Zakhor made important contributions to the understanding of the problem. They showed that it belongs to the class of the constrained optimization problems and should be addressed as such. Reduction to LP is possible; however, the leanest relevant to microlithography and rigorous formulation must account for the partial coherence, so that the problem is intrinsically not simpler than QP. New solution methods, more sophisticated than the "pixel flipping," have also been introduced.

The first pixel-based pattern optimization software package was developed by Y.-H. Oh, J-C Lee, and S. Lim [24], and called OPERA, which stands for "Optical Proximity Effect Reducing Algorithm". The optimization objective is loosely defined as "the difference between the aerial image and the goal image," so we assume that some variant of (7) is optimized. The solution method is a random "pixel flipping," which was first tried in [32]. Despite the simplicity of this algorithm, it can be made adequately efficient for small areas if image intensity can be quickly calculated when one pixel is flipped. The drawback is that pixel flipping can easily get stuck in the local minima, especially for PSM optimizations. In addition, the resulting patterns often have numerous disjoined pixels, so they have to be smoothed, or otherwise post-processed, to be manufacturable [23]. Despite these drawbacks, it has been experimentally proven in [17] that the resulting masks can be manufactured and indeed improve image resolution.

The study [28] of Rosenbluth, A., et al., considered mask optimization as a part of the combined source/mask inverse problem. Rosenbluth indicates important fundamental properties of inverse mask problems, such as non-convexity, which causes multiple local minima The solution algorithm is designed to avoid local minima and is presented as an elaborate plan of sequentially solving several intermediate problems.

Inspired by the Rosenbluth paper and based on his dissertation and the SOCS decomposition [2], Socha delineated the interference mapping technique [34] to optimize contact hole patterns. The objective is to maximize sum of the electrical fields A in the centers $(x_k, y_k)$ of the contacts $k = 1 \ldots N$:

$$F_B[m(x,y)] = -\sum_k A(x_k, y_k) \to \min. \quad (13)$$

Here we have to guess the correct sign for each $A(x_k, y_k)$, because the beneficial amplitude is either a large positive or a large negative number ([34] uses all positive numbers, so that the larger A the better). When kernel h of (7) is real (which is true for the unaberrated clear pupil), A and $F_B$ are also real-valued under approximation (7) and for the real mask m. By substituting (7) into (13), we get $$-\sum_k A(x_k, y_k) = -\sum_k (h*m)\Big|_{x=x_k, y=y_k} = \quad (14)$$

$$\sum_k (h*m) \cdot \delta(x-x_k, x-x_k) = -(h*m) \cdot \left(\sum_k \delta(x-x_k, x-x_k)\right),$$

where the dot denotes an inner product $f \cdot g = \iint fg \, dx \, dy$. Using the following relationship between the inner product, convolution*, and cross-correlation◦ of real functions $$(f*g) \cdot p = f \cdot (g \circ p), \quad (15)$$

we can simplify (14) to $$-\sum_k A(x_k, y_k) = -\left(h \cdot \sum_k \delta(x-x_k, x-x_k)\right) \cdot m = -G_b \cdot m, \quad (16)$$

where function $G_I$ is the interference map [34]. With (16) the problem (13) can be treated as LP with simple bounds (as defined in [8]) for the mask pixel vector $m = \{m_i\}$ $$-G_b \cdot m \to \min$$

$$-1 \leq m_i \leq 1. \quad (17)$$

In an innovative approach to the joined mask/source optimization by Erdmann, A., et al. [4], the authors apply genetic algorithms (GA) to optimize rectangular mask features and parametric source representation. GA can cope with complex non-linear objectives and multiple local minima.

Reduction to Linear and Thresholding Operators

The inverse mask problem can be reduced to a linear problem as it is shown above for IML or in [11]. This however requires substantial simplifications. Perhaps richer and more interesting is modeling with a linear system and thresholding.

The linearization (7) can be augmented by the threshold operator to model the resist response. Inverse problems for such systems can be solved by Nashold projections [22]. Nashold projections belong to the class of the image restoration techniques, rather than to the image optimizations, meaning that the method might not find the solution (because it does not exists at all), or in the case when it does converge, we cannot state that this solution is the best possible. It has been noted in [30] that the solutions strongly depend on initial guesses and do not deliver the best phase assignment unless the algorithm is steered to it by a good initial guess. Moreover, if the initial guess has all phases set to 0, then so has the solution.

Nashold projections are based on Gerchberg-Saxton [7] phase retrieval algorithm. It updates the current mask iterate $m^k$ via $$m^{k+1}=(P_m P_s)m^k, \quad (31)$$

where $P_s$ is a projection operator into the frequency support of the kernel h, and $P_m$ is a projection operator that forces the thresholding (4). Gerchberg-Saxton iterations tend to stagnate. Fienap [5] proposed basic input-output (BIO) and hybrid input-output (HIO) variations that are less likely to be stuck in the local minima. These variations can be generalized in the expression $$m^{k+1}=(P_m P_s+\alpha(\gamma(P_m P_s - P_s) - P_m + I))m^k, \quad (32)$$

where I is an identity operator; $\alpha=1$, $\gamma=0$ for BIO, $\alpha=1$, $\gamma=1$ for HIO, and $\alpha=0$, $\gamma=0$ for the Gerchberg-Saxton algorithm.

We implemented operator $P_m$ as a projection onto the ideal image $$P_m m^k = \frac{m^k}{|m^k|}\sqrt{I_{ideal}}, \quad (33)$$

and $P_s$ as a projection to the domain of the kernel h, i.e. $P_s$ zeros out all frequencies of m which are high than the frequencies of the kernel h. The iterates (32) are very sensitive to the values of its parameters and the shape of ideal image. We have found meaningful solutions only when the ideal image is smoothed. Otherwise the phases come out "entangled," i.e. the phase alternates along the lines as in FIG. 1E, right, instead of alternating between lines. We used Gaussian kernel with the diffusion length of 28 nm, which is slightly larger than the pixel size 20 nm in our examples. The behavior of iterates (32) is not yet sufficiently understood [36], which complicates choice of $\alpha,\gamma$. In our examples the convergence is achieved for $\alpha=0.9$, $\gamma=1$ after T=5000 iterations. When $\alpha=0$, $\gamma=0$, which corresponds to the original Nashold projections (31), the iterations quickly stagnate converging to a non-printable mask. The runtime is proportional to T*M*log M, M-number of pixels. The convergence is slow because T is large, so that application to the large layout areas is problematic.

Figure 1B:
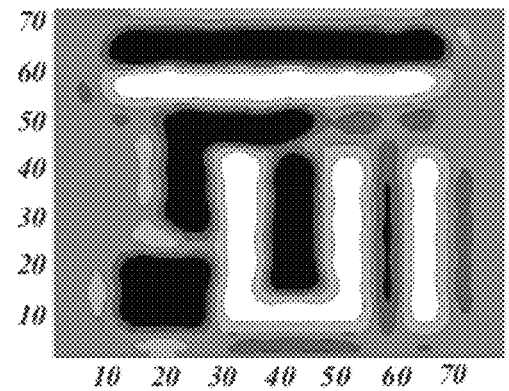
Figure 1C:
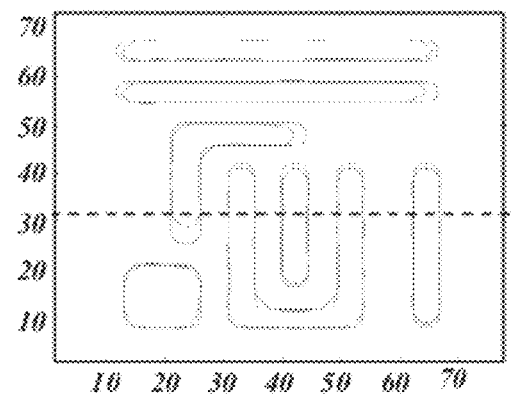
Figure 1D:
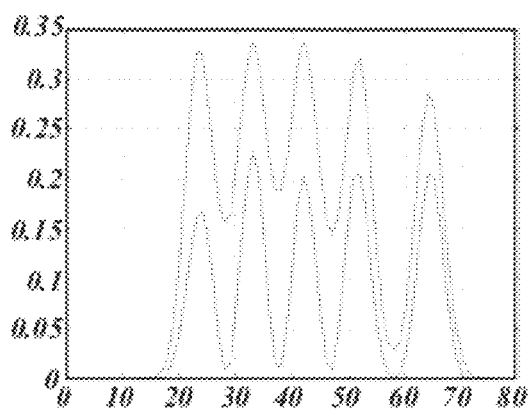
Figure 1E:
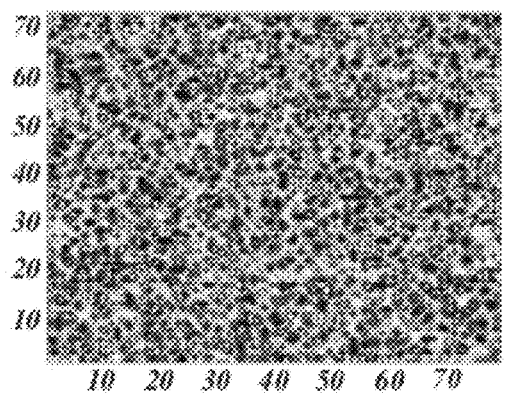
Figure 1F:
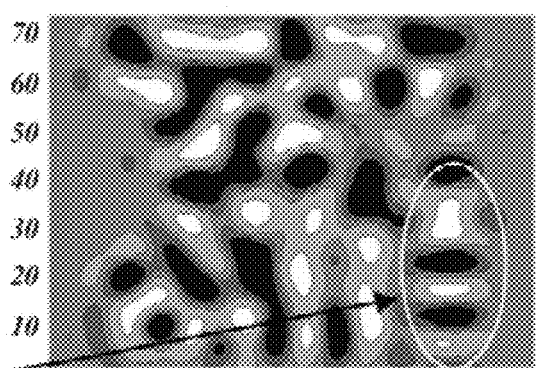
Figure 1G:
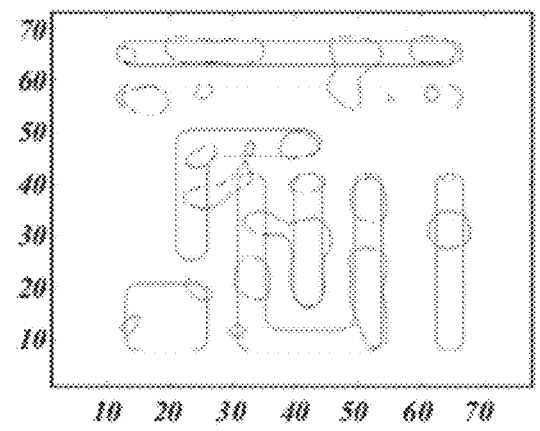
Figure 1H:
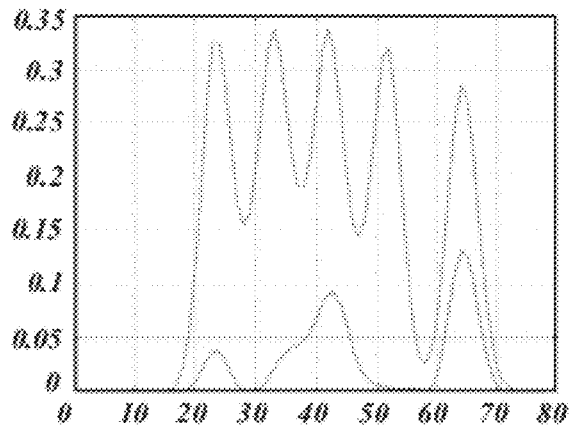

As shown in FIG. 1B, generalized Nashold projections (32) assign alternating phases to the main features and insert assists between lines. The lines widths are on-target, but line-ends are not corrected. The solution has good contrast. When projections stagnate, the phases alternate along the lines. This "phase entanglement" is observed sometimes in the non-linear problems (considered in a section below) when their iterations start from the random pixel assignments.

Quadratic Problems

In the quadratic formulations of the inverse problems, the coherent linearization (6) is not necessarily. We can directly use bilinear integral (5). Our goal here is to construct objective function as is a quadratic form of mask pixels. We start with (8) and replace Euclidean norm (norm 2) with Manhattan norm (norm 1):

$$F_I[m(x,y)]=\|I(x,y)-I_{ideal}(x,y)\|_1 \rightarrow \min. \quad (34)$$

The next step is to assume that the ideal image is sharp, 0 in dark regions and 1 in bright regions, so that $I(x,y) \geq I_{ideal}(x,y)$ in the dark regions and $I(x,y) \leq I_{ideal}(x,y)$ in the bright regions. This lets us to remove the module operation from the integral (34):

$$\|I(x,y)-I_{ideal}(x,y)\|_1 = \iint |I-I_{ideal}|dxdy = \iint w(x,y)(I(x,y)-I_{ideal}(x,y))dxdy, \quad (35)$$

where $w(x,y)$ is 1 in dark regions and $-1$ in bright regions. Finally we can ignore the constant term in (35), which leads to the objective $$F_w[m(x,y)]=\iint wI(x,y) \rightarrow \min. \quad (36)$$

The weighting function w can be generalized to have any positive value in dark regions, any negative value in bright regions, and 0 in the regions which we choose to ignore. Proper choice of this function covers the image slope objective (9), but not the threshold objective (1). Informally speaking, we seek to make bright regions as bright as possible, and dark regions as dark as possible. Substituting (5) into (36), we get $$\iint wI(x,y)dxdy = \iiiint Q(x_1,y_1,x_2,y_2)m(x_1,y_1)m^*(x_2,y_2)dx_1 dx_2 dy_1 dy_2, \quad (37)$$

Where $$Q(x_1,y_1,x_2,y_2)=\iint w(x,y)q(x-x_1,x-x_2,y-y_1,y-y_2)dxdy. \quad (38)$$

Discretization of (37) results to the following constrained QP $$F_w[m]=m^*Qm \rightarrow \min$$

$$\|m\|_{2S} \leq 1. \quad (39)$$

The complexity of this problem depends on the eigenvalues of matrix Q. When all eigenvalues are non-negative, then it is convex QP and any local minimizer is global. This is a very advantageous property, because we can use any of the numerous QP algorithms to find the global solution and do not have to worry about local minima Moreover, it is well known that the convex QP can be solved in polynomial time. The next case is when all eigenvalues are non-positive, a concave QP. If we remove constraints, the problem becomes unbounded, with no minimum and no solutions. This means that the constraints play a decisive role: all solutions, either local or global, end up at some vertex of the box $\|m\|_\infty \leq 1$. In the worst case scenario, the solver has to visit all vertices to find the global solution, which means that the problem is NP-complete, i.e. it may take an exponential amount of time to arrive at the global minima. The last case is an indefinite QP when both positive and negative eigenvalues are present. This is the most complex and intractable case: an indefinite QP can have multiple minima, all lie on the boundary.

We conjecture that the problem (39) belongs to the class of indefinite QP. Consider case of the ideal coherent imaging, when Q is a diagonal matrix. Vector w lies along its diagonal. This means that eigenvalues $\mu_1, \mu_2 \ldots$ of Q are the same as components of the vector w, which are positive for dark pixels and negative for bright pixels. If there is at least one dark and one bright pixel, the problem is indefinite. Another consideration is that if we assume that (39) is convex, then the stationary internal point m=0 where the gradient is zero $$\frac{dF_w[m]}{dm} = 2Qm = 0 \quad (40)$$

is the only solution, which is a trivial case of mask being dark. This means that (39) is either has only a trivial solution, or it is non-convex.

Related to (39) QP was considered by Rosenbluth [28]:

$$m^*Q_d m \to \min$$

$$m^*Q_b m \geq b, \quad (41)$$

where $Q_d$ and $Q_b$ deliver average intensities in bright and dark regions correspondingly. The objective is to keep dark regions as dark as possible while maintaining average intensity not worse than some value b in bright areas. Using Lagrange multipliers, we can convert (41) to $$m^*(Q_d - \lambda Q_b)m \to \min$$

$$\|m\|_\infty \leq 1,$$

$$\lambda \geq 0 \quad (42)$$

which is similar to (39).

Another metric of the complexity of (39) is number of the variables, i.e. the pixels in the area of interest. According to Gould [10], the problems with order of 100 variables are small, more than $10^3$ are large, and more than $10^5$ are huge. Considering that the maskless lithography can control transmission of the 30 nm by 30 nm pixel [31], the QP (39) is large for the areas larger than 1 um by 1 um, and is huge for the areas lager than 10 um by 10 um. This has important implications for the type of the applicable numerical methods: in large problems we can use factorizations of matrix Q, in huge problems factorizations are unrealistic.

For the large problems, when factorization is still feasible, a dramatic simplification is possible by replacing the infinity norm by the Euclidean norm in the constraint of (39), which results in $$F_w[m] = m^*Qm \to \min$$

$$\|m\|_2 \leq 1. \quad (43)$$

Here we search for the minimum inside a hyper-sphere versus a hyper-cube in (39). This seemingly minor fix carries the problem out of the class of NP-complete to P (the class of problems that can be solved in polynomial time). It has been shown in [35] that we can find global minima of (43) using linear algebra. This result served as a base for the computational algorithm of "trust region" [13] which specifically addresses indefinite QP.

The problem (43) has the following physical meaning: we optimize the balance of making bright regions as bright as possible and dark regions as dark as possible while limiting light energy $\|m\|_2^2$ coming through the mask. To solve this problem, we use procedures outlined in [35, 13]. First we form Lagrangian function of (43)

$$L(m, \lambda) = m^*Qm + \lambda(\|m\|^2 - 1). \quad (44)$$

From here we deduce the first order necessary optimality conditions of Karush-Kuhn-Tucker (or KKT conditions, [12]):

$$2(Q + \lambda I)m = 0$$

$$\lambda(\|m\| - 1) = 0.$$

$$\lambda \geq 0$$

$$\|m\| \leq 1 \quad (45)$$

Using Sorensen [35], we can state what that (43) has a global solution if and only if we can find such $\lambda$ and m that (45) is satisfied and the matrix $Q + \lambda I$ is positive semidefinite or positively defined. Let us find this solution.

First we notice that we have to choose $\lambda$ large enough to compensate the smallest (negative) eigenvalue of Q, i.e.

$$\lambda \geq |\mu_1| > 0. \quad (46)$$

From the second condition in (45) we conclude that $\|m\| = 1$, that is the solution lies on the surface of hyper-sphere and not inside it. The last equation to be satisfied is the first one from (45). It has a non-trivial $\|m\| > 0$ solution only when the lagrange multiplier $\lambda$ equals to a negative of one of the eigenvalues $\lambda = -\mu_i$. This condition and (46) has a unique solution $\lambda = -\mu_1$, because other eigenvalues $\mu_2, \mu_3, \ldots$ are either positive so that $\lambda \geq 0$ does not hold, or they are negative, but with absolute value that is smaller than $\mu_1$, so that $\lambda \geq |\mu_1|$ does not hold.

After we determined that $\lambda = -\mu_1$, we can find m from $2(Q - \mu_1 I)m = 0$ as the corresponding eigenvector $m = v_1$. This automatically satisfies $\|m\| = 1$, because all eigenvectors are normalized to have a unit length. We conclude that (43) has a global solution which corresponds to the smallest negative eigenvalue of Q.

As we have shown, the minimum eigenvalue of Q and its eigenvector play special role in the problem by defining the global minimum. However, other negative eigenvectors are also important, because it is easy to see that any pair $$\lambda = -\mu_i > 0$$

$$m = v_i \quad (47)$$

is a KKT point and as such defines a local minimum. The problem has as many local minima as negative eigenvalues. We may also consider starting our numerical minimization from one of these "good" minima, because it is possible that a local minimum leads to a better solution in the hyper-cube than a global minimum of the spherical problem.

Figure 2A:
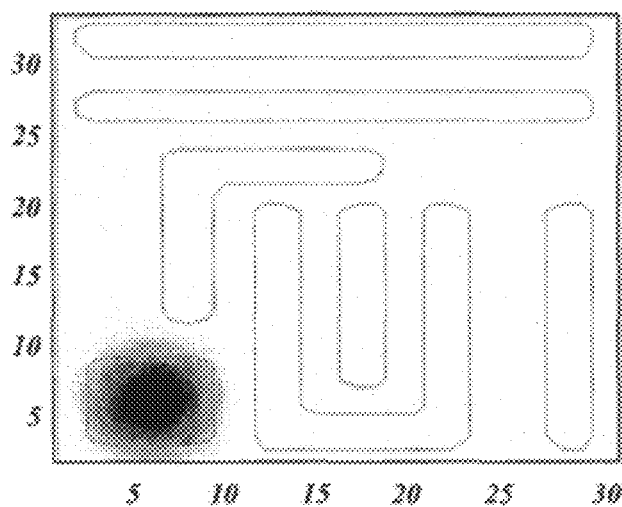
FIGS. 2A-2C illustrate local minima for the structure shown in FIG. 11A.
Figure 2B:
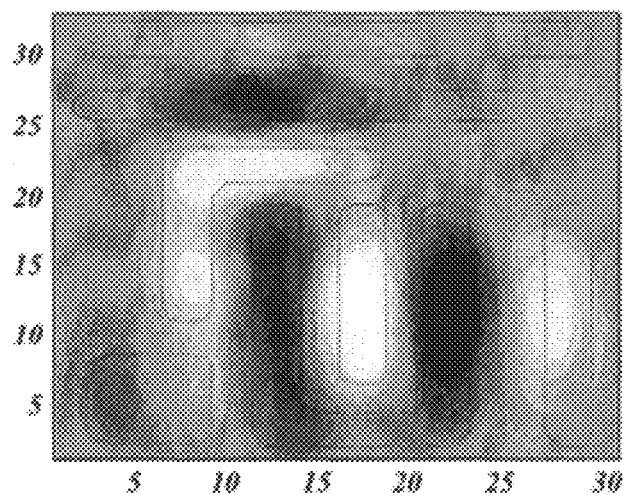
Figure 2C:
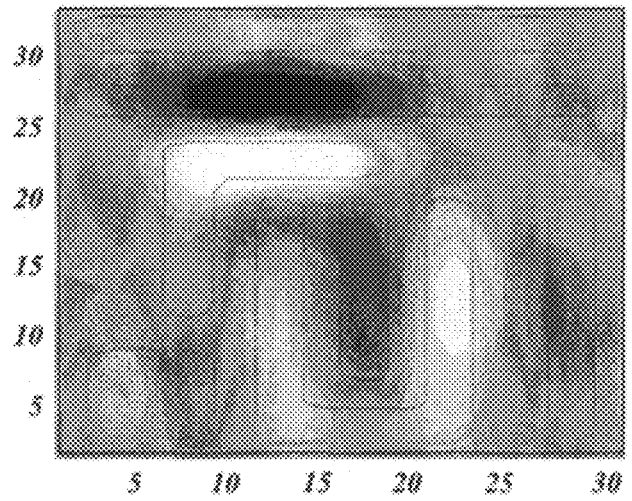

FIGS. 2A, 2B, and 2C shows three strongest local minima of the problem (39) for the structure of FIG. 1B. These local minima are pointing to the beneficial interactions between layout features, suggesting alternating phase assignments. For example, the second solution suggests that the L-shape transmission should be chosen positive, while the comb has negative transmission, the dense vertical line of the comb has positive transmission, and the second horizontal line has negative transmission.

Results of the similar analysis for the case of the contact holes are displayed in FIG. 3A-3D. These results are stronger, and can be used directly in applications. The method "proposes" beneficial phases for the contacts and position and phases of the assists. The most interesting solution is shown in the low right inset, where all contacts have well-defined transmissions, with 3 contacts positive and 4 contacts negative. The advantages of this method comparing to IML [34] is that this method automatically finds the best phases of the contacts and is not based of the coherent approximation.

Figure 3B:
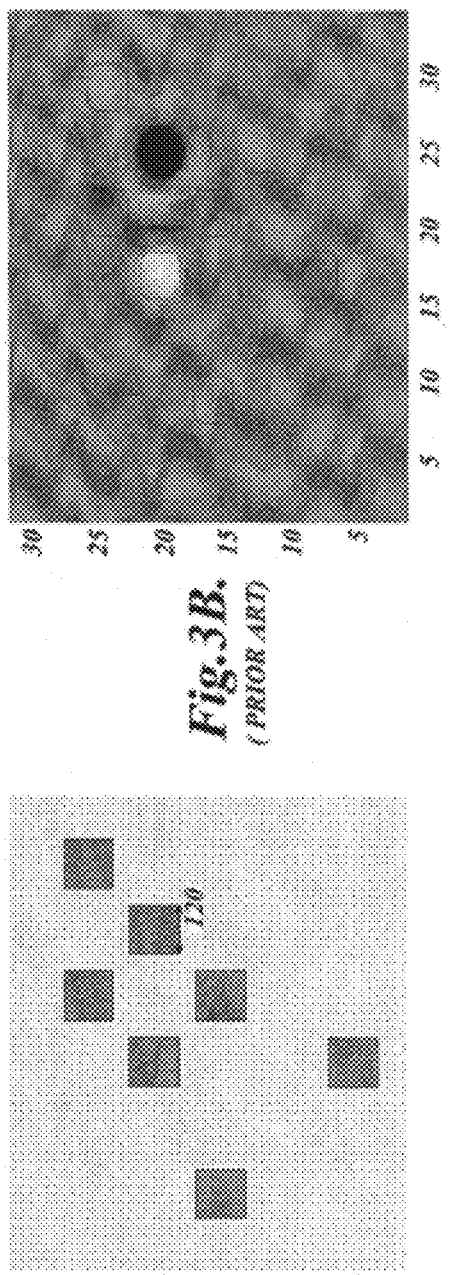
FIGS. 3A-3D illustrate local minima for a pattern of contact holes.
Figure 3D:
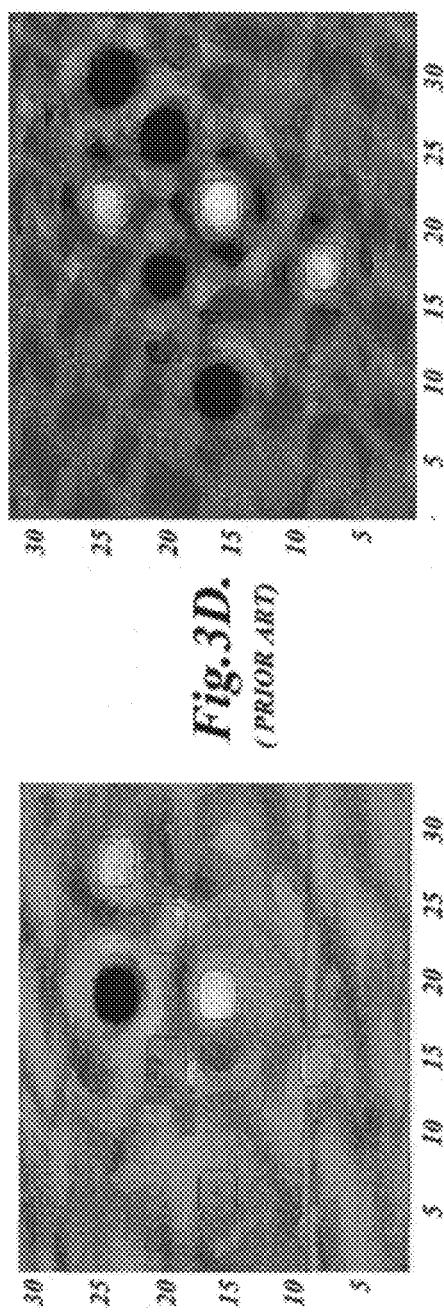
Figure 3A:
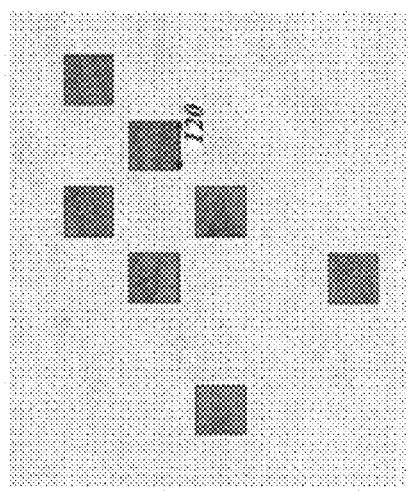
Figure 3C:
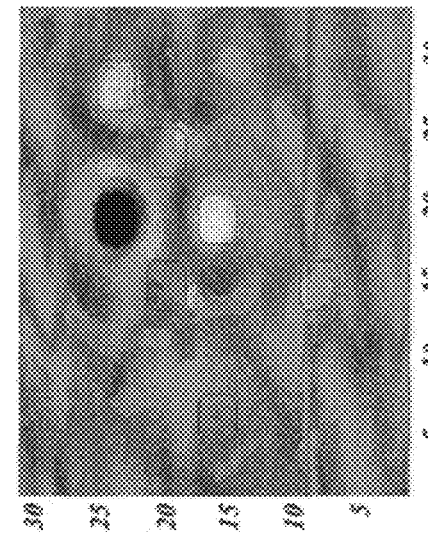

FIGS. 3B, 3C, 3D illustrates the first three local minima for QP on a hyper-sphere for the contact holes and process conditions from Socha [34]. The third solution has the clearest phase assignments and the position of assists.

For the positive masks, in particular for the binary masks, the constraint has to be tightened to $\|m-0.5\|_\infty \leq 0.5$. Then the correspondent to (39) problem is $$F_w[m] = m^*Qm \to \min$$

$$\|m-0.5\|_\infty \leq 0.5. \tag{48}$$

This is also an indefinite QP and is NP-complete. Replacing here infinity norm with Euclidean norm, we get a simpler problem $$m^*Qm \to \min$$

$$\|\Delta m\|_2 \leq 0.5.$$

$$\Delta m = m - m_0, m_0 = \{0.5, 0.5, \ldots, 0.5\} \tag{49}$$

The Lagrangian can be written as $$L(m,\lambda) = m^*Qm + \lambda(\|m-m_0\|^2 - 0.25). \tag{50}$$

The KKT point must be found from the following conditions $$(Q+\lambda I)\Delta m = -Qm_0$$

$$\lambda(\|\Delta m\|^2 - 0.25) = 0.$$

$$\lambda \geq 0$$

$$\|\Delta m\| \leq 0.5 \tag{51}$$

This is more complex problem than (45) because the first equation is not homogeneous and the pairs $\lambda = -\mu_i$, $\Delta m = v_i$ are clearly not the solutions. We can still apply the condition of the global minimum $\lambda \geq -\mu_1 > 0$ (Sorensen [35]). From the second condition we conclude that $\|\Delta m\|^2 = 0.25$, meaning that all solutions lie on the hyper-sphere with the center at $m_0$. The case $\lambda = -\mu_1$ is eliminated because the first equation is not homogeneous, so that we have to consider only $\lambda > -\mu_1$. Then $Q+\lambda I$ is non-singular, we can invert it, and find the solution $$\Delta m = -(Q+\lambda I)^{-1}Qm_0. \tag{52}$$

The last step is to find the Lagrange multiplier $\lambda$ that satisfy the constraint $\|\Delta m\|^2 = 0.25$, that is we have to solve $$\|(Q+\lambda I)^{-1}Qm_0\| = 0.5. \tag{53}$$

The norm on the right monotonically increases from 0 to infinity in the interval $-\infty < \lambda < -\mu_1$, thus (53) has to have exactly one solution in this interval. The pair $\lambda, \Delta m$ that solves (52-53) is a global solution of (49). We conjecture that there are fewer KKT points of local minima of (49) than in (45) (may be there are none), but this remains to be proven by analyzing behavior of the norm (53) when Lagrange multiplier is between negative eigenvalues. The solutions of (49) are supposed to show how to insert assist features when all contacts have the same phases.

General Non-Linear Problems

Consider objective (8) of image fidelity error $$F_I[m(x,y)] = \|I(x,y) - I_{ideal}(x,y)\| \to \min. \tag{54}$$

We can state this in different norms, Manhattan, infinity, Euclidean, etc. The simplest case is a Euclidean norm, because (54) becomes a polynomial of the forth degree (quartic polynomial) of mask pixels. The objective function is very smooth in this case, which ease application of the gradient-descent methods.

We can generalize (54) by introducing weighting $w=w(x,y)$ to emphasize important layout targets and consider smoothing in Sobolev norms as in [20]:

$$F_w[m(x,y)]^2 = \|\sqrt{w} \cdot (I - I_{ideal})\|_2^2 + \alpha_1\|L_1 m\|_2^2 + \alpha_2\|L_2 m\|_2^2 + \alpha_3\|m - m_0\|_2^2 \to \min, \tag{55}$$

where $L_1$, $L_2$ are the operators of first and second derivatives, $m_0 = m_0(x,y)$ is some preferred mask configuration that we want to be close to (for example, the target), and $\alpha_1, \alpha_2, \alpha_3$ are smoothing weights. The solutions of (55) increase image fidelity; however, the numerical experiments show that the contour fidelity of the images is not adequate. To address, we explicitly add (1) into (55):

$$F_{wc}[m]^2 = \left\|\sqrt{w} \cdot (I - I_{ideal})\right\|_2^2 + \oint_C (I - \theta)^n dl + \alpha_1\|L_1 m\|_2^2 + \alpha_2\|L_2 m\|_2^2 + \alpha_3\|m - m_0\|_2^2 \to \min \|m\|_\infty \leq 1. \tag{56}$$

If the desired output is a two-, tri-, any other multi-level tone mask, we can add penalty for the masks with wrong transmissions. The simplest form of the penalty is a polynomial expression, so for example for the tri-tone Levenson-type masks with transmissions $-1, 0$, and $1$, we construct the objective as $$F_{wce}[m]^2 = \tag{57}$$

$$\left\|\sqrt{w} \cdot (I - I_{ideal})\right\|_2^2 + \oint_C (I - \theta)^n dl + +\alpha_1\|L_1 m\|_2^2 + \alpha_2\|L_2 m\|_2^2 +$$

$$\alpha_3\|m - m_0\|_2^2 + +\alpha_4\|(m+e)m(m-e)\|_2^2 \|m\|_\infty \leq 1 \to \min,$$

where $e$ is a one-vector. Despite all the complications, the objective function is still a polynomial of the mask pixels. To optimize for the focus depth, the optimization of (57) can be conducted off-focus, as was suggested in [16, 20]. After discretization, (55) becomes a non-linear programming problem with simple bounds.

We expect that this problem inherits property of having multiple minima from the corresponding simpler QP, though smoothing operators of (57) have to increase convexity of the objective. In the presence of multiple local minima the solution method and staring point are highly consequential: some solvers tend to converge to the "bad" local solutions with disjoined masks pixels and entangled phases, others better navigate solution space and chose smoother local minima The Newton-type algorithms, which rely on the information about second derivatives, should be used with a caution, because in the presence of concavity in (57), the Newtonian direction may not be a descent direction. The branch-and-bound global search techniques [18] are not the right choice because they are not well-suited for the large multi-dimensional optimization problems. It is also tempting to perform non-linear transformation of the variables to get rid of the constraints and convert problem to the unconstrained case, for example by using transformation $x_i = \tan h(m_i)$ or $m_i = \sin(x_i)$ as in [26].

Solution Methods

The reasonable choices to solve (57) are descent algorithms with starting points found from the analytical solutions of the related QP. We apply algorithms of local variations ("one variable at a time"), which is similar in spirit to the pixel flipping [32, 17], and also use a variation of the steepest descent by Frank and Wolfe [21] to solve constrained optimization problems.

In the method of local variation, we chose the step $\Delta_1$ to compare three exploratory transmissions for the pixel i: $m_i^1$, $m_i^1+\Delta_1$, and $m_i^1-\Delta_1$. If one of these values violates constraints, then it is pulled back to the boundary. The best of these three values is accepted. We try all pixels, optionally in random exhaustive or circular order, until no further improvement is possible. Then we reduce step $\Delta_2<\Delta_1$ and repeat the process until the step is deemed sufficiently small. This algorithm is simple to implement. It naturally takes care of the simple (box) constraints and avoids the general problem of other more sophisticated techniques, which may converge prematurely to a non-stationary point. This algorithm calculates the objective function numerous times; however, the runtime cost of its exploratory calls is relatively low with the electrical field caching (see the next section). Other algorithms may require fewer but more costly non-exploratory calls. This makes method of local variation a legitimate tool in solving the problem, though descent methods that use convolution for the gradient calculations are faster.

Frank and Wolfe method is an iterative gradient descent algorithm to solve constrain problems. At each step k we calculate the gradient $\nabla F^k$ of the objective and then replace the non-linear objective with its linear approximation. This reduces the problem to LP with simple bounds:

$$\nabla F^k \cdot m \to \min$$

$$\|m\|_\infty \leq 1. \qquad (59)$$

The solution of this $m=l^k$ is used to determine the descent direction $$p^k = l^k - m^{k-1}. \qquad (60)$$

Then the line search is performed in the direction of $p^k$ to minimize the objective as a function one variable $\gamma \in [0,1]$:

$$F[m^{k-1}+\gamma p^k] \to \min. \qquad (61)$$

The mask $m^k = m^{k-1}+\gamma p^k$ is accepted as the next iterate. The iterations continue until convergence criteria are met. Electrical field caching helps to speedup line search and the gradient calculations if numerical differentiation is used.

Figure 4B:
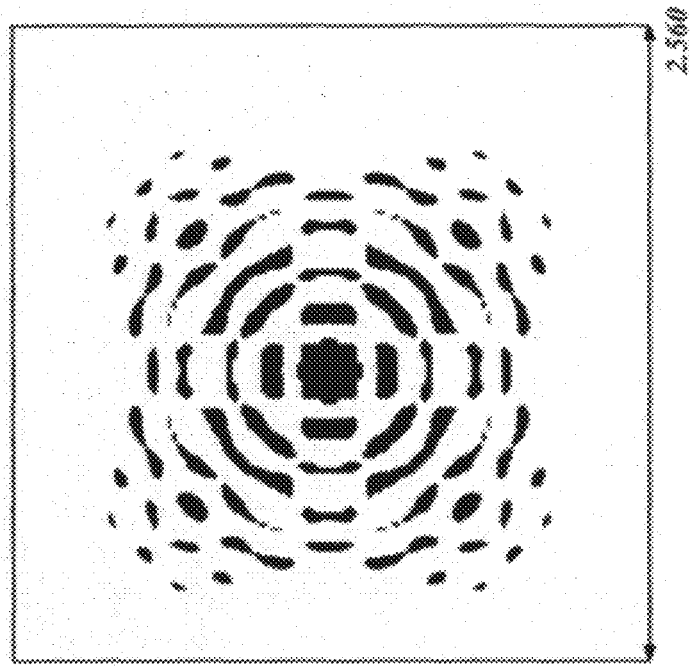
FIGS. 4A-4B illustrate a comparison between local variations and gradient descent optimizations in accordance with an embodiment of the present invention.
Figure 4A:
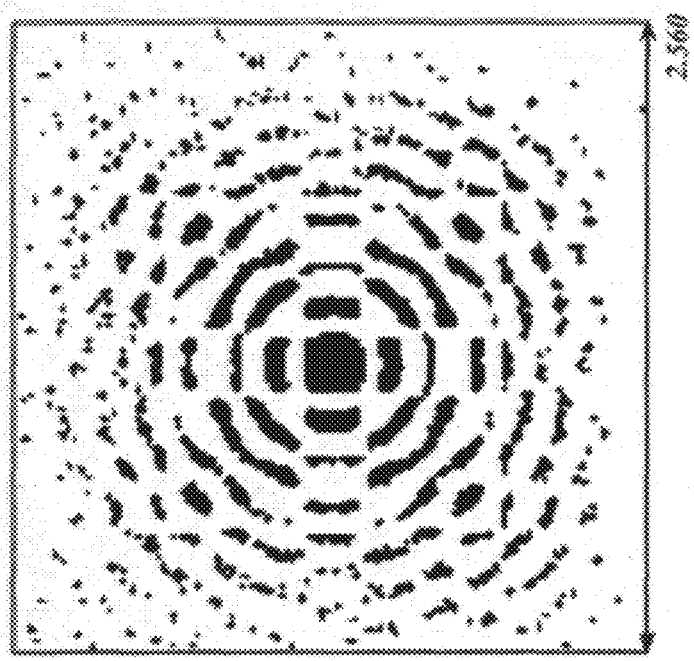
Figure 5C:
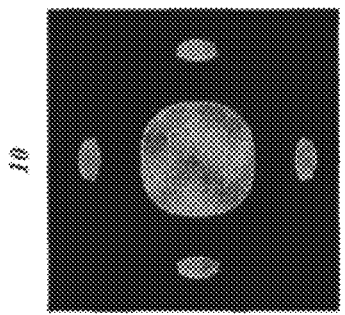
FIGS. 5A-5E illustrate gradient descent solutions after 1, 5, 10, 20, and 50 iterations in accordance with an embodiment of the present invention.
Figure 5E:
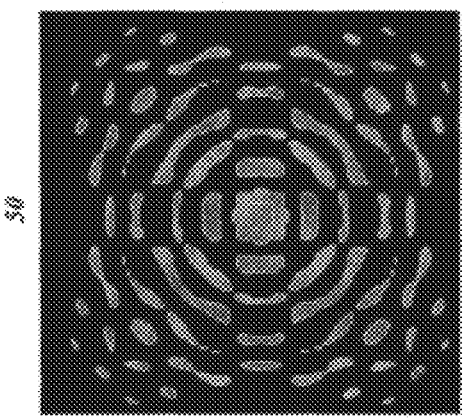
Figure 5B:
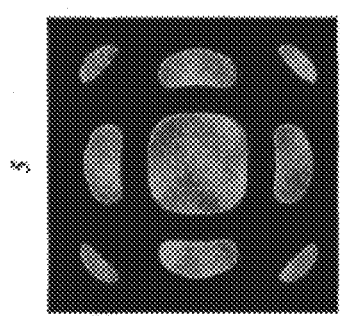
Figure 5D:
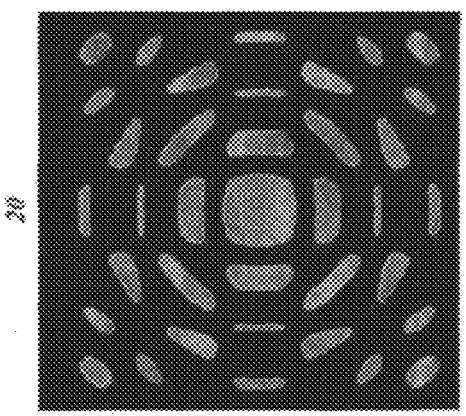
Figure 5A:
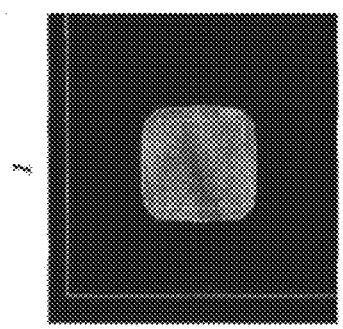

FIGS. 4A and 4B show a comparison between (FIG. 4A) local variations and gradient descent optimizations (FIG. 4B) for the target as an isolated contact hole of 100 nm size, printed with quadrupole illumination. The mask pixels of 10 nm size are thresholded at 0.5 level (the dark areas have transmissions >0.5) and cover 2.56 by 2.65 um layout area. The simulation time of gradient descent with analytically calculated gradient is about 2 seconds on a typical workstation. Solution with local variations is less regular than with the gradient descent, because pixels are iterated randomly. Up to 8 assist rinds are discernable.

FIGS. 5A-5E show gradient descent mask iterations after 1, 5, 10, 20, and 50 iterations. The assist features become more and more complicated as the descent iterations improve objective function. This is simulated under the same process conditions and a target layout as in FIG. 4B.

Gradient of Objective Function

The gradient descent algorithms require recalculation of the objective and its gradient at each iteration. The gradient of the objective function can be calculated numerically or analytically. When the objective is expressed in norm 2 as in (55), the derivatives can be calculated analytically, yielding efficient representation through convolutions.

Consider objective in the form of the weighted inner product $(f,g)=\iint wfg\,dx\,dy$:

$$F_w^2[m] = \|\sqrt{w}\cdot(I-I_{ideal})\|^2 = (I-I_{ideal}, I-I_{ideal}). \qquad (63)$$

Small variations $\delta m$ of the mask m cause the following changes in the objective:

$$F_w^2[m+\delta m] = (I(m+\delta m) - I_{ideal}, I(m+\delta m) - I_{ideal}) = \qquad (64)$$

$$= (I(m) + \delta I - I_{ideal}, I(m) + \delta I - I_{ideal}) \approx$$

$$\approx F_w^2[m] + 2(I - I_{ideal}, \delta I).$$

Let us find $\delta I = I(m+\delta m) - I(m)$. Using SOCS formulation (60), and neglecting $O(\delta m^2)$ terms, we get $$\delta I = I(m+\delta m) - I(m) \qquad (65)$$

$$= \sum_{i=1}^N \lambda_i (h_i * (m+\delta m))(h_i * (m+\delta m))^* -$$

$$\sum_{i=1}^N \lambda_i (h_i * m)(h_i * m)^* \approx$$

$$\approx \sum_{i=1}^N \lambda_i [A_i(h_i * \delta m)^* + A_i^*(h_i * \delta m)]$$

where $A_i$ is defined in (60). To use this in (64), we have to find scalar product of $\delta I$ with $\delta I = I - I_{ideal}$:

$$(\Delta I, \delta I) = \sum_{i=1}^N \lambda_i [(\Delta I, A_i(h_i * \delta m)^*) + (\Delta I, A_i^*(h_i * \delta m))] = \qquad (66)$$

$$= \sum_{i=1}^N \lambda_i [(A_i \Delta I, h_i^* * \delta m^*) + (A_i^* \Delta I, h_i * \delta m)] =$$

$$= 2\sum_{i=1}^N \lambda_i \mathrm{Re}(A_i^* \Delta I, h_i * \delta m)$$

Using the following property of the weighted inner product $$(f^*g, h) = f(g^* \circ wh) \qquad (67)$$

we can convert (66) to the form $$(\Delta I, \delta I) = \qquad (68)$$

$$2\sum_{i=1}^N \lambda_i \mathrm{Re}(\delta m * h_i, A_i^* \Delta I) = 2\sum_{i=1}^N \lambda_i \mathrm{Re}(\delta m \cdot (h_i^* \circ w A_i^* \Delta I))$$

Substituting this into (64) gives us an analytical expression for the gradient of the objective $$F_w^2[m+\delta m] - F_w^2[m] \approx \nabla F_w^2 \cdot \delta m \qquad (69)$$

$$\nabla F_w^2 = 4\sum_{i=1}^N \lambda_i \mathrm{Re}(h_i^* \circ w A_i^* \Delta I)$$

This formula let us calculate gradient of the objective through cross-correlation or convolution as $O(NM \log(M))$ FFT operation, which is significantly faster than numerical differentiation with $O(NM^2)$ runtime.

Electrical Field Caching

The speed of the local variation algorithm critically depends on the ability to quickly re-calculate image intensity when one or a few pixels change. We use electrical field caching procedure to speed up this process.

According to SOCS approximation [3], the image intensity is the following sum of convolutions of kernels $h_i(x,y)$ with the mask $m(x,y)$:

$$I(x, y) = \sum_{i=1}^{N} \lambda_i A_i(x, y) A_i^*(x, y), \quad (60A)$$

$$A_i = h_i(x, y) * m(x, y).$$

Suppose that we know the electrical fields $A_i^0$ for the mask $m^0$ and want to calculate intensity for the slightly different mask m'. Then $$A_i' = A_i^0 + h_i^*(m' - m^0). \quad (61A)$$

These convolutions can be quickly calculated by the direct multiplication, which is $O(d \cdot M \cdot N)$ operation, where d is the number of different pixels between $m^0$ and m', M is pixel count of the kernels, and N is number of kernels. This may be faster than convolution by FFT. Constantly updating the cache $A_i^0$, we can quickly re-calculate intensities for small evolutionary mask changes.

The additivity of the electrical fields can also be exploited to speedup intensity calculations in the line search (61A). If the mask $m^{k-1}$ delivers electrical fields $A_i^{k-1}$, and the mask $p^k$ delivers $B_i^k$, then the intensity from the mask $m = m^{k-1} + \gamma p^k$ can be quickly calculated through its electrical fields $A_i$:

$$A_i = A_i^{k-1} + \gamma B_i^k. \quad (62A)$$

This avoids convolutions of (60A) and reduces intensity calculation to multiplication of the partial electrical fields $A_i$.

Simulation Results

Figure 6C:
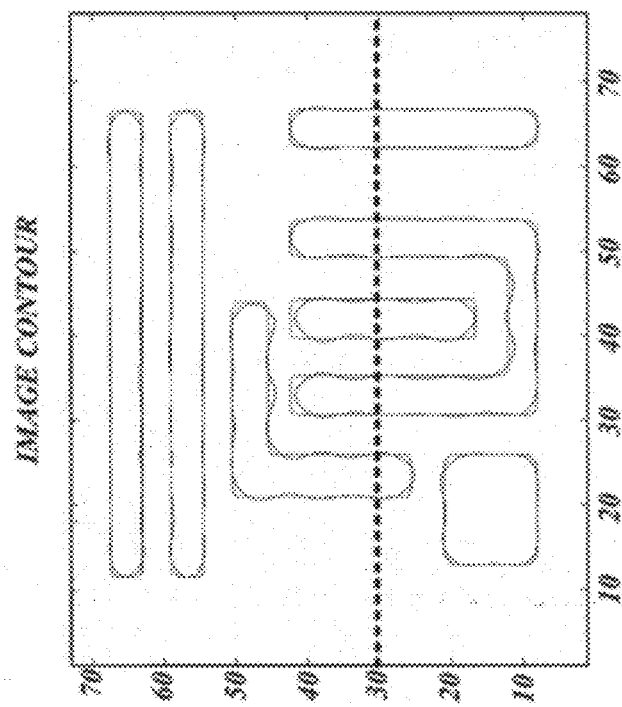
Figure 6B:
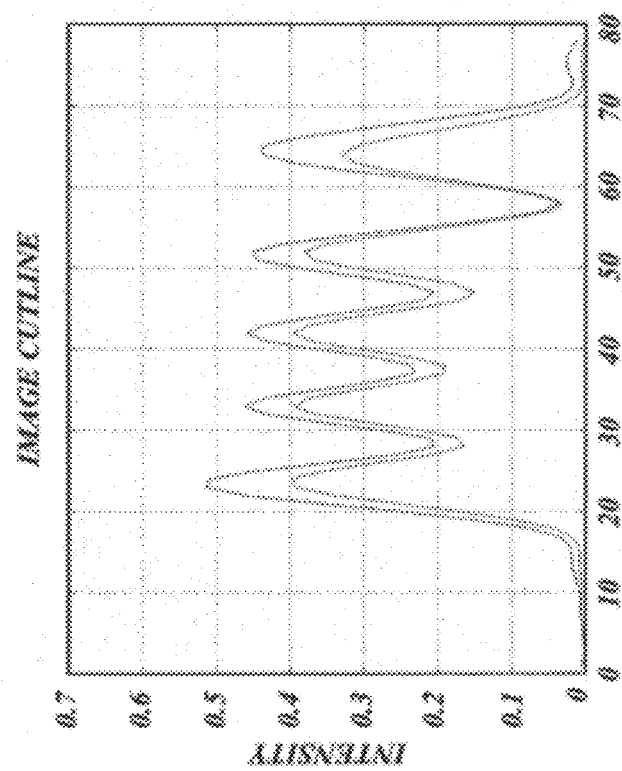

In FIGS. 6A-6C we show results of solving (56) with the contour fidelity metric for the positive mask $0 \leq m \leq 1$. The assist features can be seen around main structures.

FIGS. 6A-6C show local variations method for the objective (57) with contour fidelity. The contours are on target almost everywhere, including line ends. The image contrast is improved. Mask has rows of assist features and serifs.

Figure 7C:
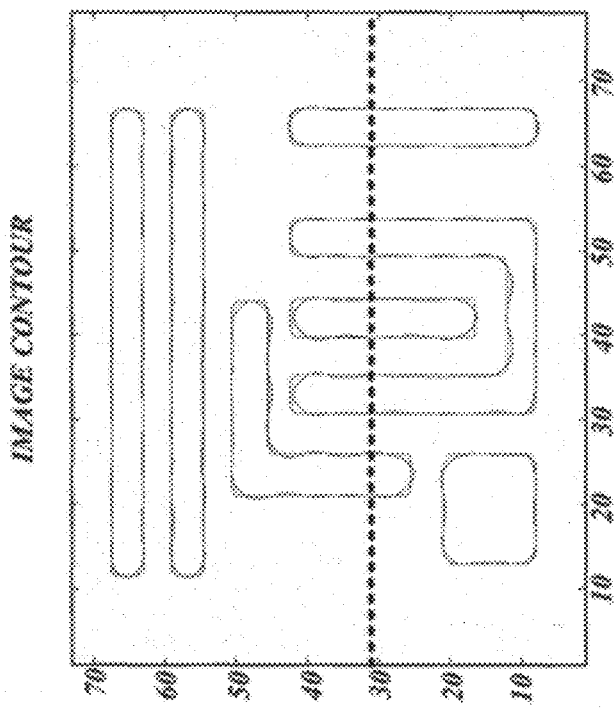
Figure 7B:
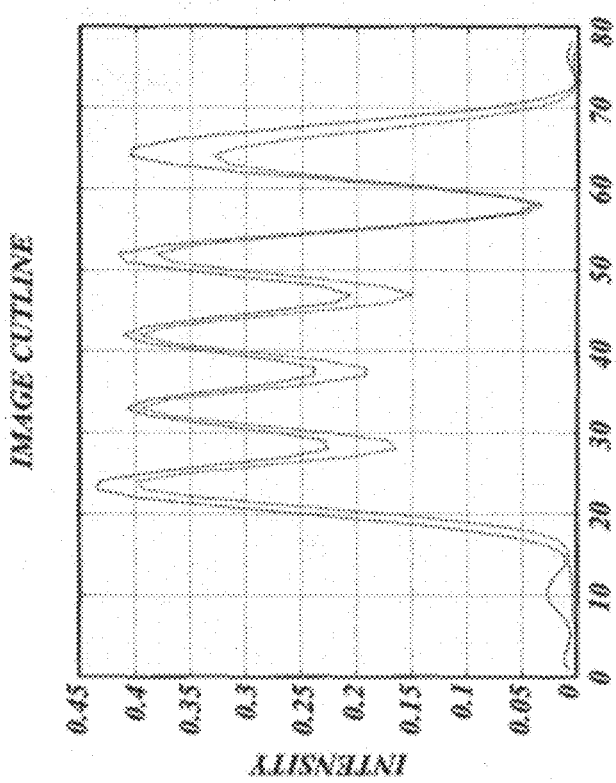

Next example demonstrates solutions when main features have the same phase and assist features can have phase shift, FIGS. 7A-7C. We observe negative transmission of the assists on the mask. The contrast along the cutline is improved in comparison to the ideal case (mask equal target). Contour fidelity is very good, the third inset. The last example is contact holes, FIGS. 10A-10B and 11A-11D. The method is capable of inserting assist contacts and deliver complex interferometric assist features in PSM case.

FIGS. 7A-7C illustrate a method of local variations for the objective (57) with contour fidelity and PSM mask with assist features.

Figure 8C:
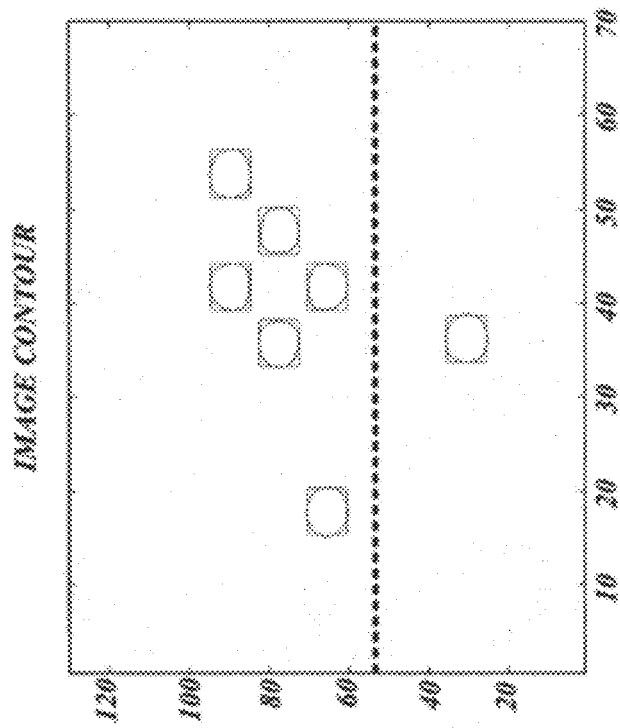
Figure 8B:
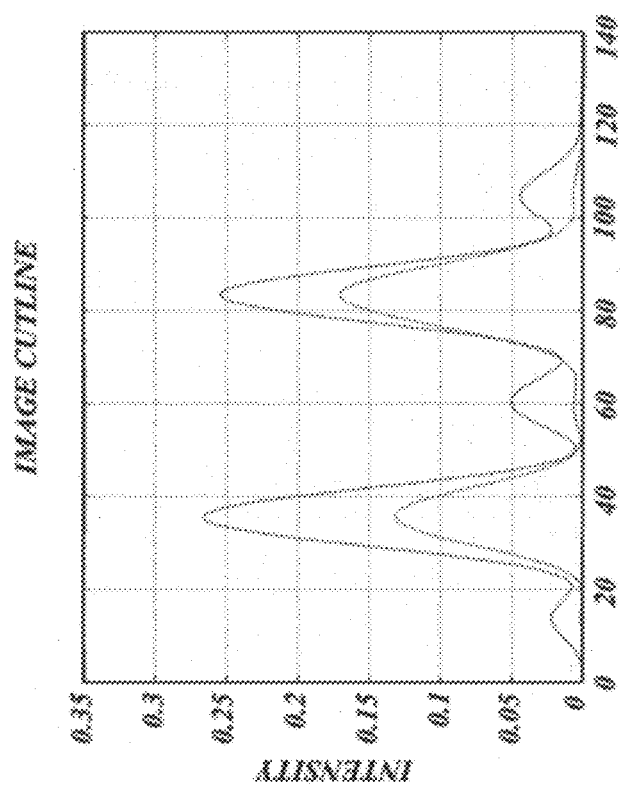

FIGS. 8A-8C illustrate contact holes example for the binary mask. Small assist contact holes are inserted around main contacts. The image contrast is compared to the case when mask is the same as target. The contrast is improved significantly. Image contours are on target, the third column.

Figure 9A:
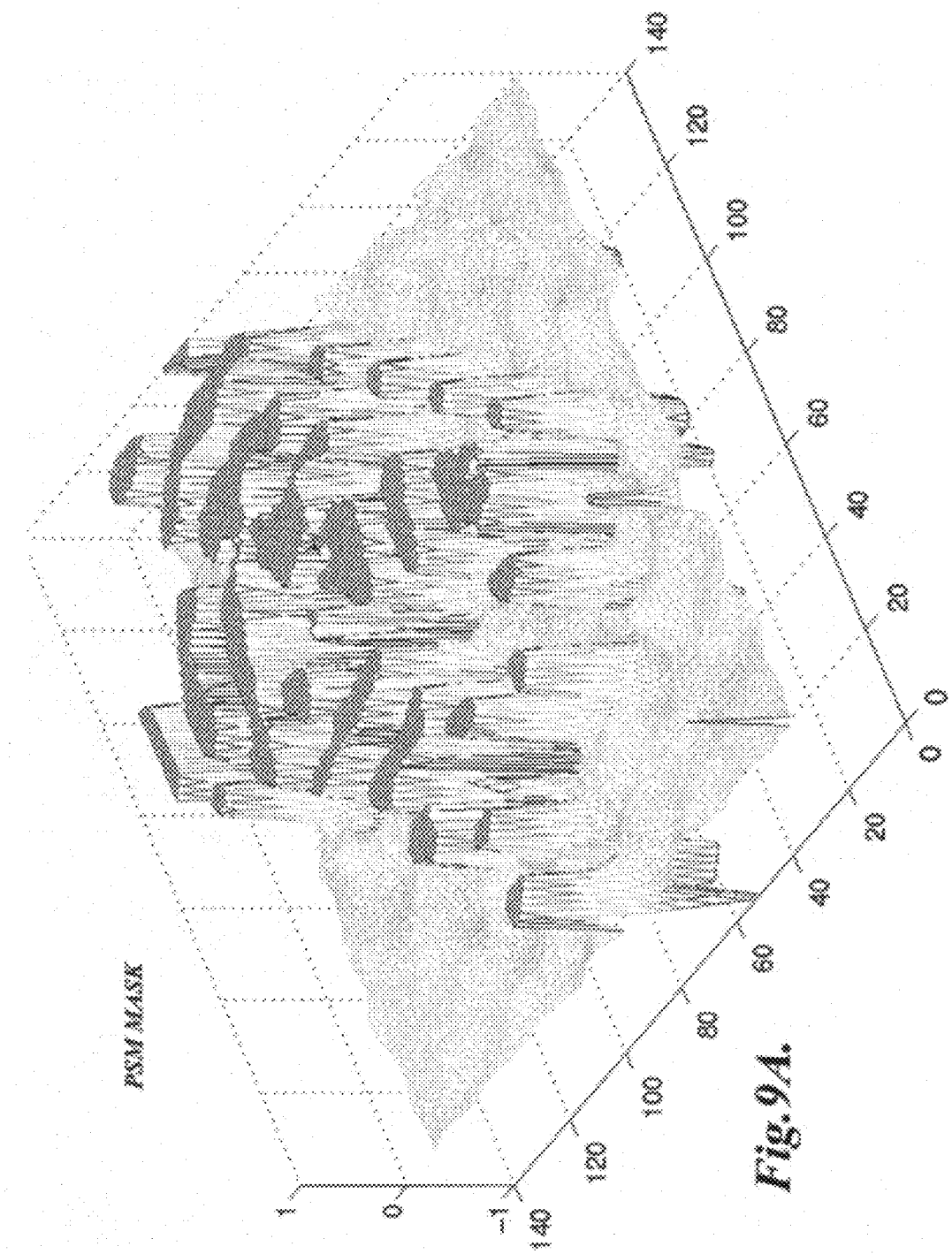
FIGS. 9A-9C illustrate contact holes for strong PSM masks.
Figure 9C:
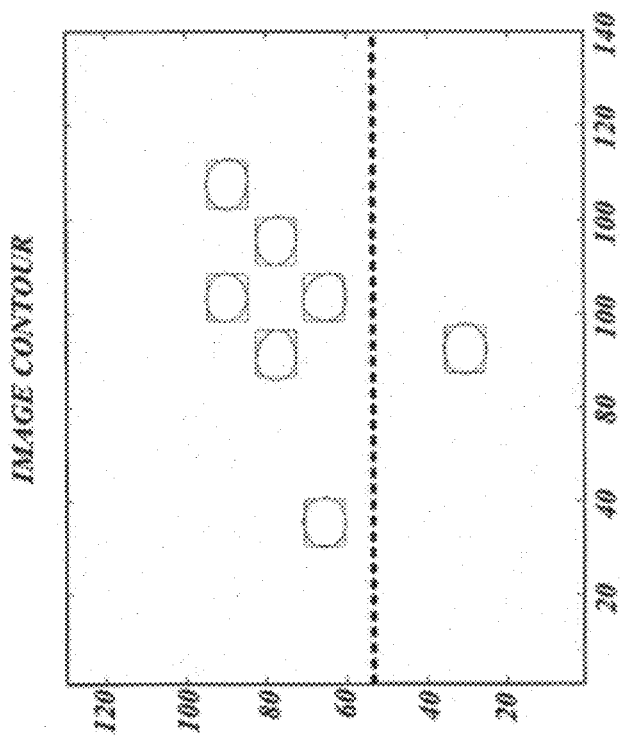
Figure 9B:
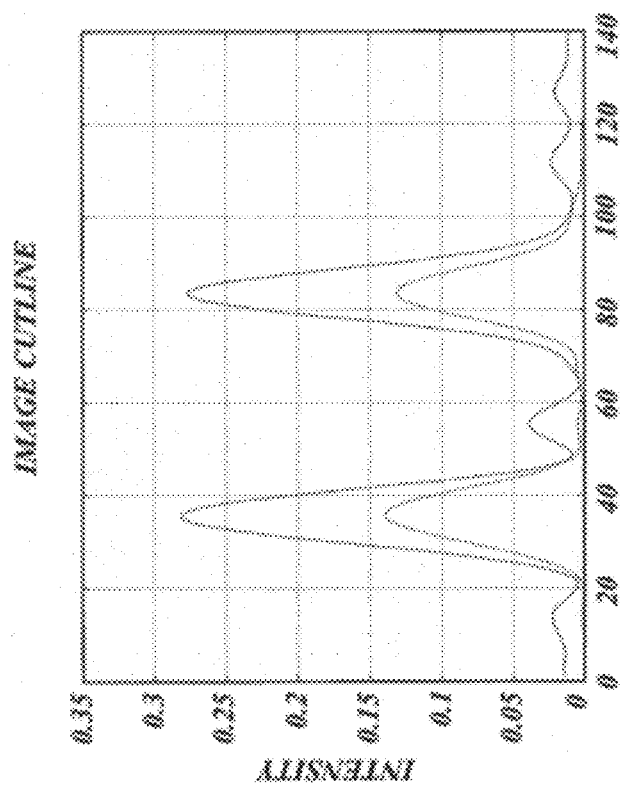

FIGS. 9A-9C illustrate contact holes example for strong PSM mask. Resulting PSM mask has complex structure of assists holes, which are hard to separate from the main features. The contrast is even better than for the binary mask. Despite very complex mask, the contours are on target (lower right inset) and sidelobs do not print.

Figure 10A:
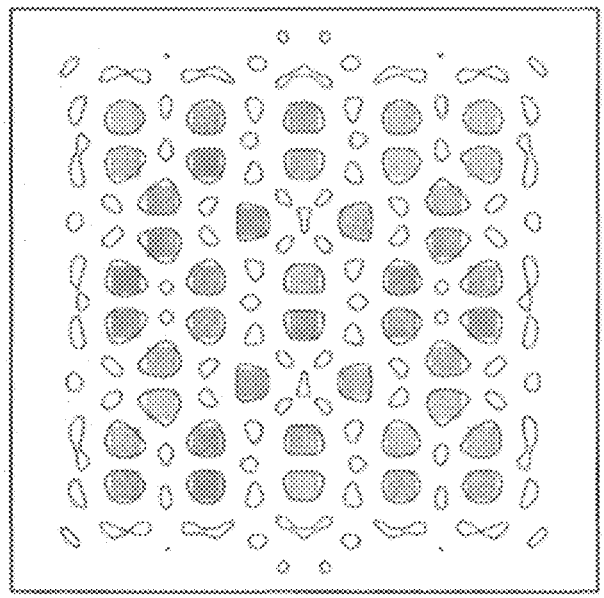
FIGS. 10A-10B illustrate a layout inversion for random logic and an SRAM cell.
Figure 10B:
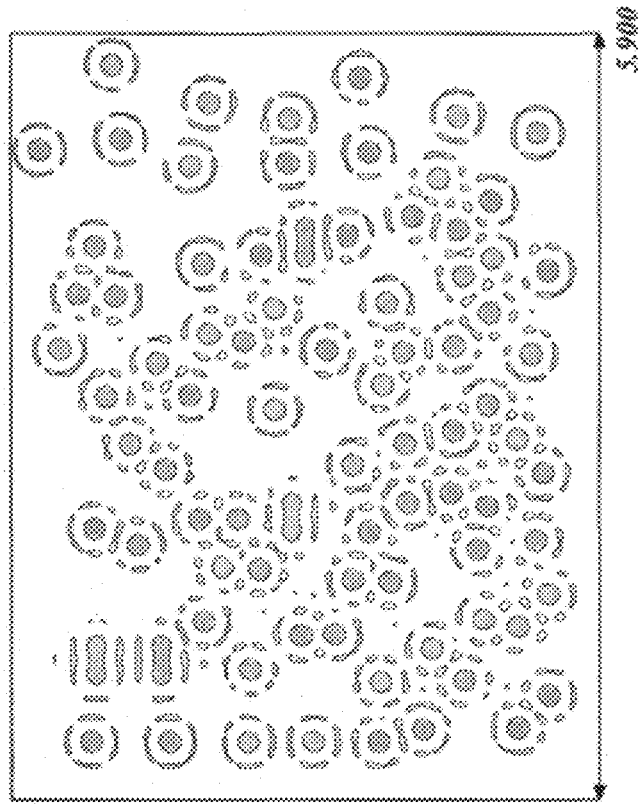
Figure 12A:
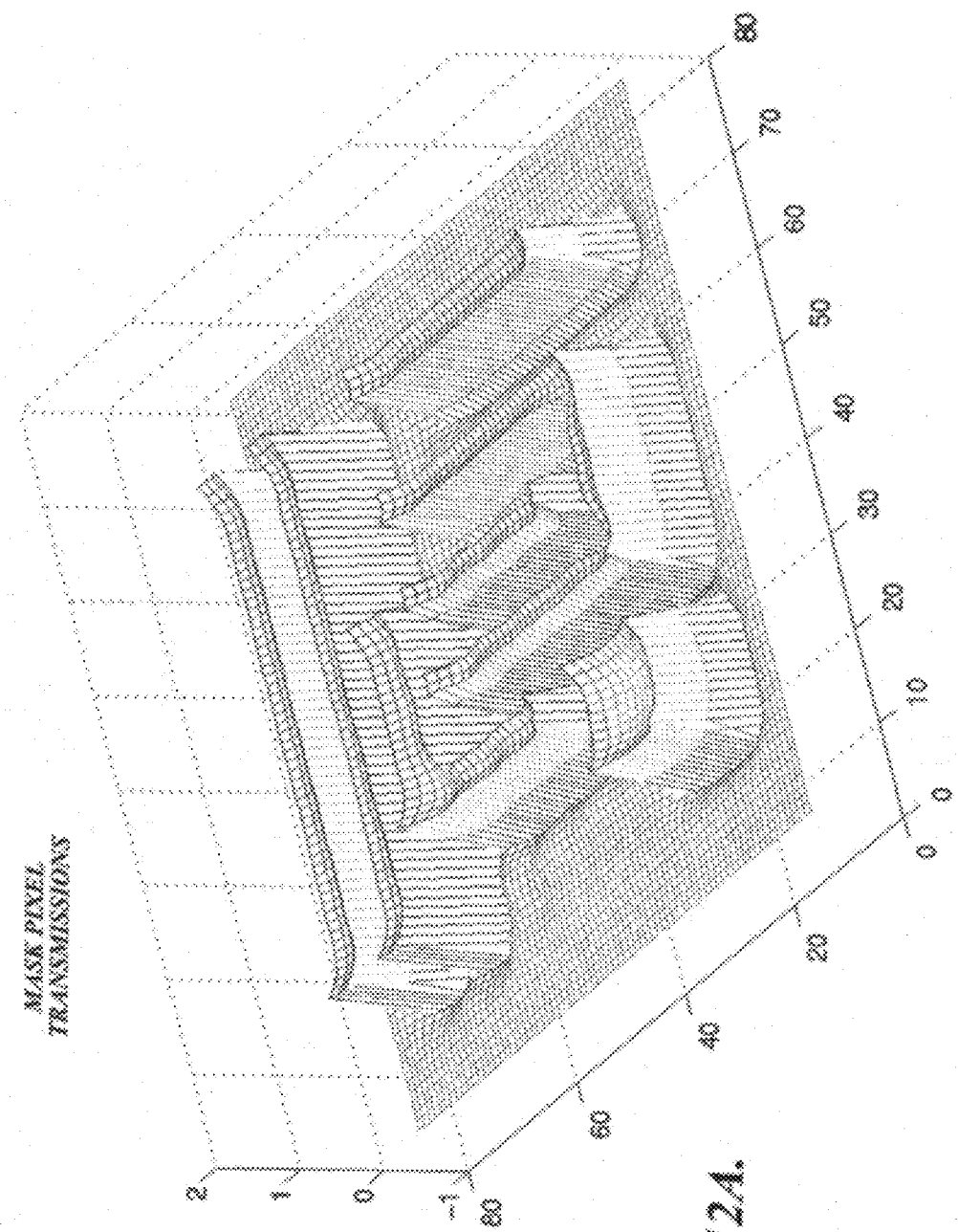
Figure 13A:
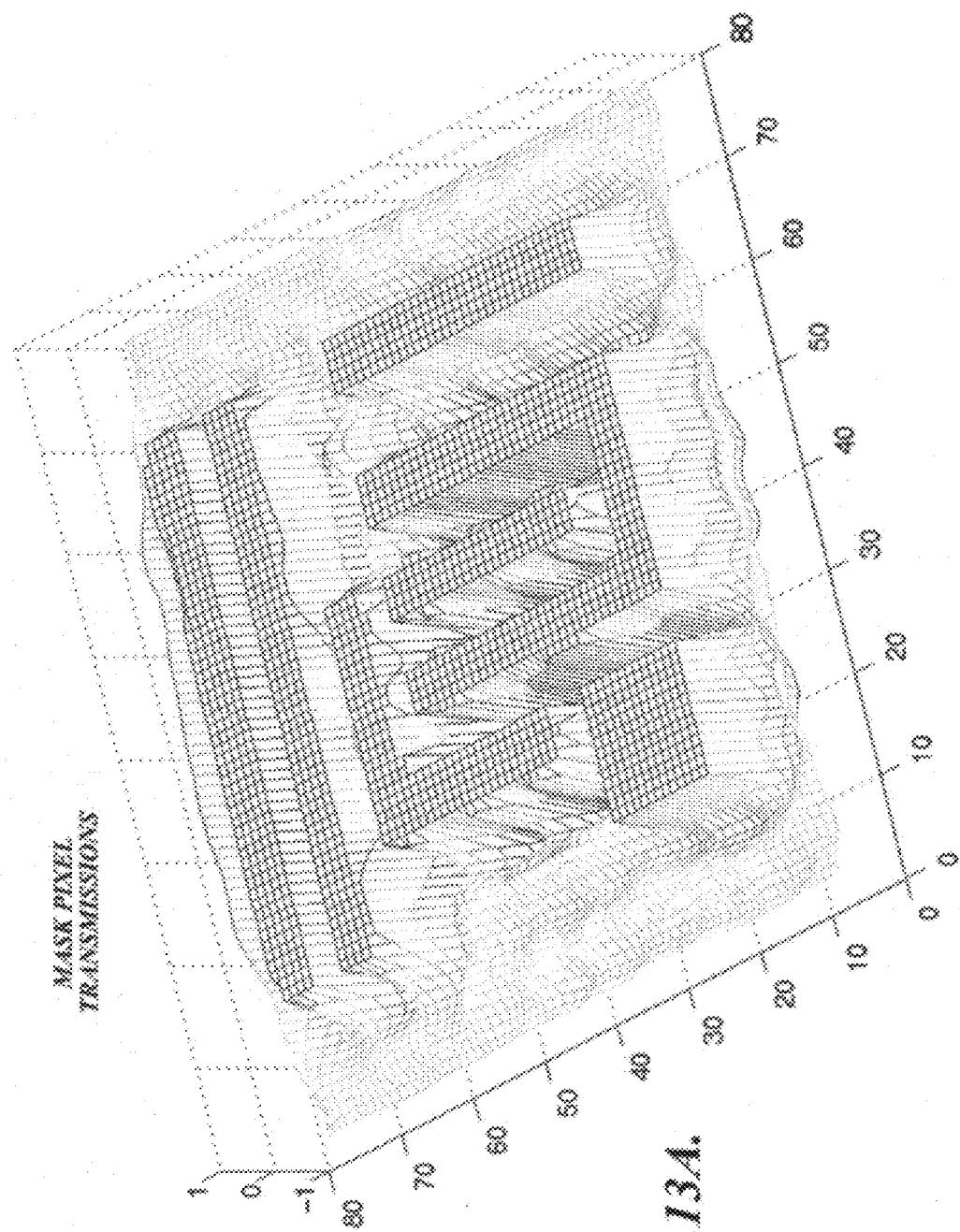
FIGS. 13A-13D illustrate a result of a constrained least square optimization in accordance with an embodiment of the present invention.
Figure 13D:
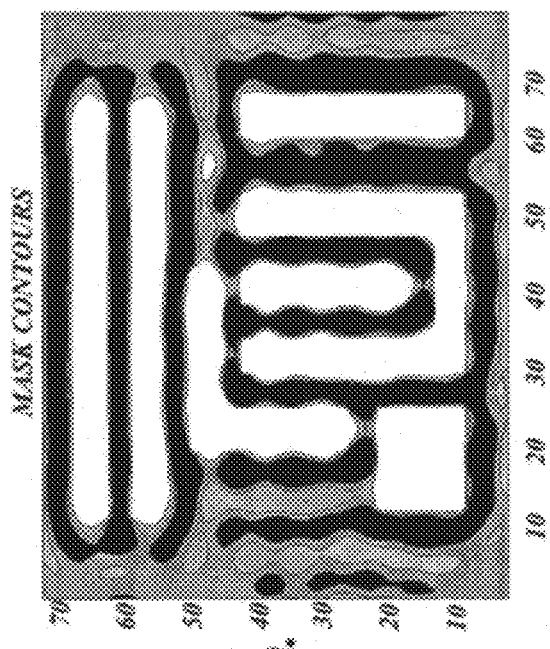
Figure 13C:
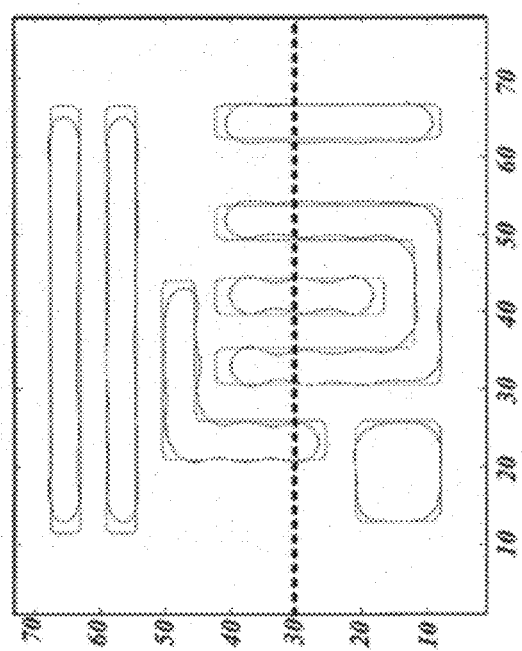
Figure 13B:
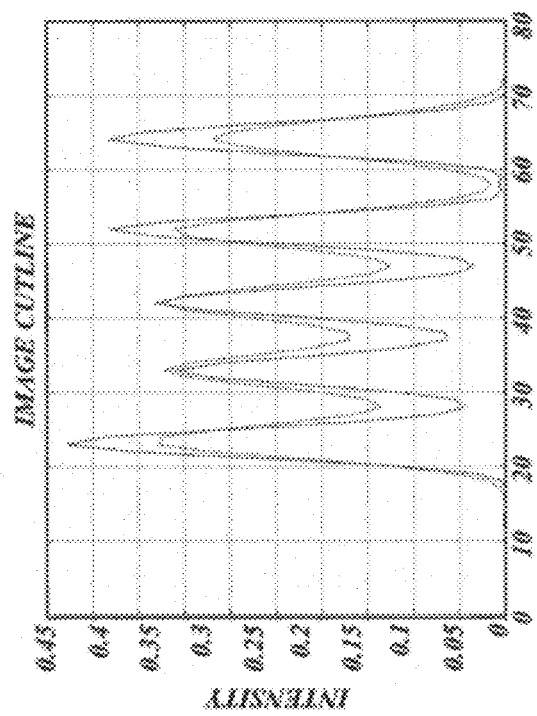

FIGS. 10A-10B demonstrate application of gradient descent to large piece of the layout with contact holes. The target holes are shown in green. The resulting mask is thresholded at the transmission level 0.5. The manufacturability of such complex masks is discussed in [33].

FIGS. 10A-10B illustrate examples of layout inversion for random logic and an SRAM cell.

We classified methods for solving inverse mask problems as linear, quadratic, and non-linear. We showed how to solve a quadratic problem for the case of spherical constraint. Such analytical solutions can be used as a first step for solving non-linear problems. In the case of the contacts, these solutions can be immediately applicable to assign contact phases and find positions of assist features. A composite objective function is proposed for the non-linear optimizations that combines objectives of image fidelity, contour fidelity, and penalized non-smooth and out of tone solutions. We applied method of local variations and a gradient descent to the non-linear problem. We proposed electrical field caching technique. Significant speedup is achieved in the descent algorithms by using analytical gradient of the objective function. This enables layout inversion on large scale as M log M operation for M pixels.

Still further mathematical detail of a method of calculating mask pixel transmission characteristics in accordance with an embodiment of the present invention is set forth in U.S. Provisional Patent Application No. 60/657,260, which is incorporated by reference herein as well as is in the paper "Solving Inverse Problems of Optical Microlithography" by Yuri Granik of Mentor Graphics Corporation, reproduced below (with slight edits).

The direct problem of microlithography is to simulate printing features on the wafer under given mask, imaging system, and process characteristics. The goal of inverse problems is to find the best mask and/or imaging system and/or process to print the given wafer features. In this study we will describe and compare solutions of inverse mask problems.

Pixel-based inverse problem of mask optimization (or "layout inversion") is harder than inverse source problem, especially for partially-coherent systems. It can be stated as a non-linear constrained minimization problem over complex domain, with large number of variables. We compare method of Nashold projections, variations of Fienap phase-retrieval algorithms, coherent approximation with deconvolution, local variations, and descent searches. We propose electrical field caching technique to substantially speedup the searching algorithms. We demonstrate applications of phase-shifted masks, assist features, and maskless printing.

We confine our study to the inverse problem of finding the best mask. Other inverse problems like non-dense mask optimization or combined source/mask optimization, however important, are not scoped. We also concentrate on the dense formulations of problems, where mask is discretized into pixels, and mostly skip the traditional edge-based OPC [25] and source optimization approaches [1].

The layout inversion goal appears to be similar or even the same as found in Optical Proximity Correction (OPC) or Resolution Enhancement Techniques (RET). However, we would like to establish the inverse mask problem as a mathematical problem being narrowly formulated, thoroughly formalized, and strictly solvable, thus differentiating it from the engineering techniques to correct ("C" in OPC) or to enhance ("E" in RET) the mask. Narrow formulation helps to focus on the fundamental properties of the problem. Thorough formalization gives opportunity to compare and advance solution techniques. Discussion of solvability establishes existence and uniqueness of solutions, and guides formulation of stopping criteria and accuracy of the numerical algorithms.

The results of pixel-based inversions can be realized by the optical maskless lithography (OML) [31]. It controls pixels of 30×30 nm (in wafer scale) with 64 gray levels. The mask pixels can also have negative real values, which enables phase-shifting.

Strict formulations of the inverse problems, relevant to the microlithography applications, first appear in pioneering studies of B.E.A. Saleh and his students S. Sayegh and K. Nashold. In [32], Sayegh differentiates image restoration from the image design (a.k.a. image synthesis). In both, the image is given and the object (mask) has to be found. However, in image restoration, it is guaranteed that the image is achieved by some object. In image design the image may not be achievable by any object, so that we have to target the image as close as possible to the desired ideal image. The difference is analogical to solving for a function zero (image restoration) and minimizing a function (image design). Sayegh proceeds to state the image design problem as an optimization problem of minimizing the threshold fidelity error $F_C$ in trying to achieve the given threshold $\theta$ at the boundary C of the target image ([32], p. 86):

$$F_C[m(x,y)] = \oint_C (I(x,y) - \theta)^n dl \to \min, \quad (1A)$$

where n=2 and n=4 options were explored; I(x,y) is image from the mask m(x,y); x,y are image and mask coordinates. Optical distortions were modeled by the linear system of convolution with a point-spread function h(x,y), so that $$I(x,y) = h(x,y) * m(x,y), \quad (2A)$$

and for the binary mask $$m(x,y) = \{0,1\}. \quad (3A)$$

Sayegh proposes algorithm of one at a time "pixel flipping". Mask is discretized, and then pixel values 0 and 1 are tried. If the error (1) decreases, then the pixel value is accepted, otherwise it is rejected, and we try the next pixel.

Nashold [22] considered a bandlimiting operator in the place of the point-spread function (2A). Such formulation facilitates application of the alternate projection techniques, widely used in image processing for the reconstruction and is usually referenced as Gerchberg-Saxton phase retrieval algorithm [7]. In Nashold formulation, one searches for a complex valued mask that is bandlimited to the support of the point-spread function, and also delivers images that are above the threshold in the bright areas B and below the threshold in the dark areas D of the target:

$$x,y \in B: I(x,y) > \theta,$$

$$x,y \in D: I(x,y) < \theta. \quad (4A)$$

Both studies [32] and [22] advanced solution of inverse problems for the linear optics. However, the partially coherent optics of microlithography is not a linear but a bilinear system [29], so that instead of (2A) the following holds:

$$I(x,y) = \iiiint q(x-x_1, x-x_2, y-y_1, y-y_2) m(x_1,y_1) m^*(x_2,y_2) dx_1 dx_2 dy_1 dy_2, \quad (5A)$$

where q is a 4D kernels of the system. While the pixel flipping [32] is also applicable to the bilinear systems, Nashold technique relies on the linearity. To get around this limitation, Pati and Kailath [25] proposed to approximate bilinear operator by one coherent kernel h, the possibility that follows from Gamo results [6]:

$$I(x,y) \approx \lambda |h(x,y) * m(x,y)|^2, \quad (6A)$$

where constant $\lambda$ is the largest eigenvalue of q, and h is the correspondent eigenfunction. With this the system becomes linear in the complex amplitude A of the electrical field $$A(x,y) = \sqrt{\lambda} h(x,y) * m(x,y). \quad (7A)$$

Because of this and because h is bandlimited, the Nashold technique is applicable.

Y. Liu and A. Zakhor [19, 18] advanced along the lines started by the direct algorithm [32]. In [19] they introduced optimization objective as a Euclidean distance $\|\cdot\|_2$ between the target $I_{ideal}$ and actual wafer images $$F_1[m(x,y)] = \|I(x,y) - I_{ideal}(x,y)\|_2 \to \min. \quad (8A)$$

This was later used in (1A) as image fidelity error in source optimization. In addition to the image fidelity, the study [18] optimized image slopes in the vicinity of the target contour C:

$$F_S[m(x,y)] = \oint_{C-\varepsilon} I(x,y) dl - \oint_{C+\varepsilon} I(x,y) dl \to \min, \quad (9A)$$

where C+$\epsilon$ is a sized up and C−$\epsilon$ is a sized down contour C; $\epsilon$ is a small bias. This objective has to be combined with the requirement for the mask to be a passive optical element $m(x,y)m^*(x,y) \leq 1$ or, using infinity norm $\|\cdot\|_\infty = \max|\cdot|$, we can express this as $$\|m(x,y)\|_\infty \leq 1. \quad (10A)$$

In case of the incoherent illumination $$I(x,y) = h(x,y)^{2*}(m(x,y)m^*(x,y)) \quad (12A)$$

the discrete version of (9A,10A) is a linear programming (LP) problem for the square amplitude $p_i = m_i m_i^*$ of the mask pixels, and was addressed by the "branch and bound" algorithm. When partially coherent optics (4A) is considered, the problem is complicated by the interactions $m_i m_j^*$ between pixels and becomes a quadratic programming (QP) problem. Liu [18] applied simulated annealing to solve it. Consequently, Liu and Zakhor made important contributions to the understanding of the problem. They showed that it belongs to the class of the constrained optimization problems and should be addressed as such. Reduction to LP is possible; however, the leanest relevant to microlithography and rigorous formulation must account for the partial coherence, so that the problem is intrinsically not simpler than QP. New solution methods, more sophisticated than the "pixel flipping", have also been introduced.

The first pixel-based pattern optimization software package was developed by Y.-H. Oh, J-C Lee, and S. Lim [24], and called OPERA, which stands for "Optical Proximity Effect Reducing Algorithm." The optimization objective is loosely defined as "the difference between the aerial image and the goal image," so we assume that some variant of (7A) is optimized. The solution method is a random "pixel flipping", which was first tried in [32]. Despite the simplicity of this algorithm, it can be made adequately efficient if image intensity can be quickly calculated when one pixel is flipped. The drawback is that pixel flipping can easily get stuck in the local minima, especially for PSM optimizations. In addition, the resulting patterns often have numerous disjoined pixels, so they have to be smoothed, or otherwise post-processed, to be manufacturable [23]. Despite these drawbacks, it has been experimentally proven in [17] that the resulting masks can be manufactured and indeed improve image resolution.

The study [28] of Rosenbluth, A., et al., considered mask optimization as a part of the combined source/mask inverse problem. Rosenbluth indicates important fundamental properties of inverse mask problems, such as non-convexity, which causes multiple local minima The solution algorithm is designed to avoid local minima and is presented as an elaborate plan of sequentially solving several intermediate problems.

Inspired by the Rosenbluth paper and based on his dissertation and the SOCS decomposition [3], Socha delineated the interference mapping technique [34] to optimize contact hole patterns. The objective is to maximize sum of the electrical fields A in the centers $(x_k, y_k)$ of the contacts $k=1 \ldots N$:

$$F_B[m(x,y)] = -\sum_k A(x_k, y_k) \to \min. \tag{13A}$$

Here we have to guess the correct sign for each $A(x_k, y_k)$, because the beneficial amplitude is either a large positive or a large negative number ([34] uses all positive numbers, so that the larger A the better). When kernel h of (7A) is real (which is true for the unaberrated clear pupil), A and $F_B$ are also real-valued under approximation (7A) and for the real mask m. By substituting (7A) into (13A), we get $$-\sum_k A(x_k, y_k) = -\sum_k (h*m)\Big|_{x=x_k, y=y_k} \tag{14A}$$
$$= \sum_k (h*m) \cdot \delta(x-x_k, x-x_k) =$$
$$= -(h*m) \cdot \left(\sum_k \delta(x-x_k, x-x_k)\right),$$

where the dot denotes an inner product $f \cdot g = \iint fg \, dx \, dy$. Using the following relationship between the inner product, convolution*, and cross-correlation∘ of real functions $$(f*g) \cdot p = f \cdot (g \circ p), \tag{15A}$$

we can simplify (14A) to $$-\sum_k A(x_k, y_k) = -\left(h \circ \sum_k \delta(x-x_k, x-x_k)\right) \cdot m = -G_b \cdot m, \tag{16A}$$

where function $G_I$ is the interference map [34]. With (16A) the problem (13A) can be treated as LP with simple bounds (as defined in [8]) for the mask pixel vector $m = \{m_i\}$ $$-G_b \cdot m \to \min$$

$$-1 \leq m_i \leq 1. \tag{17A}$$

In an innovative approach to the joined mask/source optimization by Erdmann, A., et al. [4], the authors apply genetic algorithms (GA) to optimize rectangular mask features and parametric source representation. GA can cope with complex non-linear objectives and multiple local minima. It has to be proven though, as for any stochastically based technique that the runtime is acceptable and quality of the solutions is adequate. Here we limit ourselves to the dense formulations and more traditional mathematical methods, so the research direction of [4] and [15] however intriguing is not pertinent to this study.

The first systematic treatment of source optimization appeared in [16]. This was limited to the radially-dependent sources and periodic mask structures, with the Michelson contrast as an optimization objective. Simulated annealing is applied to solve the problem. After this study, parametric [37], contour-based [1], and dense formulations [28], [12], [15] were introduced. In [12], the optimization is reduced to solving a non-negative least square (NNLS) problem, which belongs to the class of the constrained QP problems. The GA optimization was implemented in [15] for the pixelized source, with the objective to maximize image slopes at the important layout cutlines.

Reduction to Linear Problem

The inverse mask problem can be reduced to a linear problem, including traditional LP, using several simplification steps. The first step is to accept coherent approximation (6A, 7A). Second, we have to guess correctly the best complex amplitude $A_{ideal}$ of the electrical field from $$I_{ideal} = A_{ideal} A_{ideal}^*, \tag{18A}$$

where $I_{ideal}$ is the target image. If we consider only the real masks m=Re[m] and real kernels h=Re[h], then from (7A) we conclude that A is real and thus we can set $A_{ideal}$ to be real-valued. From (18A) we get $$A_{ideal} = \pm\sqrt{I_{ideal}}, \tag{19A}$$

which means that $A_{ideal}$ is either +1 or −1 in bright areas of the target, and 0 in dark areas. If the ideal image has Al bright pixels, the number of possible "pixel phase assignments" is exponentially large $2^M$. This can lead to the phase-edges in wrong places, but of course can be avoided by assigning the same value to all pixels within a bright feature: for N bright features we get $2^N$ different guesses. After we choose one of these combinations and substitute it as $A_{ideal}$ into (7A), we have to solve $$A_{ideal}(x,y) = \sqrt{\lambda} h(x,y) * m(x,y) \tag{20A}$$

for m. This is a deconvolution problem. Within the zoo of deconvolution algorithms, we demonstrate Weiner filtering, which solves (20A) in some least square sense. After applying Fourier transformation F[ . . . ] to (20A) and using convolution theorem F[h*m]=F[h]F[m], we get $$\hat{m} = \frac{\hat{A}_{ideal}}{\sqrt{\lambda}\hat{h}} = \hat{A}_{ideal} \frac{\hat{h}^*}{\sqrt{\lambda}|\hat{h}|^2}, \tag{21A}$$

where the circumflex denotes Fourier transforms: $\hat{m}=F[m]$, $\hat{h}=F[h]$. The Wiener filter is a modification of (21A) where a relative noise power P is added to the denominator, which helps to avoid division by 0 and suppresses high harmonics:

$$\hat{m} = \hat{A}_{ideal} \frac{\hat{h}^*}{\sqrt{\lambda}|\hat{h}|^2 + P}. \tag{22A}$$

Final mask is found by the inverse Fourier transformation:

$$m = F^{-1}\left[\hat{A}_{ideal}\frac{\hat{h}^*}{\sqrt{\lambda}|\hat{h}|^2 + P}\right]. \quad (23A)$$

As the simplest choice we set P=const>0 to be large enough to satisfy mask constraint (11A). The results are presented in FIGS. 11A-11D. The imaging is simulated for annular 0.7/0.5 optical model with 0.75 NA and 193 nm lambda. The first inset on the left shows contours when mask is the same as target. The space between horizontal lines and L-shape tends to bridge, and the comb structure is pinching. The contour fidelity after deconvolution is much better (right inset)., the bridging and pinching tendencies are gone. The semi-isolated line width is on target. The contrast is also improved, especially for the semi-isolated vertical line. However, the line ends and corner fidelity is not improved. The mask contours after deconvolution are shown in the right bottom inset. Positive transmission is assigned to all main features, which are canvassed with the assist features of negative transmission.

We can also directly solve (2) in the least square sense $$\|\sqrt{\lambda}h(x,y)*m(x,y)-A_{ideal}(x,y)\|\to\min. \quad (24A)$$

In the matrix form $$\|Hm-A_{ideal}\|\to\min$$

$$H_{ij}=\sqrt{\lambda}h_{i-j}. \quad (25A)$$

Matrix H has multiple small eigenvalues. The problem is ill-posed. The standard technique dealing with this is to regularize it by adding norm of the solution to the minimization objective [14]:

$$\|Hm-A_{ideal}\|^2+\alpha\|m\|^2\to\min, \quad (26A)$$

where the regularization parameter α is chosen from secondary considerations. In our case we chose α large enough to achieve $\|m\|_\infty=1$. The problem (26A) belongs to the class of unconstrained convex quadratic optimization problems, with guaranteed unique solution in non-degenerate cases. It can be solved by the methods of linear algebra, because (26) is equivalent to solving $$(H+\alpha I)m=A_{ideal} \quad (27A)$$

by the generalized inversion [12] of the matrix H+αI. The results are presented in FIGS. 12A-12D.

This method delivers pagoda-like corrections to image corners. Some hints of hammer-heads and serifs can be seen in mask contours. Line ends are not corrected. Comparison of contrasts between the case when mask is the same as target show improved contrast, especially between the comb and semi-isolated line.

Further detailing of the problem (26A) is possible by explicitly adding mask constrains, that is we solve $$\|Hm-A_{ideal}\|^2+\alpha\|m\|^2\to\min$$

$$\|m\|_\infty\leq 1, \quad (28A)$$

This is a constrained quadratic optimization problem. It is convex as any linear least square problem with simple bounds. Convexity guarantees that any local minimizer is global, so that the solution method is not consequential: all proper solvers converge to the same (global) solution. We used MATLAB routine lsqlin to solve (29A). The results are presented in FIGS. 13A-13D. This solution has better contrast than the two previous ones, with more complex structure of the assist features.

Any linear functional of A is also linear by m, in particular we can form a linear objective by integrating A over some parts of the layout, as in (13A). One of the reasonable objectives to be formed by such procedure is the sum of electrical amplitudes through the region B, which consists of the all or some parts of the bright areas:

$$F_B[m(x,y)] = -\int\int_B A(x,y)dxdy \to \min, \quad (28B)$$

that is we try to make bright areas as bright as possible. Using the same mathematical trick as in (14A), this is reduced to the linear objective $$-G_b\cdot m\to\min, \quad (29A)$$

where $G_b=h\circ b$, and b is a characteristic function of the bright areas. This seems to work well as the basis for the contact optimizations. It is harder to form region B for other layers. If we follow suggestion [4] to use centers of the lines, then light through the corners becomes dominant, spills over to the dark areas, and damages image fidelity. This suggests that we have to keep dark areas under control as well. Using constraints similar to (4A), we can require for each dark pixel to be of the limited brightness θ

$$x,y\in D: -\theta\leq A(x,y)\leq\theta, \quad (30A)$$

or in the discrete form $$-\theta\leq H_d m\leq\theta. \quad (30B)$$

where $H_d$ is matrix H without rows correspondent to the bright regions. Though equations (28A) and (30B) form a typical constrained LP problem, MATLAB simplex and interior point algorithms failed to converge, perhaps because the matrix of constraints has large null-space.

The linearization (7A) can be augmented by the threshold operator to model the resist response. This leads to Nashold projections [22]. Nashold projections belong to the class of the image restoration techniques, rather than to the image optimizations, meaning that the method might not find the solution (because it does not exists at all), or in the case when it does converge, we cannot state that this solution is the best possible. It has been noted in [20] that the solutions depend on the initial guess and do not deliver the best phase assignment unless the algorithm is steered to it by a good initial guess. Moreover, if the initial guess has all phases set to 0, then so has the solution.

Nashold projections are based on Gerchberg-Saxton [7] phase retrieval algorithm. It updates a current mask iterate $m^k$ via $$m^{k+1}=(P_m P_s)m^k, \quad (31A)$$

where $P_s$ is a projection operator into the frequency support of the kernel h, and $P_m$ is a projection operator that forces the thresholding (4A). Gerchberg-Saxton iterations tend to stagnate. Fienap [5] proposed basic input-output (BIO) and hybrid input-output (HIO) variations that are less likely to be stuck in the local minima These variations can be generalized in the expression $$m^{k+1}=(P_m P_s+\alpha(\gamma(P_m P_s-P_s)-P_m+I)m^k, \quad (32A)$$

where I is an identity operator; α=1,γ=0 for BIO, α=1,γ=1 for HIO, and α=0,γ=0 for the Gerchberg-Saxton algorithm.

We implemented operator $P_m$ as a projection onto the ideal image $$P_m m^k = \frac{m^k}{|m^k|} \sqrt{I_{ideal}}, \qquad (33A)$$

and $P_s$ as a projection to the domain of the kernel h, i.e. $P_s$ zeros out all frequencies of $\hat{m}$ which are high than the frequencies of the kernel h. The iterates (32A) are very sensitive to the values of its parameters and the shape of ideal image. We were able to find solutions only when the ideal image is smoothed. We used Gaussian kernel with the diffusion length of 28 nm, which is slightly larger than the pixel size 20 nm in our examples. The behavior of iterates (32A) is not yet sufficiently understood [36], which complicates choice of $\alpha, \gamma$. We found that in our examples the convergence is achieved for $\alpha=0.9, \gamma=1$ after 5000 iterations. When $\alpha=0, \gamma=0$, which corresponds to (31), the iterations quickly stagnate converging to a non-printable mask.

As shown in FIG. 1B, Nashold projections assign alternating phases to the main features and insert assists between lines. The lines widths are on-target, but line-ends are not corrected. The solution has very good contrast. When projections stagnate, the phases alternate along the lines. This "phase entanglement" can sometimes happen in the non-linear problems (considered in a section below) when their iterations start from the random pixel assignments.

Quadratic Problems

In the quadratic formulations of the inverse problems, the coherent linearization (6A) is not necessarily. We can directly use bilinear integral (5A). Our goal here is to construct an objective function as is a quadratic form of mask pixels. We start with (8A) and replace Euclidean norm (norm 2) with Manhattan norm (norm 1):

$$F_I[m(x,y)] = \|I(x,y) - I_{ideal}(x,y)\|_1 \to \min. \qquad (34A)$$

The next step is to assume that the ideal image is sharp, 0 in dark regions and 1 in bright regions, so that $I(x,y) \geq I_{ideal}(x,y)$ in the dark regions and $I(x,y) \leq I_{ideal}(x,y)$ in the bright regions. This lets us to remove the module operation from the integral (34A):

$$\|I(x,y) - I_{ideal}(x,y)\|_1 = \iint |I - I_{ideal}| dx dy = \iint w(x,y)(I(x,y) - I_{ideal}(x,y)) dx dy, \qquad (35A)$$

where w(x,y) is 1 in dark regions and −1 in bright regions. Finally we can ignore the constant term in (35A), which leads to the objective $$F_w[m(x,y)] = \iint w I(x,y) \to \min. \qquad (36A)$$

The weighting function w can be generalized to have any positive value in dark regions, any negative value in bright regions, and 0 in the regions which we choose to ignore. Proper choice of this function covers the image slope objective (9A), but not the threshold objective (1A). Informally speaking, we seek to make bright regions as bright as possible, and dark regions as dark as possible. Substituting (5A) into (36A), we get $$\iint w I(x,y) dx dy = \iiiint Q(x_1,y_1,x_2,y_2) m(x_1,y_1) m^*(x_2,y_2) dx_1 dx_2 dy_1 dy_2, \qquad (37A)$$

Where $$Q(x_1,y_1,x_2,y_2) = \iint w(x,y) q(x-x_1, x-x_2, y-y_1, y-y_2) dx dy. \qquad (38A)$$

Discretization of (37A) results to the following constrained QP $$F_w[m] = m^* Q m \to \min$$

$$\|m\|_\infty \leq 1. \qquad (39A)$$

The complexity of this problem depends on the eigenvalues of matrix Q. When all eigenvalues are non-negative, then it is convex QP and any local minimizer is global. This is a very nice property, because we can use any of the numerous QP algorithms to find the global solution and do not have to worry about local minima Moreover, it is well known that the convex QP can be solved in polynomial time. The next case is when all eigenvalues are non-positive, a concave QP. If we remove constraints, the problem becomes unbounded (no solutions). This means that the constraints play a decisive role: all solutions, either local or global, end up at some vertex of the box $\|m\|_\infty \leq 1$. In the worst case scenario, the solver has to visit all vertices to find the global solution, which means that the problem is NP-complete, i.e., it may take an exponential amount of time to arrive at the global minima. The last case is an indefinite QP when both positive and negative eigenvalues are present. This is the most complex and the most intractable case. An indefinite QP can have multiple minima, all lie on the boundary.

We conjecture that the problem (39A) belongs to the class of indefinite QP. Consider the case of the ideal coherent imaging, when Q is a diagonal matrix. Vector w lies along its diagonal. This means that eigenvalues $\mu_1, \mu_2 \ldots$ of Q are the same as components of the vector w, which are positive for dark pixels and negative for bright pixels. If there is at least one dark and one bright pixel, the problem is indefinite. Another consideration is that if we assume that (39A) is convex, then the stationary internal point m=0 where the gradient is zero $$\frac{d F_w[m]}{dm} = 2Qm = 0 \qquad (40A)$$

is the only solution, which is a trivial case of mask being dark. This means that (39) is either has trivial (global) solution, or it is non-convex.

Related to (39) QP was considered by Rosenbluth [28]:

$$m^* Q_d m \to \min$$

$$m^* Q_b m \geq b, \qquad (41A)$$

where $Q_d$ and $Q_b$ deliver average intensities in bright and dark regions correspondingly. The objective is to keep dark regions as dark as possible while maintaining average intensity not worse than some value b in bright areas. Though the problem was stated for the special case of the off-centered point-source, the structure of (41A) is very similar to (39A). Using Lagrange multipliers, we can convert (41A) to $$m^* (Q_d - \lambda Q_b) m \to \min$$

$$\|m\|_\infty \leq 1,$$

$$\lambda \geq 0 \qquad (42A)$$

which is similar to (39A).

Another metric of the complexity of (39A) is number of the variables, i.e., the pixels in the area of interest. According to Gould [10], the problems with order of 100 variables are small, more than $10^3$ are large, and more than $10^5$ are huge. Considering that the maskless lithography can control transmission of the 30 nm by 30 nm pixel [31], the QP (39A) is large for the areas larger than 1 um by 1 um, and is huge for the areas lager than 10 um by 10 um. This has important implications for the type of the applicable numerical methods: in large problems we can use factorizations of matrix Q, in huge problems factorizations are unrealistic.

For the large problems, when factorization is still feasible, a dramatic simplification is possible by replacing the infinity norm by the Euclidean norm in the constraint of (39A), which results in $$F_w[m] = m^*Qm \to \min$$

$$\|m\|_2 \leq 1. \tag{43A}$$

Here we search for the minimum inside a hyper-sphere versus a hyper-cube in (39A). This seemingly minor fix carries the problem out of the class of NP-complete to P (the class of problems that can be solved in polynomial time). It has been shown in [35] that we can find global minima of (43A) using linear algebra. This result served as a base for the computational algorithm [1] which specifically addresses indefinite QP.

The problem (43A) has the following physical meaning: we optimize the balance of making bright regions as bright as possible and dark regions as dark as possible while limiting light energy $\|m\|_2^2$ coming through the mask. To solve this problem, we use procedures outlined in [31, 32]. First we form Lagrangian function of (43A)

$$L(m,\lambda) = m^*Qm + \lambda(\|m\|^2 - 1). \tag{44A}$$

From here we deduce the first order necessary optimality conditions of Karush-Kuhn-Tucker (or KKT conditions, [20]):

$$2(Q+\lambda I)m = 0$$

$$\lambda(\|m\|-1) = 0$$

$$\lambda \geq 0$$

$$\|m\| \leq 1. \tag{45A}$$

Using Sorensen [35], we can state what that (43A) has a global solution if we can find such $\lambda$ and $m$ that (45A) is satisfied and the matrix $Q+\lambda I$ is positive semidefinite or positively defined. Let us find this solution.

First we notice that we have to choose $\lambda$ A large enough to compensate the smallest (negative) eigenvalue of Q, i.e.

$$\lambda \geq |\mu_1| > 0. \tag{46A}$$

From the second condition in (45A) we conclude that $\|m\|=1$, that is the solution lies on the surface of hyper-sphere and not inside it. The last equation to be satisfied is the first one from (45A). It has a non-trivial $\|m\|>0$ solution only when the lagrange multiplier $\lambda$ equals to a negative of one of the eigenvalues $\lambda = -\mu_i$. This condition and (46A) has a unique solution $\lambda = -\mu_1$, because other eigenvalues $\mu_2, \mu_3, \ldots$ are either positive so that $\lambda \geq 0$ does not hold, or they are negative, but with absolute value that is smaller than $\mu_1$, so that $\lambda \geq |\mu_1|$ does not hold.

After we determined that $\lambda = -\mu_1$, we can find m from $2(Q-\mu_1 I)m = 0$ as the corresponding eigenvector $m = v_1$. This automatically satisfies $\|m\|=1$, because all eigenvectors are normalized to have a unit length. We conclude that (43A) has a global solution which corresponds to the smallest negative eigenvalue of Q. This solution is a good candidate for a starting point in solving (39A): we start from the surface of the hyper-sphere and proceed with some local minimization technique to the surface of the hyper-cube.

As we have shown, the minimum eigenvalue of Q and its eigenvector play special role in the problem by defining the global minimum. However, other negative eigenvectors are also important, because it is easy to see that any pair $$\lambda = -\mu_i > 0$$

$$m = v_i \tag{47A}$$

is a KKT point and as such defines a local minimum. The problem has as many local minima as negative eigenvalues. We may also consider starting our numerical minimization from one of these "good" minima, because it is possible that a local minimum leads to a better solution in the hyper-cube than a global minimum of the spherical problem.

FIGS. 2A, 2B and 2C show three strongest local minima of the problem (39A) for the structure of FIG. 1B. These local minima point to the beneficial interactions between layout features, suggesting alternating phase assignments. For example, the second solution suggests that the L-shape transmission should be chosen positive, while the comb has negative transmission, the dense vertical line of the comb has positive transmission, and the second horizontal line has negative transmission.

Results of the similar analysis for the case of the contact holes are displayed in FIGS. 3B, 3C and 3D. These results are much stronger, and can be used directly in applications. The method "proposes" beneficial phases for the contacts and position and phases of the assists. The most interesting solution is shown in the low right inset, where all contacts have well-defined transmissions, with 3 contacts positive and 4 contacts negative. The advantages of this method comparing to with IML [3] is that this method automatically finds the best phases of the contacts and is not based of the coherent approximation.

FIGS. 3A-3D shows the first three local minima for QP on a hyper-sphere for the contact holes and process conditions from Socha [3]. The third solution has the clearest phase assignments and the position of assists.

For the positive masks, in particular for the binary masks, the constraint can be tightened to $\|m-0.5\|_\infty \leq 0.5$. Then the correspondent to (39A) problem is $$F_w[m] = m^*Qm \to \min$$

$$\|m-0.5\|_\infty \leq 0.5. \tag{48A}$$

This is also an indefinite QP and is NP-complete. Replacing here infinity norm with Euclidean norm, we get a simpler problem $$m^*Qm \to \min$$

$$\|\Delta m\|_2 \leq 0.5$$

$$\Delta m = m - m_0, m_0 = \{0.5, 0.5, \ldots, 0.5\}. \tag{49A}$$

The Lagrangian can be written as $$L(m,\lambda) = m^*Qm + \lambda(\|m-m_0\|^2 - 0.25). \tag{50A}$$

The KKT point must be found from the following conditions $$(Q+\lambda I)\Delta m = -Qm_0$$

$$\lambda(\|\Delta m\|^2 - 0.25) = 0$$

$$\lambda \geq 0$$

$$\|\Delta m\| \leq 0.5. \tag{51A}$$

This is more complex problem than (45A) because the first equation is not homogeneous and the pairs $\lambda = -\mu_i, \Delta m = v_i$ are clearly not the solutions. We can still apply the condition of the global minimum $\lambda \geq -\mu_1 > 0$ (Sorensen [35]). From the second condition we conclude that $\|\Delta m\|^2 = 0.25$, meaning that all solutions lie on the hyper-sphere with the center at $m_0$. The case $\lambda = -\mu_1$ is eliminated because the first equation is not homogeneous, so that we have to consider only $\lambda > -\mu_1$. Then $Q+\lambda I$ is non-singular, we can invert it, and find the solution $$\Delta m = -(Q+\lambda I)^{-1}Qm_0. \tag{52A}$$

The last step is to find the lagrange multiplier λ that satisfy the constraint $\|\Delta m\|^2=0.25$, that is we have to solve $$\|(Q+\lambda I)^{-1} Q m_0\|=0.5. \tag{53A}$$

This norm monotonically increases from 0 to infinity in the interval $-\infty<\lambda<-\mu_1$, thus (53A) has to have exactly one solution in this interval. The pair λ, Δm that solves (52A-53A) is a global solution of (49A). We conjecture that there are fewer KKT points of local minima of (49A) than in (45A) (may be there are none), but this remains to be proven by analyzing behavior of the norm (53A) when lagrange multiplier is between negative eigenvalues. The solutions of (49A) show how to insert assist features when all contacts have the same phases.

General Non-Linear Problems

Consider objective (8A) of image fidelity error $$F_I[m(x,y)]=\|I(x,y)-I_{ideal}(x,y)\| \to \min. \tag{54A}$$

We can state this in different norms, Manhattan, infinity, Euclidean, etc. The simplest case is a Euclidean norm, because (54A) becomes a polynomial of the forth degree (quartic polynomial) of mask pixels. The objective function is very smooth in this case, which ease application of the gradient-descent methods. While theory of QP is well developed, the polynomial optimization is an area of growing research interest, in particular for quartic polynomials [27].

We can generalize (54A) by introducing weighting $w=w(x,y)$ to emphasize important layout targets and consider smoothing in Sobolev norms as in [12]:

$$F_w[m(x,y)]^2 = \\ \|\sqrt{w}\cdot(I-I_{ideal})\|_2^2 + \alpha_1\|L_1 m\|_2^2 + \alpha_2\|L_2 m\|_2^2 + \alpha_3\|m-m_0\|_2^2 \to \min. \tag{55A}$$

where $L_1$, $L_2$ are the operators of first and second derivatives, $m_0=m_0(x,y)$ is some preferred mask configuration that we want to be close to (for example, the target), and $\alpha_1, \alpha_2, \alpha_3$ are smoothing weights. The solutions of (55A) increase image fidelity; however, the numerical experiments show that the contour fidelity of the images is not adequate. To address, we explicitly add (1A) into (55A):

$$F_{wc}[m]^2 = \|\sqrt{w}\cdot(I-I_{ideal})\|_2^2 + \oint_C (I-\theta)^n dl + \tag{56A}$$
$$\alpha_1\|L_1 m\|_2^2 + \alpha_2\|L_2 m\|_2^2 + \alpha_3\|m-m_0\|_2^2 \to \min.$$

If the desired output is a two-, tri-, any other multi-level tone mask, we can add penalty for the masks with wrong transmissions. The simplest form of the penalty is a polynomial expression, so for example for the tri-tone Levenson-type masks with transmissions −1, 0, and 1, we construct the objective as $$F_{wce}[m]^2 = \tag{57A}$$
$$\|\sqrt{w}\cdot(I-I_{ideal})\|_2^2 + \oint_C(I-\theta)^n dl + +\alpha_1\|L_1 m\|_2^2 + \alpha_2\|L_2 m\|_2^2 +$$
$$\alpha_3\|m-m_0\|_2^2 + +\alpha_4\|(m+e)m(m-e)\|_2^2\|m\|_\infty \le 1 \to \min,$$

where e is a one-vector. Despite all the complications, the objective function is still a polynomial of the mask pixels. To optimize for the focus depth, the optimization of (57A) can be conducted off-focus, as was suggested in [16, 12]. After discretization, (55A) becomes a non-linear programming problem with simple bounds.

We expect that this problem inherits property of having multiple minima from the corresponding simpler QP, though smoothing operators of (57A) have to increase convexity of the objective. In the presence of multiple local minima the solution method and staring point are highly consequential: some solvers tend to converge to the "bad" local solutions with disjoined masks pixels and entangled phases, others better navigate solution space and chose smoother local minima The Newton-type algorithms, which rely on the information about second derivatives, should be used with a caution, because in the presence of concavity in (57A), the Newtonian direction may not be a descent direction. The branch-and-bound global search techniques [18] are not the right choice because they are not well-suited for the large multi-dimensional optimization problems. Application of stochastic techniques of simulated annealing [24] or GA [4] seems to be an overkill, because the objective is smooth. It is also tempting to perform non-linear transformation of the variables to get rid of the constraints and convert problem to the unconstrained case, for example by using transformation $x_i=\tan h(m_i)$ or $m_i=\sin(x_i)$, however, this generally is not recommended by experts [8, p. 267].

The reasonable choices to solve (57A) are descent algorithms with starting points found from the analytical solutions of the related QP. We apply algorithms of local variations ("one variable at a time"), which is similar in spirit to the pixel flipping [32, 24], and also use a variation of the steepest descent by Frank and Wolfe [21] to solve constrained optimization problems.

In the method of local variation, we chose the step $\Delta_1$ to compare three exploratory transmissions for the pixel i: $m_i^1$, $m_i^1+\Delta_1$, and $m_i^1-\Delta_1$. If one of these values violates constraints, then it is pulled back to the boundary. The best of these three values is accepted. We try all pixels, optionally in random exhaustive or circular order, until no further improvement is possible. Then we reduce step $\Delta_2<\Delta_1$ and repeat the process until the step is deemed sufficiently small. This algorithm is simple to implement. It naturally takes care of the simple (box) constraints and avoids the general problem of other more sophisticated techniques (like Newton), which may converge prematurely to a non-stationary point. This algorithm calculates the objective function numerous times; however, the runtime cost of its exploratory calls is very low with the electrical field caching (see the next section). Other algorithms require fewer but more costly non-exploratory calls. This makes method of local variation a legitimate tool in solving the problem.

Frank and Wolfe method is an iterative algorithm to solve constrain problems. At each step k we calculate the gradient $\nabla F^k$ of the objective and then replace the non-linear objective with its linear approximation. This reduces the problem to LP with simple bounds:

$$\nabla F^k \cdot m \to \min$$
$$\|m\|_\infty \le 1. \tag{59A}$$

The solution of this $m=l^k$ is used to determine the descent direction $$p^k = l^k - m^{k-1}. \tag{60B}$$

Then the line search is performed in the direction of $p^k$ to minimize the objective as a function one variable $\gamma \in [0,1]$:

$$F[m^{k-1}+\gamma p^k] \to \min. \tag{61B}$$

The solution $m^k = m^{k-1}+\gamma p^k$ is accepted as the next iterate. The iterations continue until convergence criteria are met.

Electrical field caching helps to speedup the gradient calculations and line search of this procedure.

Figure 14A:
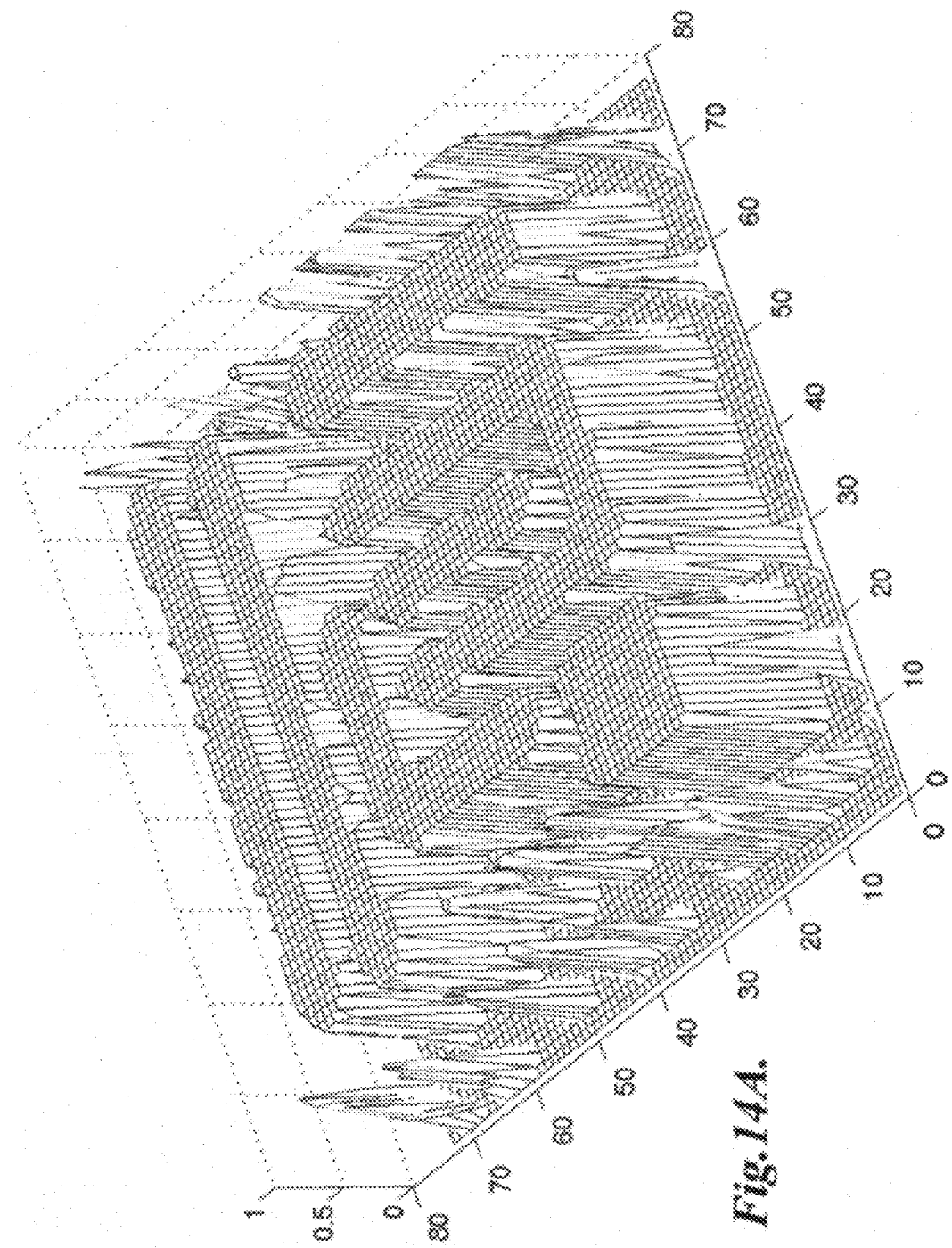
FIGS. 14A-14C illustrate a method of local variations in accordance with an embodiment of the present invention.
Figure 14C:
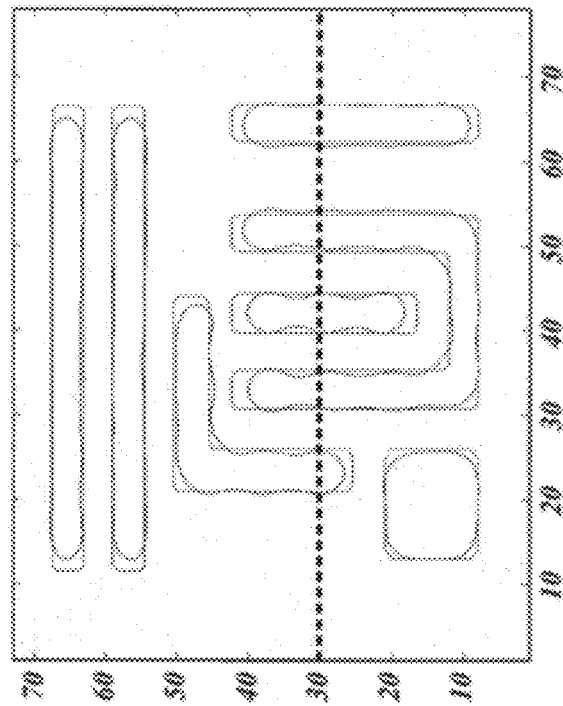
Figure 14B:
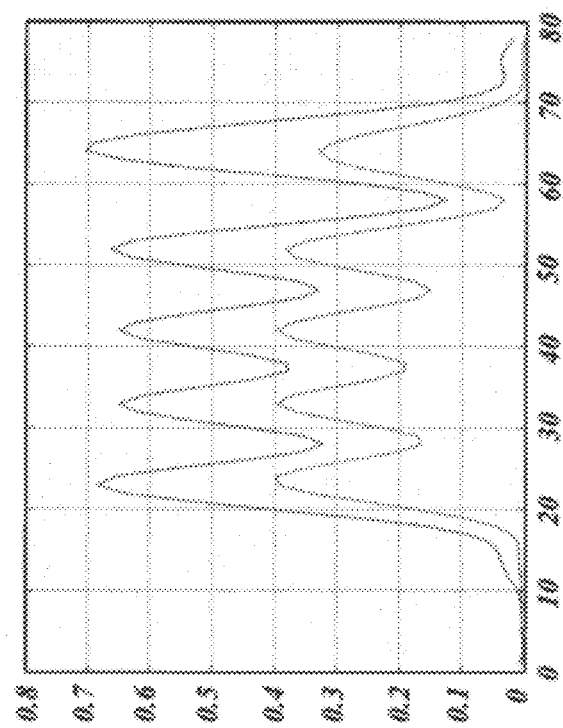

In FIGS. 14A-14C we show results of solving (55A) for the positive mask $0 \leq m \leq 1$. The assist features can be seen around main structures. However, the solution comes up very bright and the contrast is only marginally improved. This is corrected in (56A) with the introduction of the contour fidelity metric. The results are shown in FIGS. 15A-15C.

Figure 15A:
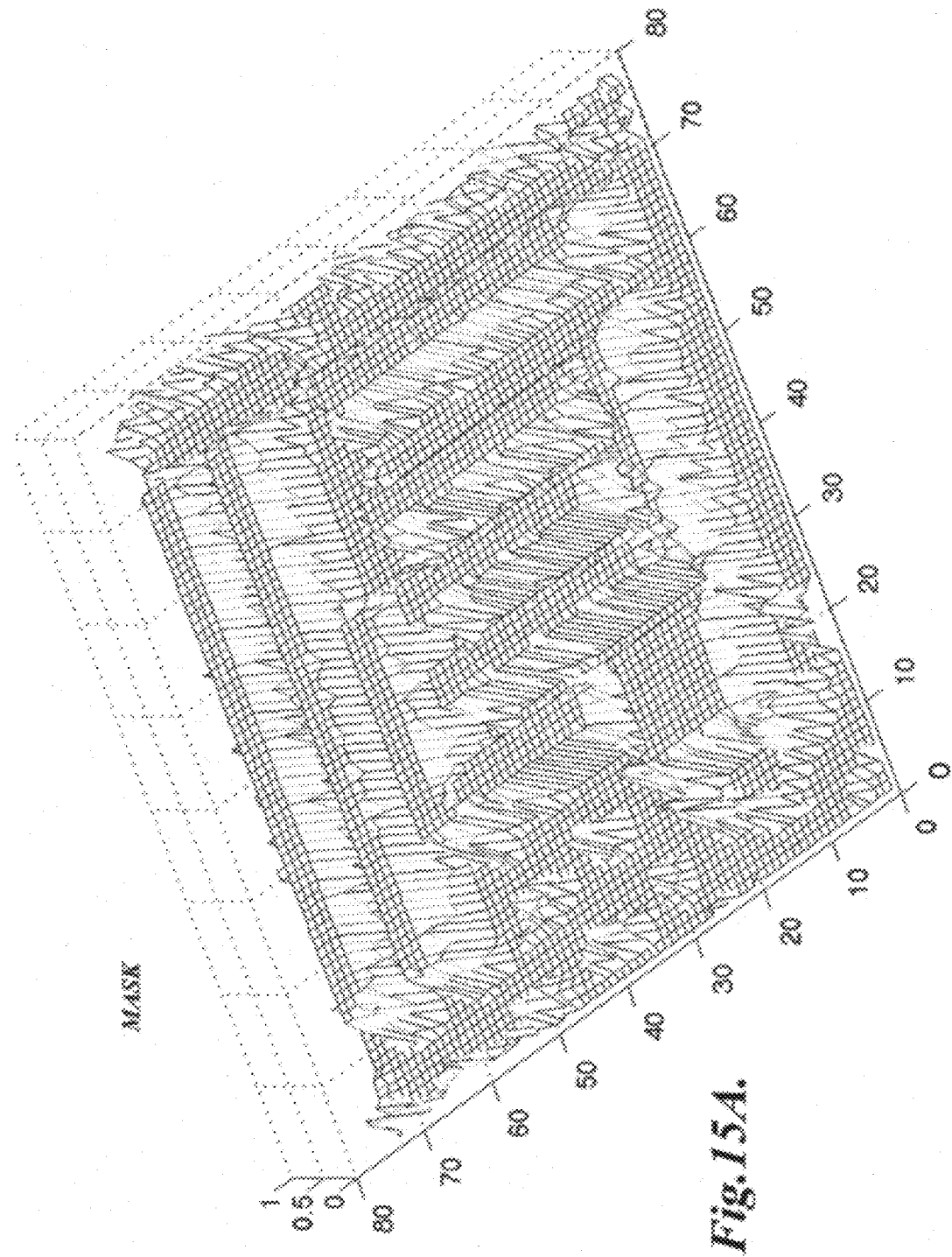
FIGS. 15A-15C illustrate a method of local variations with contour fidelity in accordance with the present invention.
Figure 15C:
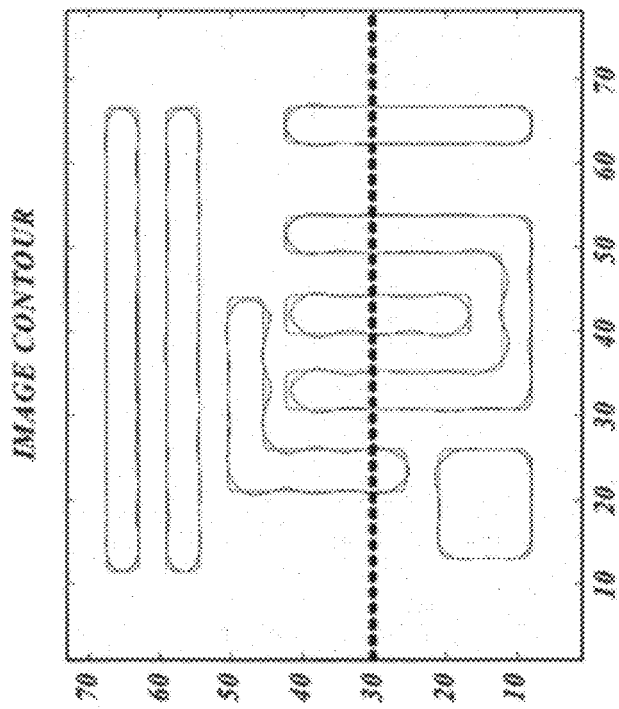
Figure 15B:
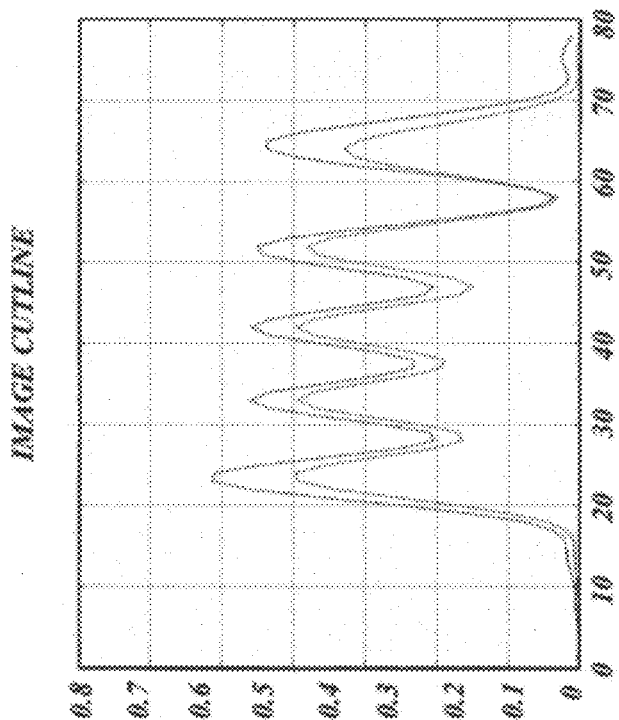

FIGS. 15A-15C illustrates a method of local variations for the objective (57A) with contour fidelity. The contours are on target almost everywhere, including line ends. The image contrast is improved. Mask has rows of assist features and serifs.

Figure 16A:
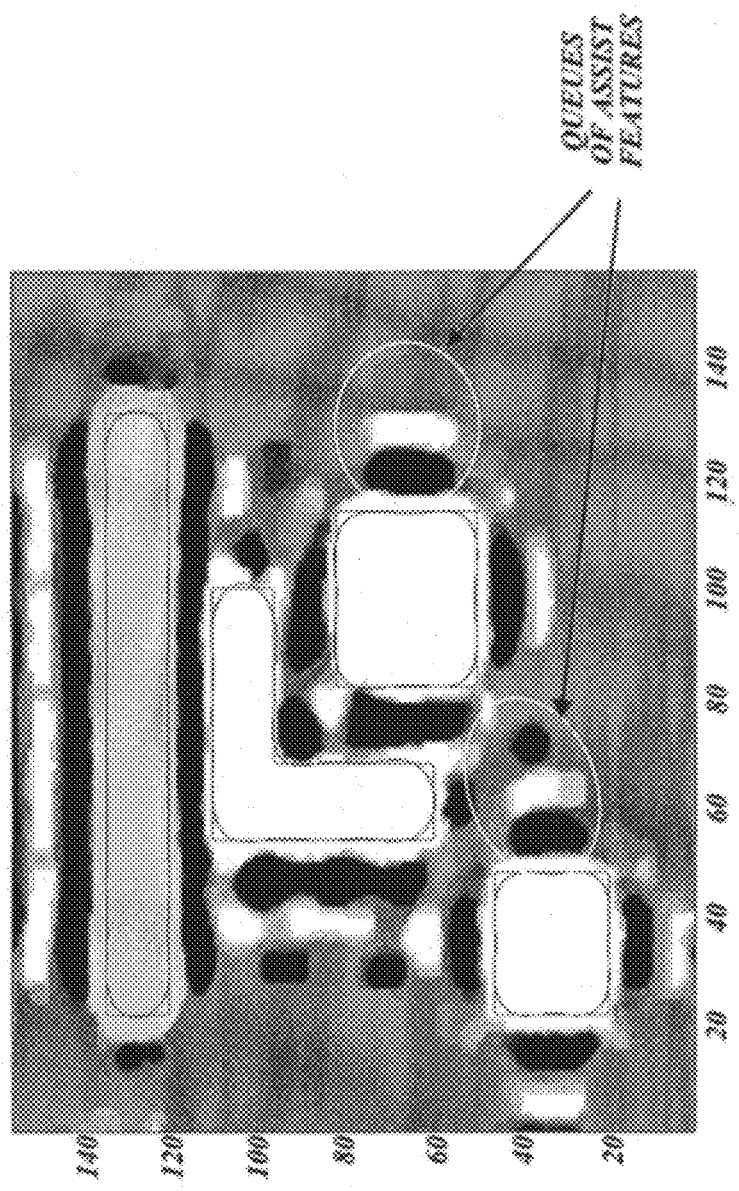
FIG. 16A illustrates a result of a local variations algorithm for a PSM mask in accordance with an embodiment of the present invention.

Result of the local variation algorithm for the PSM mask are shown in FIG. 16A. The contours are on target, except some corner rounding. The main features have the same phase. Each side of the pads and lines is protected by the queue of assist features with alternating phases.

Figure 17A:
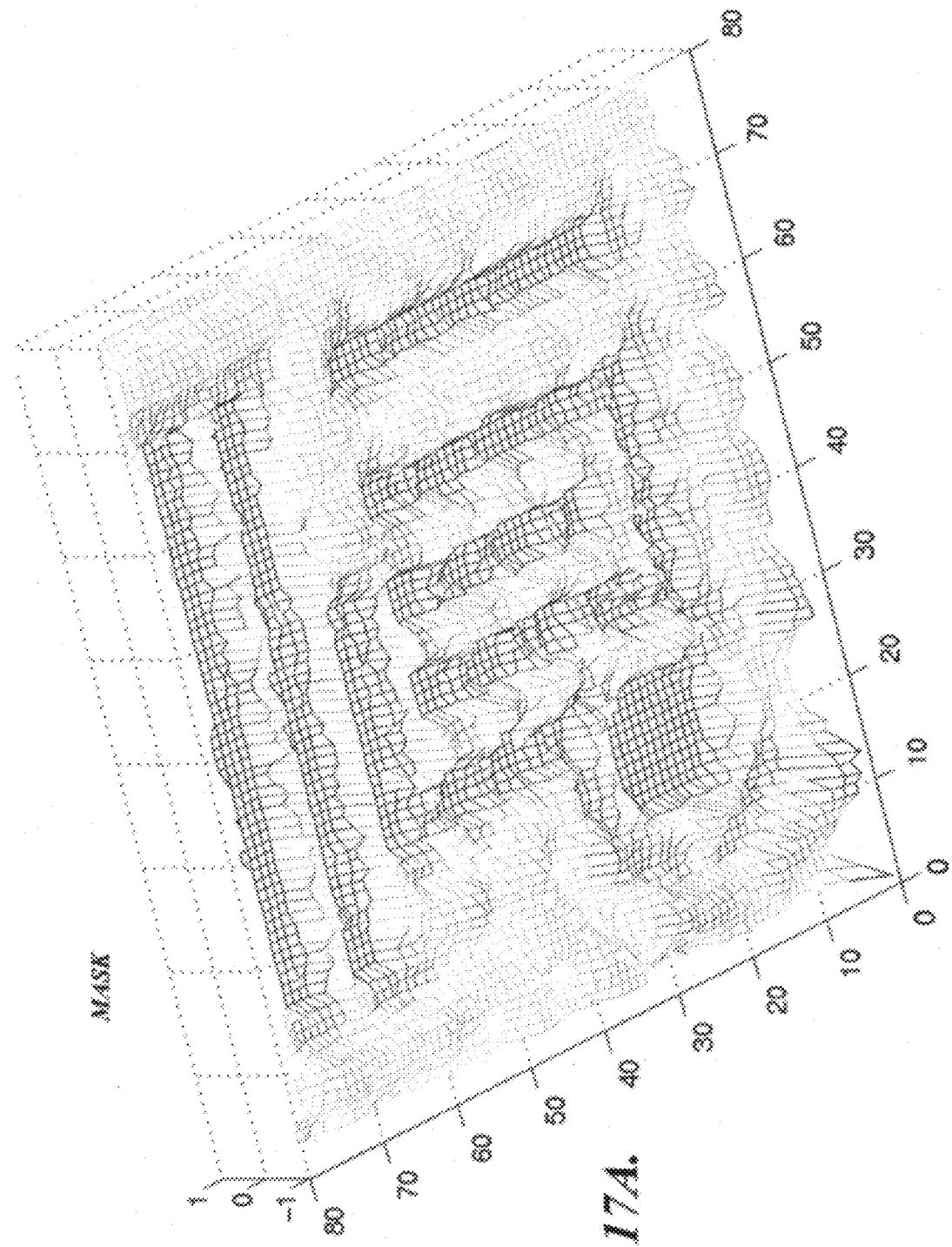
FIGS. 17A-17C illustrate a solution of phase and assist features in accordance with an embodiment of the present invention.
Figure 17C:
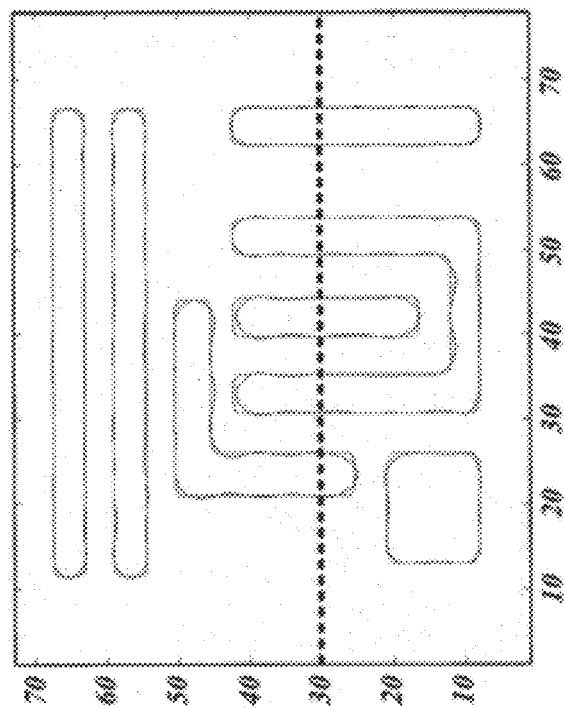
Figure 17B:
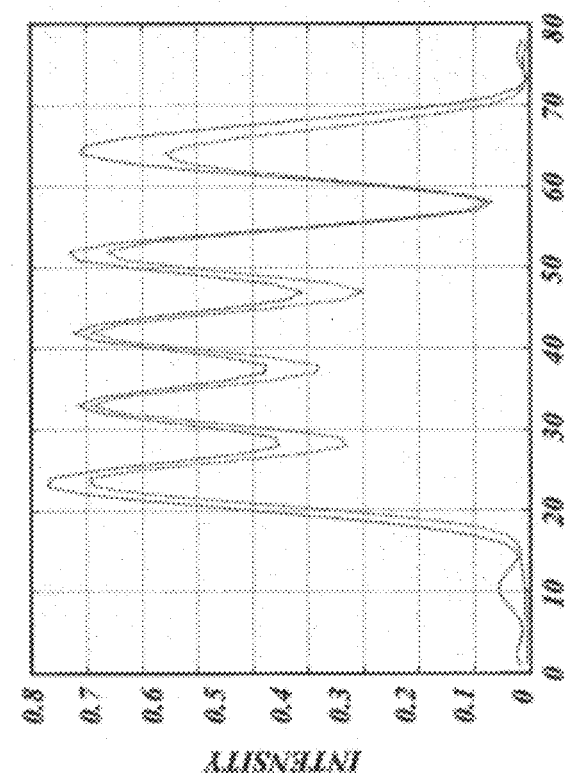
Figure 18A:
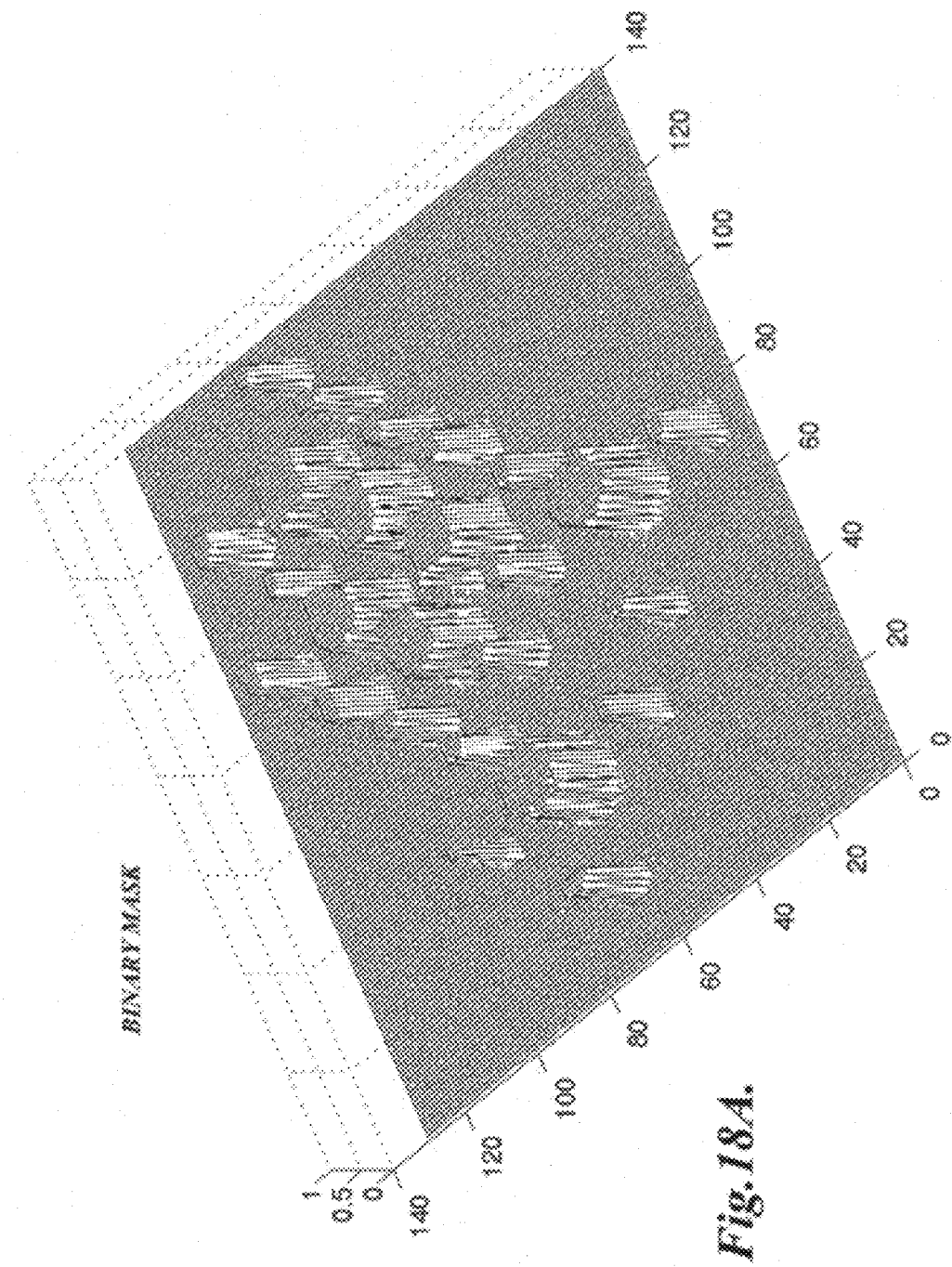
FIGS. 18A-18F illustrate an example of the present invention as applied to contact holes.
Figure 18C:
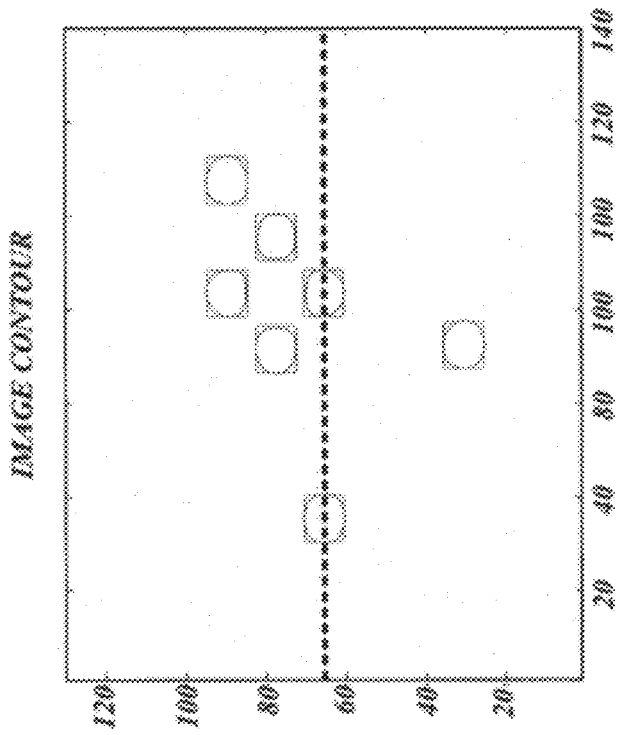
Figure 18B:
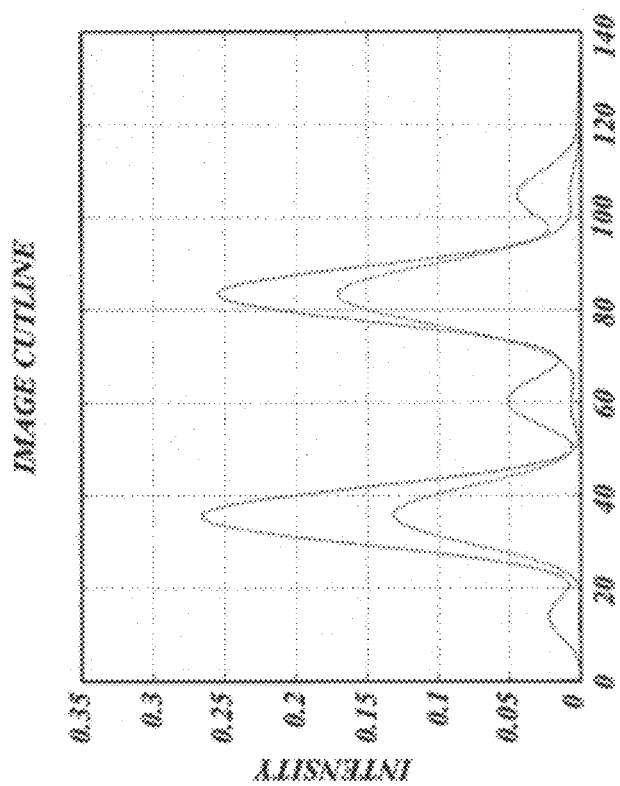
Figure 18D:
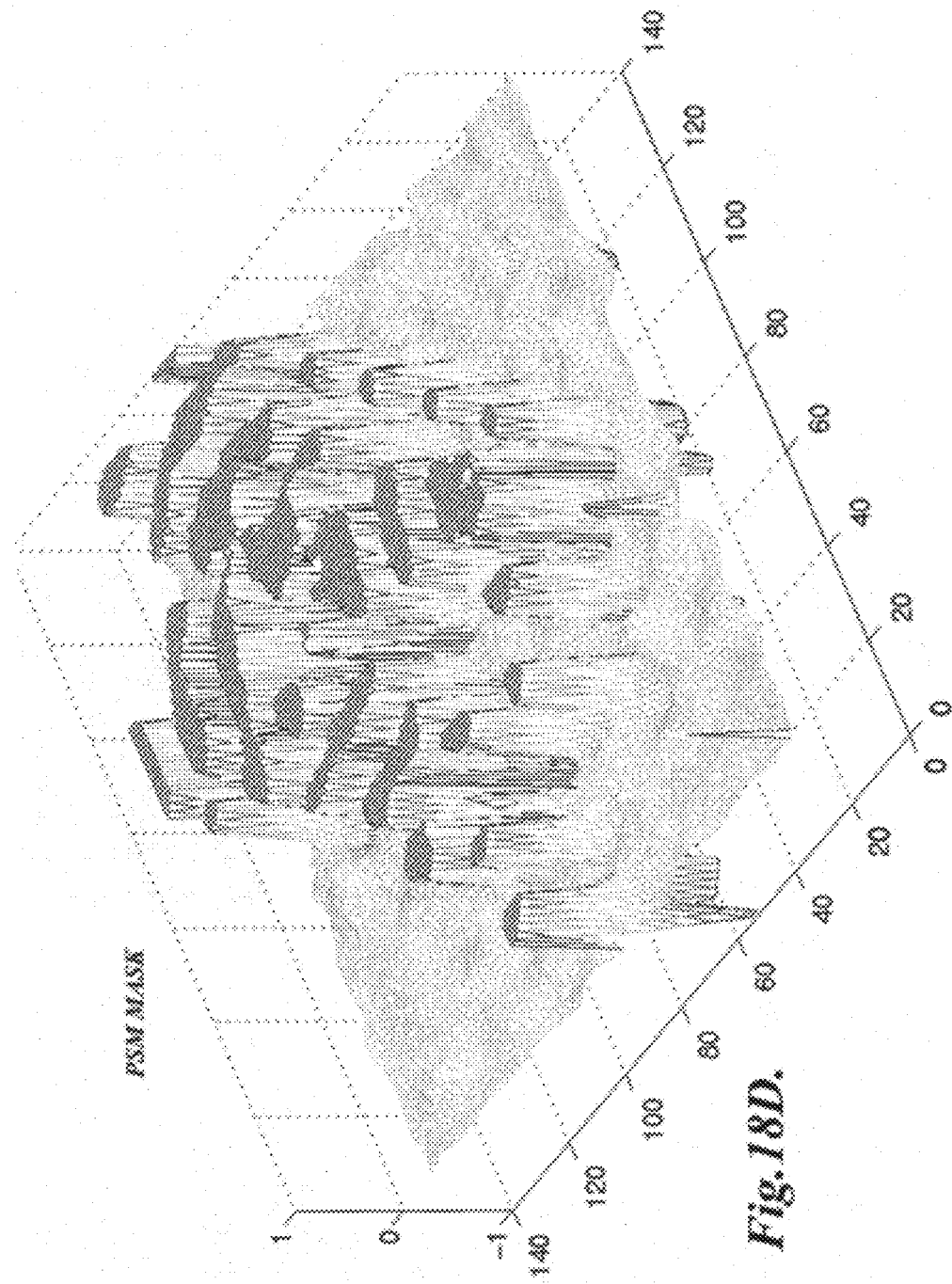
Figure 18F:
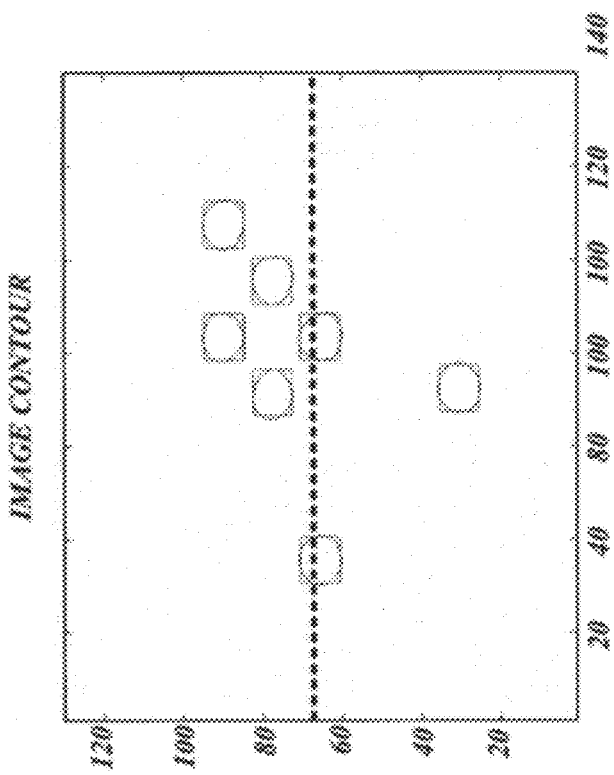
Figure 18E:
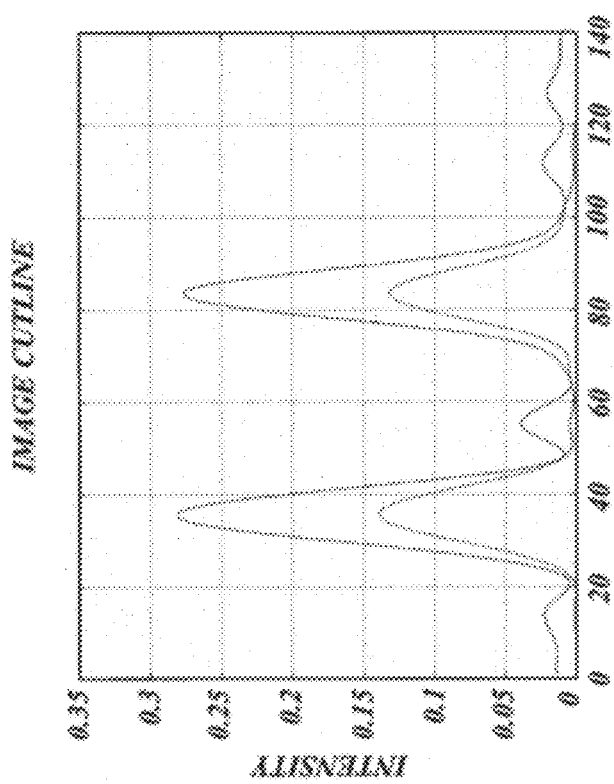

Next example demonstrate solutions when main features have the same phase and assist features can have phase shift, FIGS. 17A-17C. We observe negative transmission of the assists on the mask. The contrast along the cutline is improved in comparison to the ideal case (mask equal target). Contour fidelity is very good, the third inset. The last example is contact holes, FIG. 18. The method is capable of inserting assist contacts and deliver complex interferometric assist features in PSM case.

FIGS. 18A-18F illustrates a contact holes example. First row shows binary mask. Small assist contact holes are inserted around main contacts. The image contrast is compared to the case when mask is the same as target. The contrast is improved significantly. Image contours are on target, the third column. Second row demonstrates PSM mask, with complex structure of assists holes, which are hard to separate from the main features. The contrast is even better than for the binary mask. Despite very complex mask, the contours are on target (lower right inset) and sidelobs do not print.

Electrical Field Caching

The speed of the descent and local variation algorithms critically depends on the ability to quickly re-calculate image intensity when one or a few pixels change. We use electrical field caching procedure to speedup this process.

According to SOCS approximation [3], the image intensity is the following sum of convolutions of kernels $h_i(x,y)$ with the mask $m(x,y)$:

$$I(x, y) = \sum_{i=1}^{N} \lambda_i A_i(x, y) A_i^*(x, y), \quad (60C)$$

$$A_i = h_i(x, y) * m(x, y).$$

Suppose that we know the electrical fields $A_i^0$ for the mask $m^0$ and want to calculate intensity for the slightly different mask m'. Then $$A_i' = A_i^0 + h_i^*(m' - m^0). \quad (61C)$$

These convolutions can be quickly calculated by the direct multiplication, which is $O(d \cdot M \cdot N)$ operation, where d is the number of different pixels between $m^0$ and m', M is pixel count of the kernels, and N is number of kernels. This is faster than convolution by FFT when O(d) is smaller than O(log (H)). Constantly updating the cache $A_i^0$, we can quickly re-calculate intensities for small evolutionary mask changes. Formula (61A) is helpful in gradient calculations, because they alter one pixel at a time.

The additivity of the electrical fields can also be exploited to speedup intensity calculations in the line search (61A). If the mask $m^{k-1}$ delivers electrical fields $A_i^{k-1}$, and the mask $p^k$ delivers $B_i^k$, then the intensity from the mask $m = m^{k-1} + \gamma p^k$ can be quickly calculated through its electrical fields $A_i$:

$$A_i = A_i^{k-1} + \gamma B_i^k. \quad (62A)$$

This avoids expensive convolutions of (60C).

In one embodiment of the invention, the optimization function to be minimized in order to define the optimal mask data has the form $$\text{Min} \sum_i w_i \cdot \| I_i - I_{i_1 \, ideal} \|^2 \quad (64A)$$

where $I_i$=image intensity evaluated at a location on the wafer corresponding to a particular pixel in the mask data. Typically $I_i$ has a value ranging between 1 (full illumination) and $\phi$ (no illumination); $I_{i,ideal}$=the desired image intensity on the wafer at a point corresponding to the pixel and $w_i$=a weighting factor for each pixel.

As indicated above, the ideal image intensity level for any point on the wafer is typically a binary value having an intensity level of 0 for areas where no light is desired on a wafer and 1 where a maximum amount of light is desired on the wafer. However, in some embodiments, a better result can be achieved if the maximum ideal image intensity is set to a value that is determined from experimental results, such as a test pattern for various pitches produced on a wafer with the same photolithographic processing system that will be used to produce the desired layout pattern in question. A better result can also be achieved if the maximum ideal image intensity is set to a value determined by running an image simulation of a test pattern for various pitches, which predicts intensity values that will be produced on a wafer using the photolithographic processing system that will be used in production for the layout pattern in question.

Figure 21:
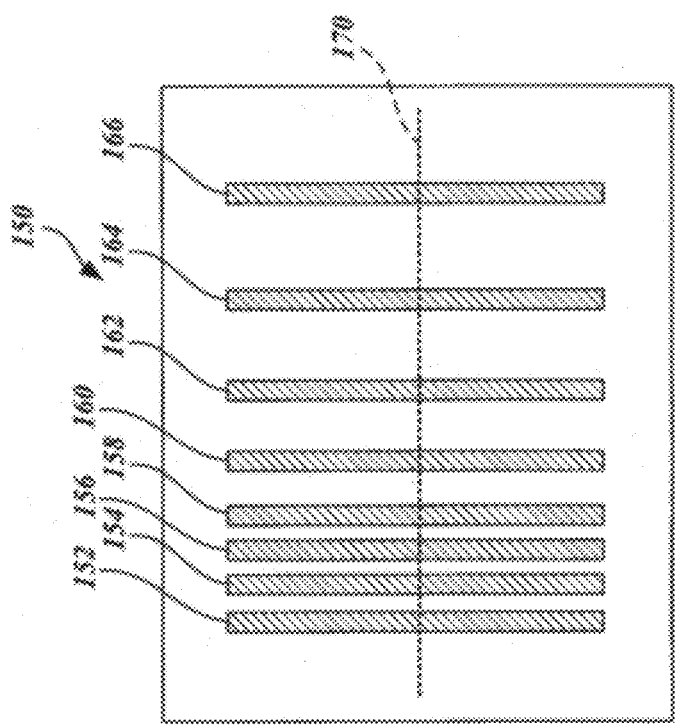
FIG. 21 illustrates one embodiment of a test pattern used to select an ideal intensity threshold in accordance with an embodiment of the present invention.

FIG. 21 illustrates a one example of a test pattern for various pitches 150 having a number of vertically aligned bars 152, 154, 156, . . . 166. As will be appreciated by those skilled in the art, photolithographic processing systems can be characterized by the tightest pattern of features that the system can reliably produce on a wafer. The test pattern for various pitches 150 includes features at this tightest pitch and features that are spaced further apart. In one embodiment of the invention, the maximum ideal image intensity $I_{ideal}$ defined for a point on a wafer is determined by simulating exposure in the photolithographic system using the test pattern 150 and determining the maximum image intensity in the area of the tightest pitch features The minimum ideal image intensity is generally selected to be below the print threshold of the resist materials to be used. Typically, the minimum ideal image intensity is set to zero.

With the maximum ideal image intensity determined using the test pattern 150, the transmission values of the pixels in the mask data that will result in the objective function (64A) being minimized are then determined Once the transmission values of the pixels has been determined, the mask pixel data is converted to a suitable mask writing format, and provided to a mask writer that produces one or masks. In some embodiments, a desired layout is broken into one or more frames and mask pixel data is determined for each of the frames.

Figure 22:
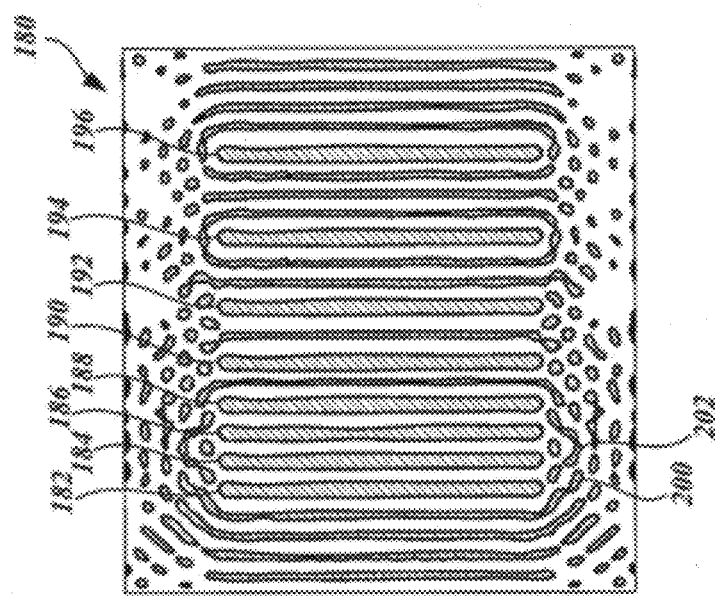
FIG. 22 illustrates one optimized mask data pattern created to produce the test pattern shown in FIG. 21.

FIG. 22 illustrates one example of an optimized mask pattern that will reproduce a desired pattern of features such as the test pattern 150 shown in FIG. 21. The optimized mask data 180 includes a number of larger mask features 182, 184, 186, . . . 196 that, when exposed, will create each of the vertical bars 152-166 in the test pattern. In addition, the optimized data 180 includes a number of additional features 200, 202, etc., surrounding the larger mask features 182-196. The additional features 200, 202 are a result of the mask pixel optimization process described above. In one embodiment of the invention, the additional features 200, 202 are simulated on a mask as subresolution assist features (SRAFs) such that they themselves will not form an image that prints in resist on a wafer when exposed during photolithographic processing.

Figure 23:
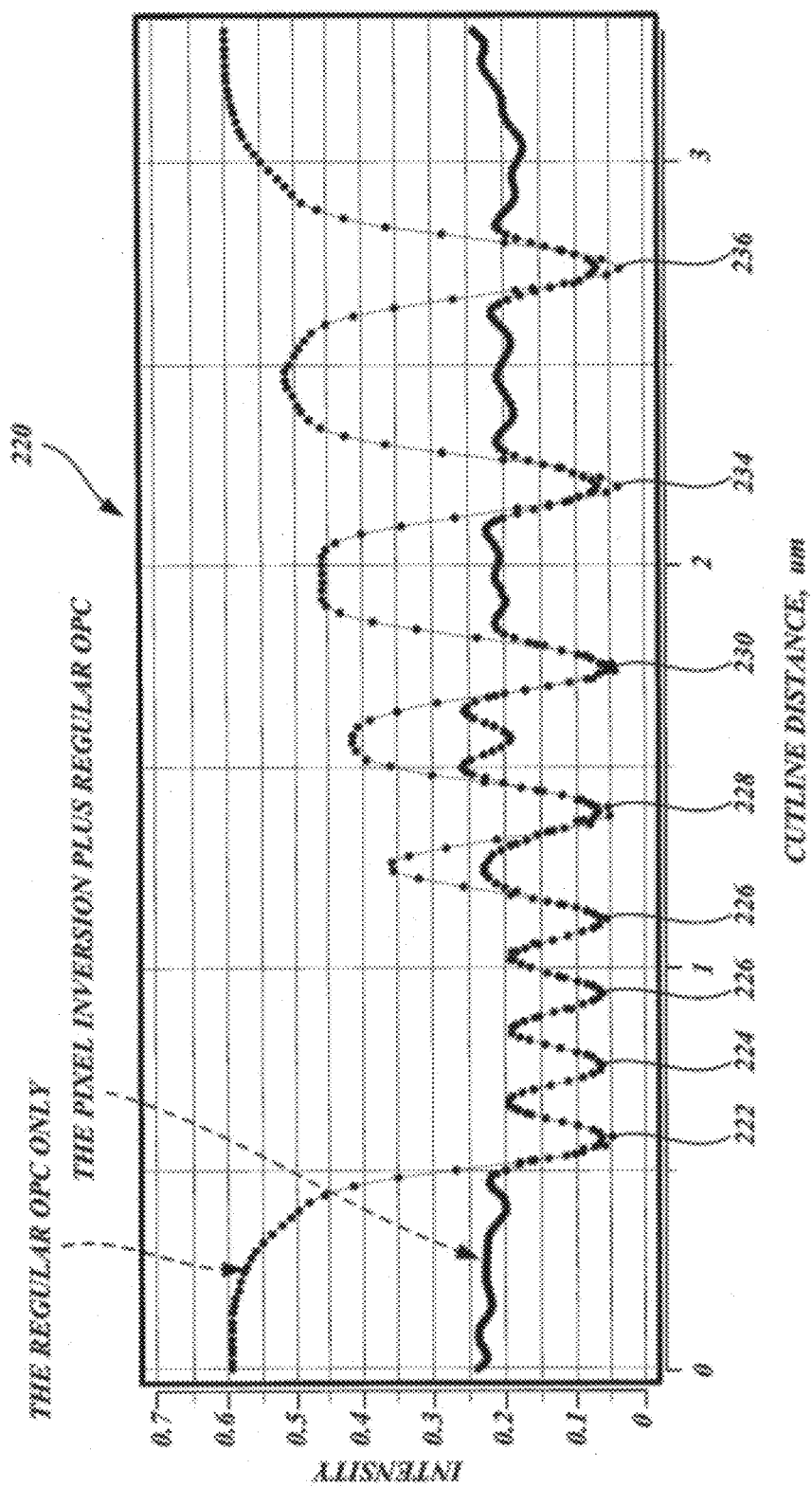
FIG. 23 illustrates the image intensity measured across a cutline of a simulated image of the test pattern shown in FIG. 21 for a conventional OPC corrected mask and an optimized mask pattern created in accordance with an embodiment of the present invention.

FIG. 23 illustrates the simulated image intensity on a wafer when exposed through a conventional mask using the test pattern 150. In addition, FIG. 23 shows a simulation of the image intensity on a wafer when exposed through a mask having optimized mask pattern data such as shown in FIG. 22. In FIG. 23, the graph includes a number of minima 222, 224, 226, . . . 236 where the image intensity is minimized corresponding to each of the vertical bars 152, 154, 156, . . . 166 in the test pattern 150 shown in FIG. 21. Outside the area of the features, the image intensity increases where more light will reach the wafer. With a conventional mask, the variations in intensity are greater and vary between approximately 0.05 and 0.6. However, when a wafer is exposed through a mask having the optimized mask data such as illustrated in FIG. 22, the variations in intensity are smaller such that image intensity varies between approximately 0.05 and approximately 0.25. As can be seen in FIG. 23, the maximum image intensity obtained from an optimized mask pattern such as that shown in FIG. 22 has a more consistent or uniform image intensity because the mask pattern mimics the closely spaced features from the test pattern.

As indicated above, each pixel in the objective function may be weighted by the weight function w. In some embodiments, the weight function is set to 1 for all pixels and no weighting is performed. In other embodiments, the weights of the pixels can be varied by, for example, allowing all pixels within a predetermined distance from the edge of a feature in the ideal image to be weighted more than pixels that are far from the edges of features. In another embodiment, pixels within a predetermined distance from designated tagged features (e.g. features tagged to be recognized as gates, or as contact holes, or as line ends, etc.) are given a different weight. Weighting functions can be set to various levels, depending on the results intended. Typically, pixels near the edge of the ideal image would have a weight w=10, while those further away would have a weight w=1. Likewise, line ends (whose images area known to be difficult to form accurately) may be given a smaller weight w=0.1, while other pixels in the image may be given a weight w=1. Both functions may also be applied (i.e. regions near line ends have a weight w=0.1, and the rest of the image has a weight w=1 except near the edges of the ideal image away from the line ends, where the weight would be w=10.) Alternatively, if solutions using SRAFs are desired, and these SRAFs occur at a predetermined spacing relative to main features, weighting functions which have larger values at locations corresponding to these SRAF positions can be constructed.

It should be noted that the absolute values of weighting functions can be set to any value; it is the relative values of the weighting functions across pixels that makes them effective. Typically, distinct regions have relative values that differ by a factor of 10 or more to emphasize the different weights.

In some instances it has been found that by setting the maximum ideal image intensity for use in an objective function to the maximum image intensity for tightly spaced features of the test pattern 150, the process window of the photolithographic processing is increased.

FIGS. 24A and 24B illustrate two possible techniques for generation of optimized mask data on one or more photolithographic masks. As indicated above, the optimized mask data may produce a set of mask features corresponding to desired layout features to be created on a wafer. In the example shown in FIG. 24, the mask data includes a feature 250 that corresponds to a square via or other small square feature to be created on a wafer. However, the group of mask pixels defining the feature 250 in the optimized mask data has a generally circular shape. Because mask writers are not generally able to easily produce curved or circular structures, the mask data for the mask feature 250 can be simulated with a generally square polygon 260. In addition, the mask data includes an additional feature 252 that is a result of the optimization process. The additional feature 252 surrounds the desired feature 250 and has a generally annular shape. Again, such a curved annular feature would be difficult to accurately produce using most mask writers. One technique for emulating the effect of the annular feature 252 is to use a number of rectangular polygons 262, 264, 266, 268 positioned in the area of the annular feature 252. Each of the polygons 262-268 has a size that is selected such that the polygons act as subresolution assist features (SRAF) and will themselves not print on a wafer.

Some mask writers are capable of producing patterns having angles other than 90°. In this case, an optimized mask data can be approximated using the techniques shown in FIG. 24B. Here the additional feature 252 is approximated by an annular octagon 270 having a number of sides positioned at 45° to each other. The size of the polygons that make up the feature 270 act as SRAFs such that they will not print on the wafer.

Line Search Strategy

With various implementations of the invention, the pixel inversion is solved iteratively. More particularly, a first step to identify a search direction may be performed, followed by a second "line search" step to that identifies a point where the objection function becomes close to the lowest possible value in the local scope of the search direction.

There are various ways to determining the search direction based, such as for example steepest descent or quasi-Newton. Conventional line search strategies may be accomplished by first, scaling the search direction (or search vector) by multiplying a predetermined constant scaling factor (called γ) with the search vector. Subsequently, the search range may be divided into a preselected number of even sub-steps. Then the objective function may be evaluated starting at the sub-step closest to the scaled search vector and ending at the sub-step farthest form the scaled search vector. The first sub-step where the next sub-step gives a larger objective function value may be selected as the ideal candidate.

There are a number of problems with the conventional approaches. Particularly, there is no way of knowing if the search range based on a fixed scaling factor will be appropriate for all iterations steps with different search directions, as a result it can lead to unstable convergence behaviors. Additionally, it is often arbitrary to use a fixed integer to divide the search range into the evenly distributed sub-steps. A small sub-step size may find local minima, but it also takes more objective function evaluations due to increased sub-steps, thereby making the process slower, whereas a large sub-step may be faster, but it can cause the line search process to miss local minima by a large margin.

FIG. 25 illustrates an objective function f(x+as) along a line search direction. Here, x is a variable vector, s is a search vector, α is a line search scalar parameter, and γ is a maximum range of the line search function f(x+as) along a given search direction.

As discussed in [38], the descent property, which is the inner product between the search vector and the gradient, may be defined as follows:

$$sTg(x) \text{ where } g(x)=\delta f/\delta x,$$

which is the first order derivative (or gradient) of the objective function at the starting point of the search vector.

Note: with those algorithms such as steepest descent and quasi-Newton, the first order derivative at the starting point of the search vector is computed as part of the overall optimization process. Therefore it can be assumed that this derivative is available without additional calculation during the line search process.

Figure 25A:
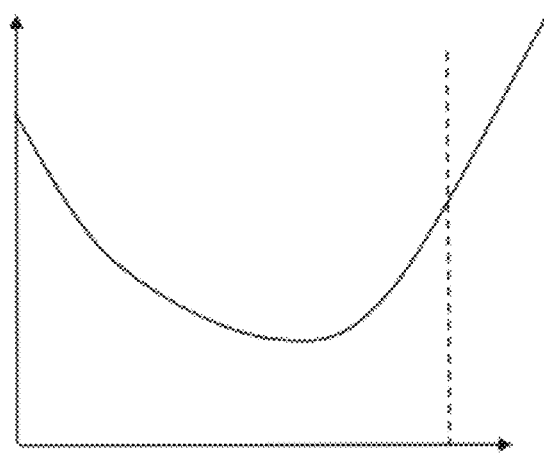
FIGS. 25A-25E illustrate an objective function and line search strategy.
Figure 25B:
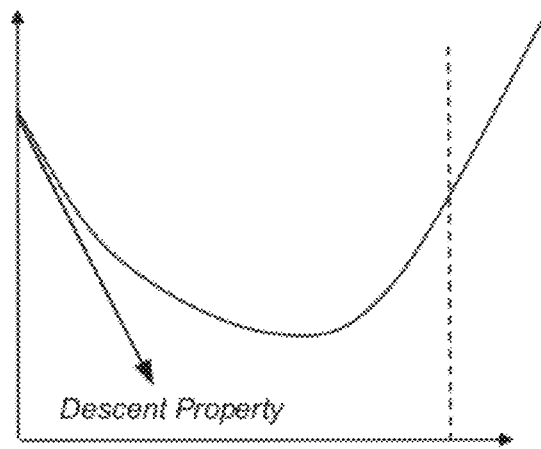
Figure 25C:
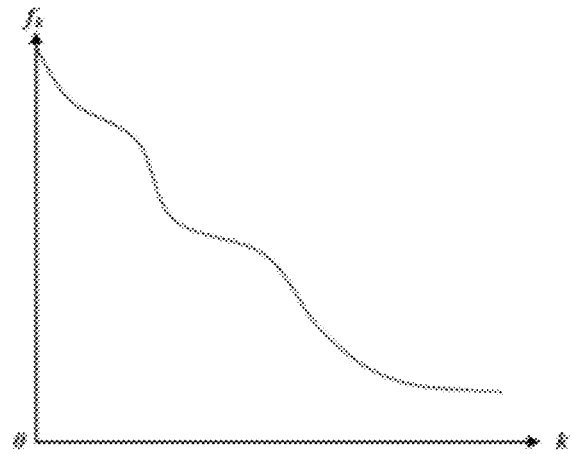

The descent property is the slope of the objective function along the search direction at the starting point of the search vector, which is illustrated in FIG. 25B. Based on the descent property, you can get an approximate objective function value at the search sub-step of as as follows:

$$f(x+as) \sim f(x)+asTg(x).$$

If the expected maximum objective function improvement $\Delta f=f(x+\gamma s)-f(x)$ for the current iteration is known, an estimate as to γ can be made as follows, $$\gamma=|\Delta f/(sTg(x)\rho)|$$

where ρ is a slope-relaxation factor, which we will discuss later. To use this formula to calculate γ, reasonable estimates of Δf and ρ should be calculated.

One way to calculate the estimate of Δf is to keep track of objective function value improvements in the previous iterations of the optimization process. The objective function value keeps falling during the optimization iterations as illustrated in the "objective function history curve" shown in FIG. 25C.

There is no guarantee that an objective function history curve falls down smoothly as the iterations go. It is quite possible the curve falls rapidly at some points and falls slowly at other points and there is no easy way to tell what is going to happen in this respect. As a result, estimates of Δf could be quite off if the estimate is based on one particular iteration result. However, it's generally true that the curve initially falls rapidly and then later the fall rate significantly slows down as it gets closer to convergence. And it's also generally true if you take a look at multiple consecutive points as a group, they tend to show more smoothly falling tendencies. Based on this observation, it should be a good strategy to make an estimate of Δf based on multiple values of Δf of previous iterations. One simple way to doing this is to compute the moving average of Δf, say for the previous three iterations.

To make an estimate of ρ, one can consider what the value of ρ should have been for the previous iteration. Once a line search process is completed for the current iteration of the optimization process, the value of real Δf can be obtained. The descent property for the starting point of the current search vector, sTg(x), is also known.

To see the meaning of ρ in [11], refer back to FIG. 25B, typically the objective function value along a search direction keeps falling up to a point, and then after that it starts moving up. As suggested in FIG. 25B, the slope of the descent property would be steeper than the slopes at intermediate points in the search direction. To make a better prediction as to the search range based on some slope like the descent vector, it would be better to make such a slope somewhat less steep as illustrated in FIG. 25D, ρ should be estimated in such a way that the modified slope value of sTg(x)ρ provides a sufficient search range of γ for the expected objective function improvement of Δf.

Again, what ρ should have been for the previous iterations can be computed. To do that, we introduce the value called best α. The best α is the value of α at the point where the objective function value gets the lowest (or close to the lowest) in a line search process. The best α can be denoted as A.

Figure 25D:
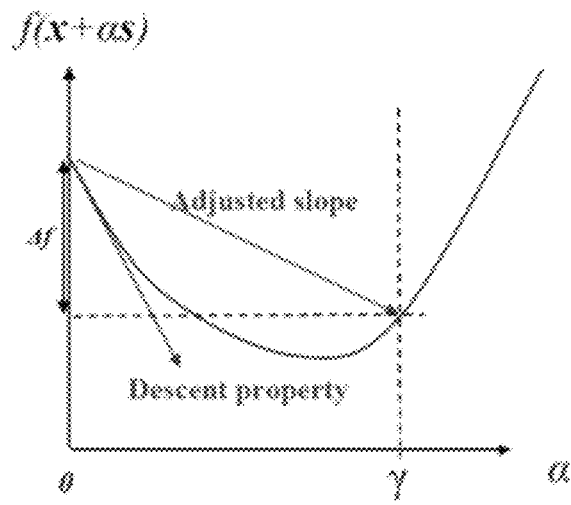
Figure 25E:
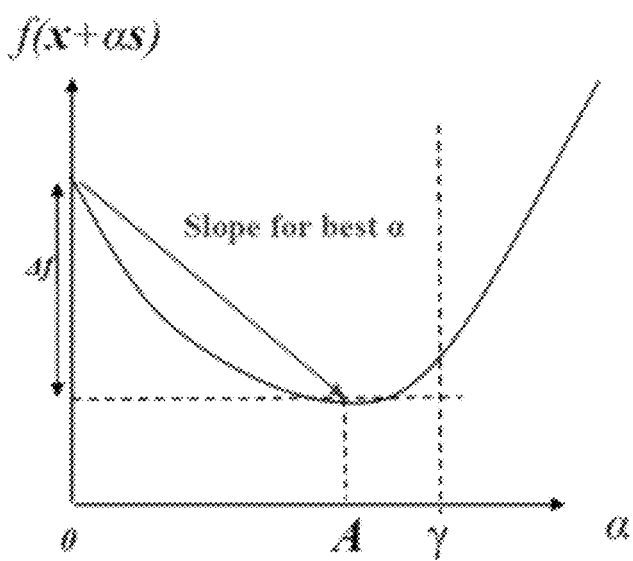

If the adjusted slope in FIG. 25D is calculated in such a way that it directly points to A, then the slope value σ should be |Δf/A|, as illustrated in FIG. 25E. If you simply use the slope value in FIG. 25E to compute the search range, the search range is A. But usually you'd like the search range to be sufficiently larger than the best α so that possible points of best α be covered in the search. Say, the search range should have been 10 times larger than best α best on the previous iteration result, then $$10 \cdot A = 10 \cdot |\Delta f/\sigma|.$$

For the value of (sTg(x)ρ) to cause the 10·A search length based on $$\gamma=|\Delta f/(sTg(x)\rho)|, (sTg(x)\rho)$$

should have been equal to |Δf/A|/10. Generally, we put the adjusted value of ρ as follows:

$$\rho=\chi|\Delta f/(sTg(x)A)|$$

where χ is the aforementioned adjustment factor, which, in the example mentioned above, is equal to 1/10. For similar reasons mentioned before with regard to the use of moving average values, we extend the use of moving average values to all related parameters. As a result, we can rewrite γ=|Δf/(sTg(x)ρ)| as follows:

$$\gamma=|<\Delta f>/(<sTg(x)><\rho>)|$$

where <Δf> is the moving average of Δf from the previous iterations, say the last three, <ρ> is the moving average of ρ similarly, and <sTg(x)> is the moving average of the descent property from the current iteration plus the previous iterations, say two previous ones.

The actual flow that incorporates this line search control method using three point moving averages looks as follows: First, compute the initial objective function value, f0, and set the initial expected objective function improvement, Δf0 equal to f0. Second, start the overall optimization iterations (e.g. quasi-Newton) with the iteration counter of k (k=0, 1, 2, . . . ). Third, compute the gradient gk, for the current iteration. Fourth, compute the search vector sk for the current iteration. Fifth, compute the current descent property, dk. Sixth, if k is smaller than 3, set γk equal to the following:

$$|\Delta fk-1/dk| \text{ if } k>0 \text{ and } k<3$$

$$|\Delta f0/dk| \text{ if } k=0$$

otherwise set γk equal to the following:

$$\gamma_k = \left| \left( (1/3)\sum_{j=1}^{3} \Delta f_{k-j} \right) \Big/ \left[ \left( (1/3)\sum_{j=1}^{2} d_{k-j} \right) \left( (1/3)\sum_{j=1}^{3} \rho_{k-j} \right) \right] \right| \text{ if } k \geq 3$$

Seventh, run the sub-step evaluation process (described separately) and keep the following values: Ak, the value of α that gives the lowest objective function value. fk, the objective function value at α=Ak. Eight, compute Δfk and ρk as follows:

$$\Delta fk = fk-1-fk$$

$$\rho k = \chi|\Delta fk/(sTg(x)Ak)|$$

Ninth, if the convergence is achieved (e.g. Δfk has become zero or very close to zero) or the maximum number of the iterations is reached, exit the loop, otherwise increment k and go back to the second step.

Figure 26A:
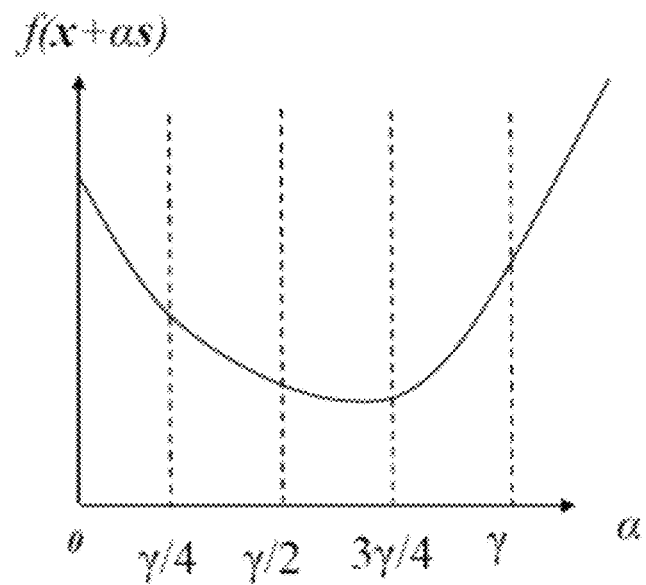
FIGS. 26A and 26B illustrate a sub-step evaluation process for a line search strategy.
Figure 26B:
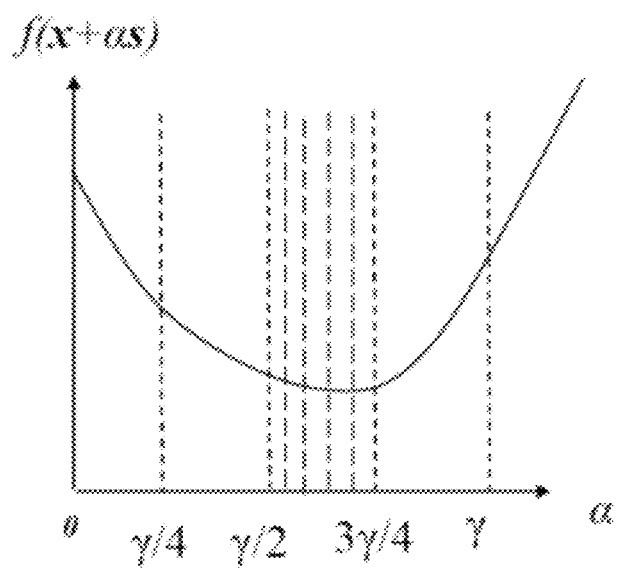

As to the sub-step evaluation step (seven), as mentioned earlier, fixed sub-step definition and incremental search from the starting toward the end point may work, but it's not an efficient way if a small sub-step size is used, and it's not an accurate way, if a too coarse sub-step size is used. One relatively easy improvement to this approach is to start with a coarse set of sub-steps and identify the sub-step that contains the lowest objective function value shown in FIG. 26A. Then dive that sub-step further to conduct the final fine sub-step line search FIG. 26B.

Adaptive Weight Adjustment

Once the optimization process is completed, the system has to apply a threshold operation to those mask transmission values to make them attain the discrete mask transmission values that are allowed on a real physical mask. For example, for the mask whose physical limits are −0.245 (the lowest) and 1.0 (the highest), the system would examine the optimized mask transmission values on the pixels, and if they are above the threshold value of (1−0.245)/2=0.3775 (for example), the final transmission values become 1.0 for them, and otherwise they get the value of −0.245. The threshold value does not necessarily have to be the middle point of the upper/lower bounds, and it is indeed possible to use some other values.

One potential issue in this flow is the possibility that the optimization process may converge to a state which uses mask transmission values that are not close to the discrete values that are allowed in the final real mask. Such in-between mask transmission values are referred to as grayscale values in this document. For example, the optimization process may decide the mask transmission value of 0.3 is optimum for some region, and from mathematical point of view, that may well be a perfectly optimum solution. However, after the threshold operation, the pixels in that region will be all brought back to the minimum mask transmission value allowed in the real mask. This could be particularly problematic for SRAF formation purposes, as there is no such thing as grayscale SRAF's in the real mask.

One way to addressing this issue is to add an additional penalty term in the objective function in such a way those grayscale values cause higher cost. However, our experience shows a) whenever you add additional terms that are quite different in nature from the original optical imaging objective function, end results tend to become be unreliable and unpredictable from optical optimization point of view, and b) such a penalty term that punishes grayscale values also tend to punish the formation of SRAF's, as those SRAF's tend to be gradually formed taking grayscale values during the optimization process.

The adaptive weight adjustment method addresses this issue quite differently. Instead of adding additional terms to the objective function, this method makes adjustments to the original imaging term of the objective function in an adaptive way during the optimization. We'll discuss the details in the following section.

As mentioned earlier, the original objective function of the pixel inversion process is defined as follows:

$$f(m) = \sum_{i,j} w_{i,j}(I_{i,j}(m) - T_{i,j})S, \text{ where } (S \geq 2, \text{ an even integer})$$

When the optimization process converges to a state with lots of gray values, that may well be a mathematically valid solution. In other words, the objective function as it is simply has not been set up to generate a desired solution with distinctive SRAF's. Which means, unless you modify the objective function in such a way that it leads to a desired solution, there is fundamentally no way that the optimization process could achieve a desired goal. The problem is that it is not a trivial problem to set up the objective function that way. We are dealing with lots of complex geometry shapes in various configurations, not to mention the fact that the whole image is being computed based advanced optics/illumination setting. All of those complexities tend to add up to the situation where it is very difficult to know beforehand how exactly to set up the objective function to achieve a desired result.

There may be a way to solving this problem by adding separate terms to the objective function. One such additional cost term would be off-tone penalty, which is defined as follows:

$$\sum_{i,j} [(m_{i,j} - m_{min})(1 - m_{i,j})]n, \text{ where } (n \geq 1, \text{ an integer})$$

Here, $m_{min}$ is the minimum mask transmission value. The problem of this approach is a) adding such a term that has nothing to with the optical behavior could distort the image based pixel inversion results, b) the off-tone penalty tends to keep the transmission values grounded to the two extremity values, thereby making it obstructive to SRAF formation purposes, and c) as a result, end results could be unpredictable and unreliable.

Various implementations of the invention provide a solution to this problem which we call the adaptive weight adjustment. This approach is based on the original formulation of the objective function $$f(m) = \sum_{i,j} w_{i,j}(I_{i,j}(m) - T_{i,j})S$$

It does not add separate terms to the objective function. However, it does change the weight values (wi,j) during the optimization process in an adaptive way.

The basic procedure of the adaptive weight adjustment is as follows: Check the current intensity for each of the pixels, and increase the weight in the following cases:
 1. if the intensity for a bright region pixel is lower than the $I_{max}$ by a certain amount, increase the weight for the pixel.
 2. if the intensity for a dark region pixel is higher than $I_{min}$ by a certain amount, increase the weight for the pixel. Where $I_{max}$ is the target intensity for the bright region, and $I_{min}$ the target intensity for the dark region. As to the selection of the values of $I_{max}$ and $I_{min}$, see the reference [39].

Since we are changing those values of $w_{i,j}$, we are changing the problem definition itself. However, based on the observation that an ill-defined objective function leads to ill-defined results, it makes sense to improve the definition of the objective function. And we change the values of $w_{i,j}$ in such a way that those pixels with undesirable intensity values get penalized more by increasing the values of $w_{i,j}$ for such pixels. This maneuver heightens the objective function value, and creates more room for the optimization process to find a search direction that lowers the objective function value for the next iteration, whereas the optimization process just based on the original objective function definition could be stuck in one of the minima.

Adaptive weight adjustment doesn't necessarily directly deal with gray bar issues, but a) it should achieve better global convergence with continually revised objective function definition, b) it should prevent printing SRAF formation, and c) it is still based on optics only, thereby avoiding unreliability of introducing auxiliary objective function terms.

The best mode formula we use for the weight adjustment is as follows:

If the target intensity for the pixel is $I_{max}$ and the image intensity of the pixel $I_{i,j}$ is smaller than $(I_{max}-S)$, then the new weight is computed as follows:

$$w_{i,j} = w_{i,j} + F \cdot (I_{max} - S - I_{i,j}),$$

where where S (slack) is typically a small positive value, F is a constant factor with a positive value Similarly, if the target intensity is $I_{min}$ and the current intensity $I_{i,j}$ is greater than S, then the new weight for the pixel is as follows:

$$w_{i,j} = w_{i,j} + F \cdot (I_{i,j} - S).$$

Otherwise, no weight change is made. There are a couple of parameters used here, namely S and F. Our experience shows the following are a reasonable setting for the two parameters:

$$S = 0.01 \cdot I_{max}$$

F may be determined so that the maximum possible improvement in the objective function due to the adaptive weight change would be about 100 in total for the entire pixels.

An example of an optimization flow that incorporates the adaptive weight adjustment is as follows: First, run initial iterations based on the original definition of the objective function. Second, switch to the adaptive weight adjustment mode, and keep adjusting the weights the rest of the way. It is important to note, that the timing of the switch to the adaptive weight adjustment mode is determined by the status around the target edge region. If it reaches the point where there's virtually no improvement in the target edge region, then make the switch. Additionally, the objective function value is recomputed with the adjusted weights, and that value is used as if it were the previous iteration's objective function value.

Figure 27A:
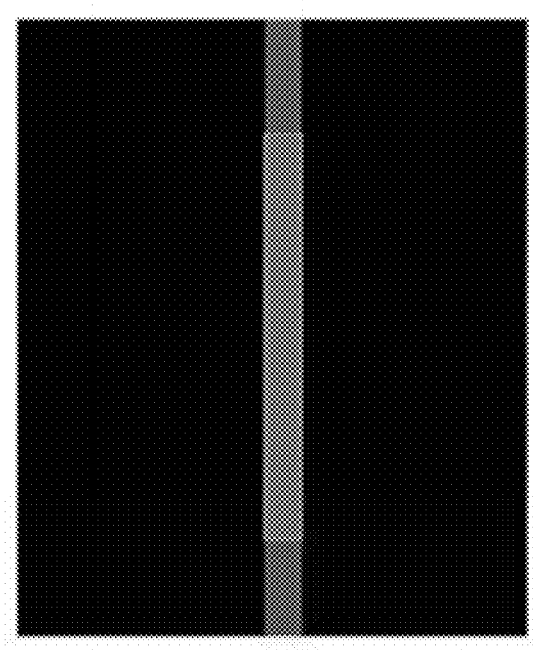
FIGS. 27A and 27B illustrate layout patterns with and without adaptive weight processing for the inverse mask calculation.
Figure 27B:
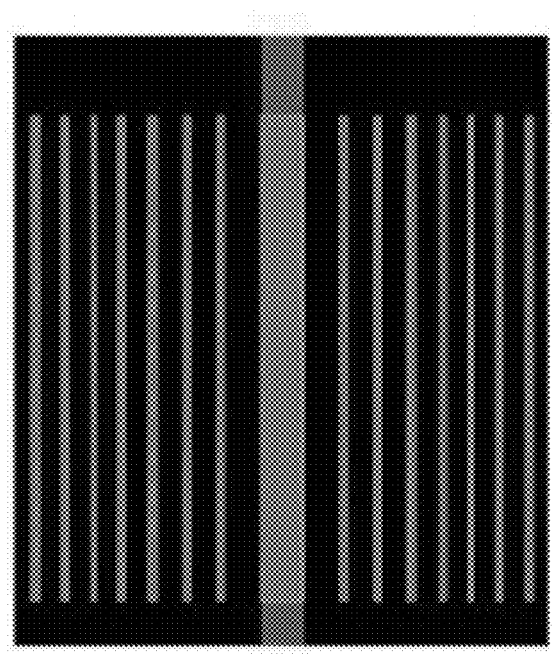

FIGS. 27A and 27B illustrate a 170 nm isolated pattern, with optics: $\lambda=193$, NA=0.82, annular, $\sigma_{out}=0.864$, $\sigma_{in}=0.54$, 6% attenuated PSM background. FIG. 27A is without adaptive weight adjustment, while FIG. 27B is with adaptive weight adjustment, in which case SRAF's are successfully generated. Whereas in FIG. 27A, the optimization converges to a state with grayscale values and no real SRAF's are seen after the threshold operation.

Figure 28A:
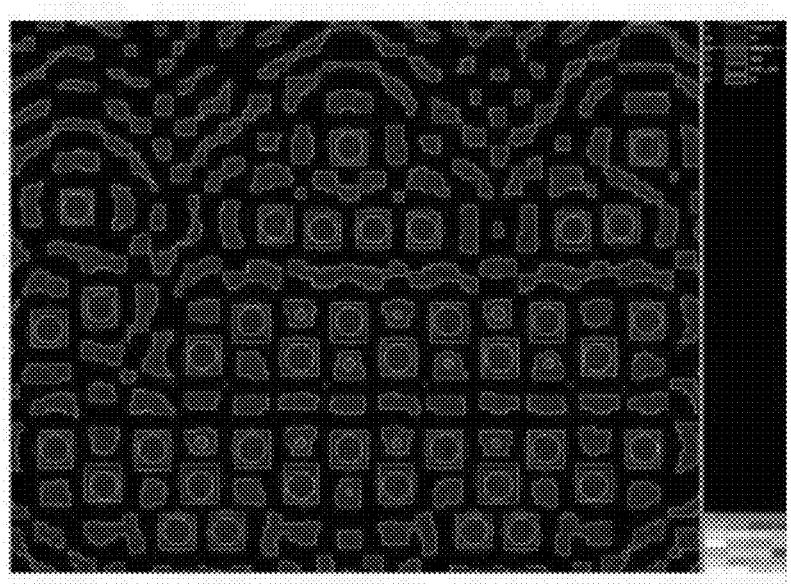
FIGS. 28A and 28B illustrate layout patterns with and without adaptive weight processing for the inverse mask calculation.
Figure 28B:
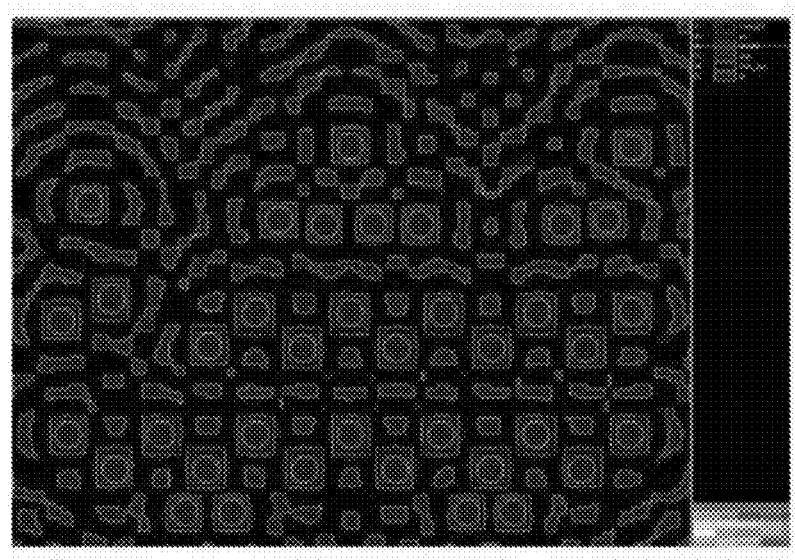

FIGS. 28A and 28B illustrate an 80 nm by 80 nm square contact pattern with random placements, where $\lambda=193$, NA=1.2 (wet), quasar, $\sigma_{out}=0.93$, $\sigma_{in}=0.695$, angle=30, 6% attenuated PSM background. FIG. 28A is without adaptive weight adjustments while FIG. 28B is with adaptive weight adjustments. As can be seen from these figures, no SRAF's are printing when adaptive weight adjustments are used.

Post Pixel Inversion Mask Rule Constraint

Raw optimization results of the pixel inversion results generally contain polygons with lots of small features and arbitrarily angled edges that break all sorts of mask manufacturing rules. It's particularly problematic to have lots of small figures that cause not only mask-writing inaccuracy but also significant increase in the EB shot count. It is known that about ⅓rd of the mask cost come from the EB writing time, which is roughly proportional to the EB shot count for the mask. Given that, it seems quite prohibitive to have a shot count increase of 100×, for example.

Geometrical mask simplification has been employed to address this issue [39]. Various implementations of the present invention provide a post pixel inversion MRC process to address this issue.

While the geometrical mask simplification as a post process to the pixel inversion helps improve the manufacturability to some extent, it does not necessarily ensure that the result be clean in terms of MRC. The post pixel inversion MRC process takes the final pixel inversion result and tries to turn it into MRC-clean result while ensuring that resultant mask shapes would not cause undesirable imaging effects such as printing s-bars.

The purpose of the post pixel inversion MRC process is to transform the final result of the pixel inversion into the one with MRC-clean geometrical shapes while ensuring those modified features do not turn out to cause undesirable effects such as printing SRAF's.

As described in [11], the pixel inversion process involves image analysis for the pixels in the work region. We use two schemes for the image analysis: 1) FFT-based method, and 2) electrical field caching method [11]. The electrical field caching method is suitable for the line-search process of the optimization, and it enables fast evaluation of the objective function. To perform the electrical field caching method, it is necessary to calculate the image of the starting point of the line search as well as that of the endpoint of the line search based on the FFT-based method. Once the results of these two points are known, it is possible to exploit the linearity of the kernel convolution to conduct linear interpolation for the calculation of intermediate step between the two points. Since there is no need for redoing FFT during the linear interpolation process, it achieves faster evaluation of the objective function.

The electrical field caching method can be a useful tool for the purpose of examining the image after the geometrical modification due to MRC. The MRC process itself is a geometrical shape transformation which is not aware of the impact the transformation causes in terms of imaging. The basic idea of the MRC process is to take the final result of the pixel inversion and the geometrical MRC cleanup results as the starting point and the endpoint of the line-search process, respectively. In other words, compute the difference between the MRC result and the pixel inversion result and regard that as the search vector for the ensuing line search process. Then perform the line search process by using the electrical field caching method to quickly determine the intermediate step where the objective function gets larger than that the pixel inversion result. This is a systematic process that determines the point during the line search where the MRC cleanup result starts adversely deviating from the image of the final pixel inversion. We call this process quasi line search.

Based on the idea outlined above, we will describe the baseline algorithm of this scheme below. In the algorithm description, when the word pixel is used, that means the pixel representation of the mask is used, where mask transmission values could be grayscale and/or discrete values. When the word geometrical is used, that means the geometrical representation of the mask is sued with physically realizable discrete mask transmission values.

In various implementations, the inversion is provided as follows:

1. Start with the final state of the pixel inversion (note: the pixel data here still has grayscale values).
2. Convert the pixel data to the geometrical data based on the specified threshold (typically $(1+m_{min})/2$, where $m_{min}$ is the minimum mask transmission value).
3. Convert back the geometrical data to the pixels and compute the objective function value (note: the pixel data here has the discrete mask transmission values).
4. Run the orthogonal geometrical simplification for the result of 2.
5. Perform geometrical MRC cleanup (more about this step is described later).
6. Convert back the current geometry to pixels.
7. Evaluate the objective function for the current state.
8. If it's smaller than or nearly the same as the objective function value of the pixel inversion result then exit.
9. Otherwise, compute the difference between the MRC's pixel state and the pixel inversion's pixel state and treat it as a search vector.
10. Then run the quasi line-search process using the aforementioned search vector and electrical field caching.
11. Keep the result right before the objective function value gets larger than the objective function value of the pixel inversion.
12. Convert the result to geometrical representation.
13. Run the orthogonal geometrical simplification to the result.

As to the geometrical MRC cleanup mentioned in the algorithm, it could be implemented in different ways. The baseline approach we employed for the geometrical MRC cleanup is as follows:

1. Put the polygons that interact with the original target shapes in the category of the main feature polygons, and all other polygons in the category of SRAF polygons.
2. Perform the over-sizing operation by the clearance distance on the main feature polygon to form the clearance area (the clearance distance is the minimum distance allowed between SRAF polygons and the main feature polygons).
3. Remove part of the SRAF polygons that are inside the clearance area.
4. Combine the remaining SRAF polygons and the main feature polygon as the current set of polygons.
5. Compute the space/width distances for all edges of the current set of polygons within the maximum distance of the space/width constrains, and the results are a set of the pairs of the edges that are within the constraints distance with one another.
6. Examine each of those pairs one by one and compute the distance between the two edges.
7. If the two violation edge's distance is close enough (by a specified amount), then a) if it's for the width violation, then delete the part of the polygon between the two edge from the entire polygon that the two edge belong to, or b) if it's for the space violation, fill in the gap between the two edges to form continuous polygon between the two edges.
8. If the two violation edges' distance is not close enough, then a) if it's for width violation, then move the two edges farther apart to create sufficient width between them, or b) if it's for space violation, then move them farther apart to create sufficient space between them.

This is just an example of geometrical MRC algorithm. In reality, it can be much more complex than this example with more MRC constrains such as area constraint, etc.

Figure 29A:
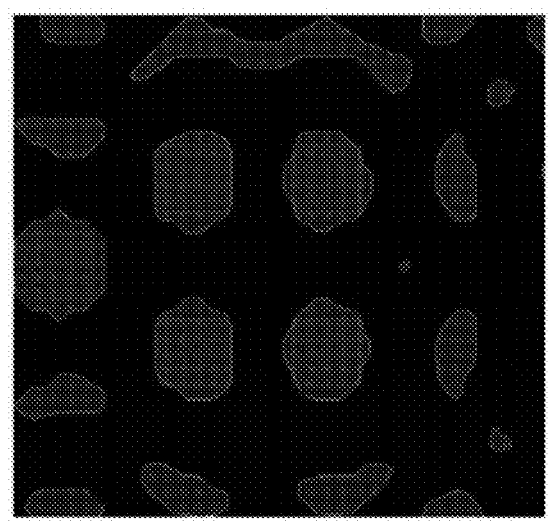
FIGS. 29A-29C illustrate mask inversion processing for target contact hole arrays.
Figure 29B:
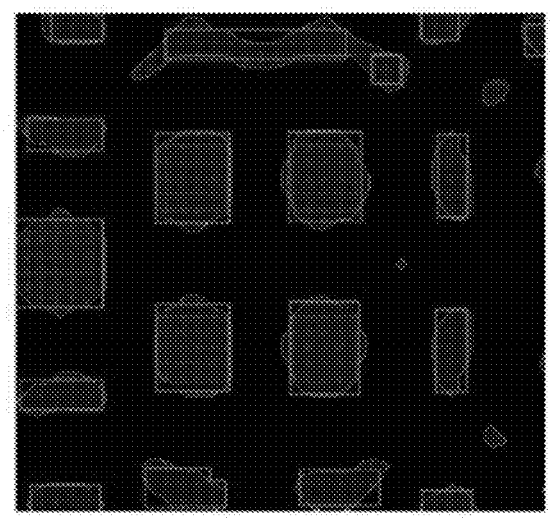
Figure 29C:
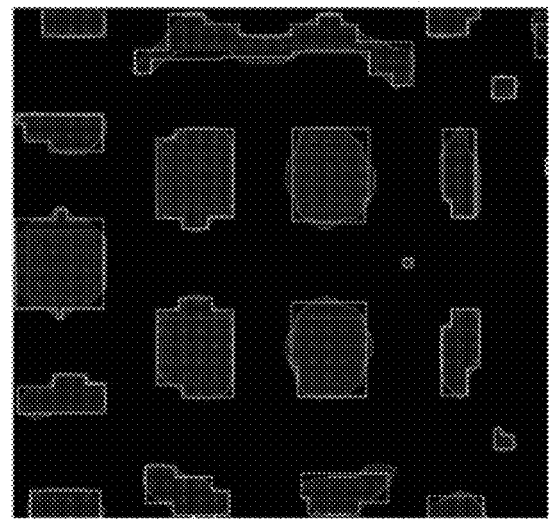

FIG. 29A illustrates a target contact hole (red hatched boxes) and associated raw pixel inversion result (gray shapes), while FIG. 29B illustrates the target contact hole (red hatched boxes) and associates orthogonal simplification result (yellow lines) for the raw pixel inversion result. Note the simplification algorithm tries to preserve the raw pixel inversion result including tiny shapes. Additionally, FIG. 29C illustrates the target contact hole (red hatched boxes) and the post pixel inversion MRC result (green lines). Note, overall, the MRC result attains even simpler shapes, and also too tiny shapes are removed.

CONCLUSION

Although certain devices and methods have been described above in terms of the illustrative embodiments, the person of ordinary skill in the art will recognize that other embodiments, examples, substitutions, modification and alterations are possible. It is intended that the following claims cover such other embodiments, examples, substitutions, modifications and alterations within the spirit and scope of the claims.

APPENDIX

The following references are all incorporated herein by reference, and may be referred to in the specification above.

1. Barouch, E., et al., "Illuminator Optimization for Projection Printing," SPIE 3679:697-703, 1999.
2. Cobb, N., and A. Zakhor, "Fast, Low-Complexity Mask Design," SPIE 2440:313-327.
3. Cobb, N. B., "Fast Optical and Process Proximity Correction Algorithms for Integrated Circuit Manufacturing," Dissertation, University of California at Berkeley, 1998.
4. Erdmann, A., et al., "Towards Automatic Mask and Source Optimization for Optical Lithography," SPIE 5377:646-657.
5. Fienup, J. R., "Phase Retrieval Algorithms: A Comparison," Appl. Opt. 21:2758-2769, 1982.
6. Gamo, H., "Matrix Treatment of Partial Coherence," Progress in Optics 3:189-332, Amsterdam, 1963.
7. Gerchberg, R. W., and W. O. Saxton, "A Practical Algorithm for the Determination of Phase From Image and Diffraction Plane Pictures," Optik 35:237-246, 1972.
8. Gill, P. E., et al., "Practical Optimization," Academic Press, 2003.
9. Golub, G., and C. van Loan, "Matrix Computations," J. Hopkins University Press, Baltimore and London, 1996.
10. Gould, N., "Quadratic Programming: Theory and Methods," $3^{rd}$ FNRC Cycle in Math. Programming, Belgium, 2000.
11. Granik, Y., "Solving Inverse Problems of Optical Microlithography," SPIE, 2005.
12. Granik, Y., "Source Optimization for Image Fidelity and Throughput," JM3:509-522, 2004.
13. Han, C.-G., et al., "On the Solution of Indefinite Quadratic Problems Using an Interior-Point Algorithm," Informatica 3(4):474-496, 1992.
14. Hansen, P. C., "Rank Deficient and Discrete Ill-Posed Problems," SIAM, Philadelphia, 1998.
15. Hwang, C., et al., "Layer-Specific Illumination for Low k1 Periodic and Semi-Periodic DRAM Cell Patterns: Design Procedure and Application," SPIE 5377:947-952.
16. Inoue, S., et al., "Optimization of Partially Coherent Optical System for Optical Lithography," J. Vac. Sci. Technol. B 10(6):3004-3007, 1992.

17. Jang, S.-H., et al., "Manufacturability Evaluation of Model-Based OPC Masks," *SPIE* 4889:520-529, 2002.
18. Liu, Y., and A. Zachor, "Binary and Phase-Shifting Image Design for Optical Lithography," *SPIE* 1463:382-399, 1991.
19. Liu, Y., and A. Zachor, "Optimal Binary Image Design for Optical Lithography," *SPIE* 1264:401-412, 1990.
20. Luenberger, D., "Linear and Nonlinear Programming," Kluwer Academic Publishers, 2003.
21. Minoux, M., "Mathematical Programming," Theory and Algorithms, New York, Wiley, 1986.
22. Nashold, K., "Image Synthesis—a Means of Producing Superresolved Binary Images Through Bandlimited Systems," Dissertation, University of Wisconsin, Madison, 1987.
23. Oh, Y.-H., et al., "Optical Proximity Correction of Critical Layers in DRAW Process of 12 um Minimum Feature Size," *SPIE* 4346:1567-1574, 2001.
24. Oh, Y.-H., et al., "Resolution Enhancement Through Optical Proximity Correction and Stepper Parameter Optimization for 0.12 um Mask Pattern," *SPIE* 3679:607-613, 1999.
25. Pati, Y. C., and T. Kailath, "Phase-Shifting Masks for Microlithography: Automated Design and Mask Requirements," *J. Opt. Soc. Am. A* 11(9):2438-2452, September 1994.
26. Poonawala, A., and P. Milanfar, "Prewarping Techniques in Imaging: Applications in Nanotechnology and Biotechnology," *Proc. SPIE* 5674:114-127, 2005.
27. Qi, L., et. al., "Global Minimization of Normal Quartic Polynomials Based on Global Descent Directions," *SIAM, J. Optim.* 15(1):275-302.
28. Rosenbluth, A., et al., "Optimum Mask and Source Patterns to Print a Given Shape," JM3 1:13-30, 2002.
29. Saleh, B. E. A., "Optical Bilinear Transformation: General Properties," *Optica Acta* 26(6):777-799, 1979.
30. Saleh, B. E. A., and K. Nashold, "Image Construction: Optimum Amplitude and Phase Masks in Photolithography," *Applied Optics* 24:1432-1437, 1985.
31. Sandstrom, T., et. al., "OML: Optical Maskless Lithography for Economic Design Prototyping and Small-Volume Production," *SPIE* 5377:777-797, 2004.
32. Sayegh, S. I., "Image Restoration and Image Design in Non-Linear Optical Systems," Dissertation, University of Wisconsin, Madison, 1982.
33. Shang, S., et. al., "Simulation-Based SRAF Insertion for 65 nm Contact Hole Layers," BACUS, 2005, in print.
34. Socha, R., et al., "Contact Hole Reticle Optimization by Using Interference Mapping Lithography (IML)," *SPIE* 5446:516-534.
35. Sorensen, D. C., "Newton's Method With a Model Trust Region Modification," *SIAM, J. Num. Anal.* 19:409-426, 1982.
36. Takajo, H., et. al., "Further Study on the Convergence Property of the Hybrid Input-Output Algorithm Used for Phase Retrieval," *J. Opt. Soc. Am, A* 16(9):2163-2168, 1999.
37. Vallishayee, R. R., et al., "Optimization of Stepper Parameters and Their Influence on OPC," *SPIE* 2726:660-665, 1996.
38. Fletcher, R., "Practical Methods of Optimization," John Wiley & Sons, pp. 33-44.
39. Huang, C. Y., et at., "Model based insertion of assist features using pixel inversion method: implementation in 65 nm node", *Proc. SPIE* 6283, 62832Y (2006).

What is claimed is:

1. A computer system comprising:
   one or more processors; and
   a memory having computer executable instructions stored thereon that cause the one or more processors to perform a set of operations, the set of operations comprising:
   reading all or a portion of a desired layout pattern;
   defining a set of mask data having a number of pixels that are assigned a transmission value;
   determining an objective function that compares a simulation of the image intensity on a wafer to an ideal image intensity;
   defining a set of ideal image intensities from the desired layout pattern, wherein the maximum ideal image intensity is selected to be substantially equal to the maximum image intensity determined from a test image of features at the tightest pitch pattern produced by the photolithographic imaging system;
   minimizing the objective function to determine a first set of transmission values for the pixels in the mask data that will produce the desired layout on a wafer;
   deriving a geometric representation from the set of mask data and the first set of transmission values;
   applying a geometric simplification process to the geometric representation to generate a simplified geometric representation;
   determining a second set of transmission values for the pixels in the mask data from the simplified geometric representation.

2. The computer system recited in claim 1, wherein the set of operations further comprises applying a mask rule constraint clean-up process to the simplified geometric representation to generate an MRC clean geometric representation, and wherein the second set of transmission values for the pixels in the mask data is determined from the MRC clean geometric representation.

3. The computer system recited in claim 2, wherein the set of operations further comprise:
   evaluating the objective function for the first set of transmission values;
   evaluating the objective function for the second set of transmission values; and
   determining a third set of transmission values for the pixels in the mask data if the results of the evaluation of the objective function for the second set of transmission values is larger than the results of the evaluation of the objective function for the first set of transmission values by a threshold value, wherein the operation for determining a third set of transmission values includes:
      applying a line-search algorithm to determine where the objective function value for the second set of transmission values gets larger than the objective function value for the first set of transmission values for each pixel;
      generating a third set of transmission values for the pixels in the mask data based in part upon the results of the application of the line-search algorithm;
      deriving a geometric representation from the set of mask data and the third set of mask transmission values; and
      applying the geometric simplification process to the geometric representation corresponding to the third set of mask transmission values.

4. The computer system recited in claims 3, wherein the mask rule clean-up process comprises:
   identifying a plurality of polygons in the geometric representation;

forming a first group of polygons from the plurality of polygons, wherein the first group of polygons correspond to the target shapes;

categorizing a second group of polygons from the plurality of polygons, wherein the second group of polygons correspond to sub-resolution assist features;

determining a clearance area around each of the polygons in the first group of polygons;

removing portions of the second group of polygons that fall within the clearance area;

updating the plurality of polygons based upon the removed portions of the second group of polygons;

deriving a space-width distance for all edges of the plurality of polygons, wherein one or more pairs of edges that fall within a maximum distance from each other are identified; and modifying the polygon that correspond to each one of the identified one or more pairs of edges based in part upon the derived space-width distance for that pair of edges.

5. The computer system recited in claim 3, wherein the geometric simplification process includes applying an orthogonal geometric simplification algorithm to the geometric representation.

6. The computer system recited in claim 3, wherein the operation for applying the line-search algorithm to determine where the objective function value for the second set of transmission values gets larger than the objective function value for the first set of transmission values comprises:

deriving the difference between the first set of transmission values and the second set of transmission values for each pixel in the set of mask data;

setting the derived difference as a search vector; and causing the line-search algorithm to be applied to the search vector.

7. The computer system recited in claims 6, wherein the operation for generating a third set of transmission values for the pixels in the mask data based in part upon the results of the application of the line-search algorithm comprises setting the transmission value equal to the transmission value corresponding to where the results of the evaluation of the objective function for the second set of transmission values becomes larger than the results of the evaluation of the objective function for the first set of transmission values.

8. A method comprising:

reading all or a portion of a desired layout pattern;

defining a set of mask data having a number of pixels that are assigned a transmission value;

determining an objective function that compares a simulation of the image intensity on a wafer to an ideal image intensity;

defining a set of ideal image intensities from the desired layout pattern, wherein the maximum ideal image intensity is selected to be substantially equal to the maximum image intensity determined from a test image of features at the tightest pitch pattern produced by the photolithographic imaging system;

minimizing the objective function to determine a first set of transmission values for the pixels in the mask data that will produce the desired layout on a wafer;

deriving a geometric representation from the set of mask data and the first set of transmission values;

applying a geometric simplification process to the geometric representation to generate a simplified geometric representation;

determining a second set of transmission values for the pixels in the mask data from the simplified geometric representation; and saving the set of mask data and the second set of transmission values to a memory storage location.

9. The method recited in claim 8, further comprising applying a mask rule constraint clean-up process to the simplified geometric representation to generate an MRC clean geometric representation, and wherein the second set of transmission values for the pixels in the mask data is determined from the MRC clean geometric representation.

10. The method recited in claim 9, further comprising:

evaluating the objective function for the first set of transmission values;

evaluating the objective function for the second set of transmission values; and determining a third set of transmission values for the pixels in the mask data if the results of the evaluation of the objective function for the second set of transmission values is larger than the results of the evaluation of the objective function for the first set of transmission values by a threshold value, wherein the operation for determining a third set of transmission values includes:

applying a line-search algorithm to determine where the objective function value for the second set of transmission values gets larger than the objective function value for the first set of transmission values for each pixel;

generating a third set of transmission values for the pixels in the mask data based in part upon the results of the application of the line-search algorithm;

deriving a geometric representation from the set of mask data and the third set of mask transmission values; and applying the geometric simplification process to the geometric representation corresponding to the third set of mask transmission values.

11. The method recited in claims 10, wherein the mask rule clean-up process comprises:

identifying a plurality of polygons in the geometric representation;

forming a first group of polygons from the plurality of polygons, wherein the first group of polygons correspond to the target shapes;

categorizing a second group of polygons from the plurality of polygons, wherein the second group of polygons correspond to sub-resolution assist features;

determining a clearance area around each of the polygons in the first group of polygons;

removing portions of the second group of polygons that fall within the clearance area;

updating the plurality of polygons based upon the removed portions of the second group of polygons;

deriving a space-width distance for all edges of the plurality of polygons, wherein one or more pairs of edges that fall within a maximum distance from each other are identified; and modifying the polygon that correspond to each one of the identified one or more pairs of edges based in part upon the derived space-width distance for that pair of edges.

12. The method recited in claim 10, wherein the geometric simplification process includes applying an orthogonal geometric simplification algorithm to the geometric representation.

13. The method recited in claim 10, wherein the method act of applying the line-search algorithm to determine where the objective function value for the second set of transmission values gets larger than the objective function value for the first set of transmission values comprises:

deriving the difference between the first set of transmission values and the second set of transmission values for each pixel in the set of mask data;

setting the derived difference as a search vector; and causing the line-search algorithm to be applied to the search vector.

14. The method recited in claims 13, wherein the operation for generating a third set of transmission values for the pixels in the mask data based in part upon the results of the application of the line-search algorithm comprises setting the transmission value equal to the transmission value corresponding to where the results of the evaluation of the objective function for the second set of transmission values becomes larger than the results of the evaluation of the objective function for the first set of transmission values.

15. One or more non-transitory computer-readable media comprising a set of computer-executable instructions that cause a computer to perform a set of operations, the set of operations including:

reading all or a portion of a desired layout pattern;

defining a set of mask data having a number of pixels that are assigned a transmission value;

determining an objective function that compares a simulation of the image intensity on a wafer to an ideal image intensity;

defining a set of ideal image intensities from the desired layout pattern, wherein the maximum ideal image intensity is selected to be substantially equal to the maximum image intensity determined from a test image of features at the tightest pitch pattern produced by the photolithographic imaging system;

minimizing the objective function to determine a first set of transmission values for the pixels in the mask data that will produce the desired layout on a wafer;

deriving a geometric representation from the set of mask data and the first set of transmission values;

applying a geometric simplification process to the geometric representation to generate a simplified geometric representation, wherein the geometric simplification process includes applying an orthogonal geometric simplification algorithm to the geometric representation;

applying a mask rule constraint clean-up process to the simplified geometric representation to generate an MRC clean geometric representation; and determining a second set of transmission values for the pixels in the mask data from the MRC clean geometric representation.

16. The one or more non-transitory computer-readable media recited in claim 15, wherein the set of operations further comprise:

evaluating the objective function for the first set of transmission values;

evaluating the objective function for the second set of transmission values; and determining a third set of transmission values for the pixels in the mask data if the results of the evaluation of the objective function for the second set of transmission values is larger than the results of the evaluation of the objective function for the first set of transmission values by a threshold value, wherein the operation for determining a third set of transmission values includes:

applying a line-search algorithm to determine where the objective function value for the second set of transmission values gets larger than the objective function value for the first set of transmission values for each pixel;

generating a third set of transmission values for the pixels in the mask data based in part upon the results of the application of the line-search algorithm;

deriving a geometric representation from the set of mask data and the third set of mask transmission values; and applying the geometric simplification process to the geometric representation corresponding to the third set of mask transmission values.

17. The one or more non-transitory computer-readable media recited in claims 16, wherein the mask rule clean-up process comprises:

identifying a plurality of polygons in the geometric representation;

forming a first group of polygons from the plurality of polygons, wherein the first group of polygons correspond to the target shapes;

categorizing a second group of polygons from the plurality of polygons, wherein the second group of polygons correspond to sub-resolution assist features;

determining a clearance area around each of the polygons in the first group of polygons;

removing portions of the second group of polygons that fall within the clearance area;

updating the plurality of polygons based upon the removed portions of the second group of polygons;

deriving a space-width distance for all edges of the plurality of polygons, wherein one or more pairs of edges that fall within a maximum distance from each other are identified; and modifying the polygon that correspond to each one of the identified one or more pairs of edges based in part upon the derived space-width distance for that pair of edges.

18. The one or more non-transitory computer-readable media recited in claim 16, wherein the operation for applying the line-search algorithm to determine where the objective function value for the second set of transmission values gets larger than the objective function value for the first set of transmission values comprises:

deriving the difference between the first set of transmission values and the second set of transmission values for each pixel in the set of mask data;

setting the derived difference as a search vector; and causing the line-search algorithm to be applied to the search vector.

19. The one or more non-transitory computer-readable media recited in claims 18, wherein the operation for generating a third set of transmission values for the pixels in the mask data based in part upon the results of the application of the line-search algorithm comprises setting the transmission value equal to the transmission value corresponding to where the results of the evaluation of the objective function for the second set of transmission values becomes larger than the results of the evaluation of the objective function for the first set of transmission values.

* * * * *